(12) United States Patent
Cai et al.

(10) Patent No.: US 11,824,072 B2
(45) Date of Patent: Nov. 21, 2023

(54) DIGITAL OPTICAL CROSS-TALK COMPENSATION SYSTEMS AND METHODS

(71) Applicant: Apple Inc., Cupertino, CA (US)

(72) Inventors: Shengchang Cai, Sunnyvale, CA (US); Enkhamgalan Dorjgotov, Mountain View, CA (US); Chaohao Wang, Sunnyvale, CA (US); Sheng Zhang, San Jose, CA (US); Giovanni Carbone, Palo Alto, CA (US); Igor Stamenov, Manteca, CA (US)

(73) Assignee: Apple Inc., Cupertino, CA (US)

(*) Notice: Subject to any disclaimer, the term of this patent is extended or adjusted under 35 U.S.C. 154(b) by 319 days.

(21) Appl. No.: 17/003,638

(22) Filed: Aug. 26, 2020

(65) Prior Publication Data

US 2021/0098520 A1     Apr. 1, 2021

Related U.S. Application Data

(60) Provisional application No. 62/906,563, filed on Sep. 26, 2019, provisional application No. 62/906,625, filed on Sep. 26, 2019.

(51) Int. Cl.
   *G09G 3/34*     (2006.01)
   *G09G 3/36*     (2006.01)
   (Continued)

(52) U.S. Cl.
   CPC ..... *H01L 27/14623* (2013.01); *G09G 3/2051* (2013.01); *G09G 3/3406* (2013.01);
   (Continued)

(58) Field of Classification Search
   CPC .......... G09G 2320/0209; G09G 3/003; G09G 2320/0285; G09G 3/20; G09G 5/06;
   (Continued)

(56) References Cited

U.S. PATENT DOCUMENTS 7,561,194 B1 * 7/2009 Luo ................ H04N 23/84
                                                    348/241
9,153,204 B2 * 10/2015 Yagiura ................ G09G 5/02
(Continued)

FOREIGN PATENT DOCUMENTS

CN     104508853 A     4/2015
CN     106898632 A     6/2017
(Continued)

OTHER PUBLICATIONS

Office Action for Chinese Patent Application No. 202011017828.X dated Mar. 3, 2022; 10 pgs.

*Primary Examiner* — Dismery Mercedes
(74) *Attorney, Agent, or Firm* — Fletcher Yoder, P.C.

(57) ABSTRACT

Techniques for implementing and/or operating an electronic device that includes or utilizes a display panel. The display panel includes an organic light-emitting diode layer, an encapsulation layer disposed over the organic light-emitting diode layer, and a color filter layer disposed over the encapsulation layer. The color filter layer overhangs the organic light-emitting diode layer and comprises a first color filter cell of a first color component sub-pixel that at least partially overlaps an organic light-emitting diode of a second color component sub-pixel that is a different color compared to the first color component sub-pixel.

20 Claims, 25 Drawing Sheets

(51) Int. Cl.
  *H01L 27/146* (2006.01)
  *G09G 3/20* (2006.01)
  *H10K 50/858* (2023.01)
  *H10K 59/38* (2023.01)

(52) U.S. Cl.
  CPC ....... *G09G 3/3607* (2013.01); *H01L 27/1463* (2013.01); *H01L 27/14621* (2013.01); *H01L 27/14627* (2013.01); *H10K 50/858* (2023.02); *H10K 59/38* (2023.02); *G09G 3/2044* (2013.01); *G09G 2320/028* (2013.01); *G09G 2320/0209* (2013.01); *G09G 2320/0242* (2013.01); *G09G 2320/0285* (2013.01); *G09G 2320/0693* (2013.01)

(58) Field of Classification Search
  CPC ... G09G 2320/0242; G09G 2320/0693; G09G 2360/16; G09G 2320/0233; G09G 3/2074; G09G 2320/0276; G09G 3/3607; G09G 3/2003; G09G 2320/02; G09G 2320/0214; G09G 2320/0238; G09G 2320/028; G09G 2300/0452; G09G 3/3611; G09G 2320/06; H01L 27/14621; H01L 27/14623; H01L 27/1462
  See application file for complete search history.

(56) References Cited

U.S. PATENT DOCUMENTS

| | | | |
|---|---|---|---|
| 9,478,173 B2 * | 10/2016 | Safaee-Rad | H04N 9/69 |
| 10,141,379 B2 | 11/2018 | Kim et al. | |
| 10,325,973 B2 | 6/2019 | Motoyama | |
| 10,332,940 B2 | 6/2019 | Choi et al. | |
| 10,580,384 B1 * | 3/2020 | Woodall | G09G 5/02 |
| 10,739,188 B2 | 8/2020 | Nam et al. | |
| 10,964,240 B1 * | 3/2021 | Woodall | G09G 5/02 |
| 2003/0063106 A1 | 4/2003 | Starkweather et al. | |
| 2005/0275668 A1 * | 12/2005 | Feng | G09G 3/3611 345/694 |
| 2007/0222724 A1 * | 9/2007 | Ueno | G09G 3/3648 345/87 |
| 2010/0315449 A1 * | 12/2010 | Chaji | G09G 3/2003 345/77 |
| 2011/0221655 A1 * | 9/2011 | Fukui | G09G 3/3611 345/4 |
| 2012/0092520 A1 * | 4/2012 | Proca | H04N 9/69 348/223.1 |
| 2013/0321598 A1 * | 12/2013 | Inoue | G09G 3/20 348/54 |
| 2014/0022340 A1 * | 1/2014 | Dane | H04N 13/122 348/42 |
| 2014/0159184 A1 * | 6/2014 | Lim | H01L 27/14621 438/70 |
| 2017/0098432 A1 * | 4/2017 | Heo | G09G 5/026 |
| 2017/0287112 A1 * | 10/2017 | Stafford | G06F 3/013 |
| 2017/0373127 A1 * | 12/2017 | Motoyama | H10K 50/852 |
| 2019/0080656 A1 * | 3/2019 | Herranz | G09G 3/2003 |
| 2019/0189697 A1 | 6/2019 | Jun et al. | |

FOREIGN PATENT DOCUMENTS

| | | |
|---|---|---|
| CN | 106972041 A | 7/2017 |
| CN | 107180841 A | 9/2017 |
| JP | 2003162268 A | 6/2003 |

* cited by examiner

DIGITAL OPTICAL CROSS-TALK COMPENSATION SYSTEMS AND METHODS

CROSS-REFERENCE TO RELATED APPLICATIONS

This application claims priority to and the benefit of U.S. Provisional Application No. 62/906,625, filed Sep. 26, 2019, and entitled, "DIGITAL OPTICAL CROSS-TALK COMPENSATION SYSTEMS AND METHODS," and U.S. Provisional Application No. 62/906,563, filed Sep. 26, 2019, and entitled, "DISPLAY PANEL OPTICAL CROSS-TALK COMPENSATION SYSTEMS AND METHODS," each of which is incorporated herein by reference in its entirety for all purposes. This application is related to U.S. application Ser. No. 17/003,606, filed Aug. 26, 2020, entitled "Display Panel Optical Cross-Talk Compensation Systems and Methods," which is incorporated herein by reference in its entirety for all purposes.

SUMMARY

A summary of certain embodiments disclosed herein is set forth below. It should be understood that these aspects are presented merely to provide the reader with a brief summary of these certain embodiments and that these aspects are not intended to limit the scope of this disclosure. Indeed, this disclosure may encompass a variety of aspects that may not be set forth below.

The present disclosure generally relates to electronic displays, which may be implemented and/or operated to present visual representations of information by displaying one or more images (e.g., image frames and/or pictures) on its display panel. Accordingly, electronic devices, such as computers, mobile phones, portable media devices, tablets, televisions, virtual-reality headsets, and vehicle dashboards, among many others, often include and/or utilize one or more electronic displays. In any case, an electronic display may generally display image content by actively controlling light emission from display pixels, which each includes one or more color component sub-pixels, implemented on its display panel based on corresponding image data, which is indicative of target characteristics (e.g., color and/or magnitude) of light emission therefrom.

For example, a display pixel in an electronic display may include one or more red sub-pixels that control magnitude of red light emission from the display pixel, one or more blue sub-pixels that control magnitude of blue light emission from the display pixel, one or more green sub-pixels that control magnitude of green light emission from the display pixel, one or more white sub-pixels that control magnitude of white light emission from the display pixel, or any combination thereof. Additionally, an image pixel (e.g., image data corresponding with point in image content) corresponding with the display pixel may include red component image data (e.g., red grayscale level) indicative of target red light emission from the display pixel, blue component image data (e.g., blue grayscale level) indicative of target blue light emission from the display pixel, green component image data (e.g., green grayscale level) indicative of target green light emission from the display pixel, white component image data (e.g., white grayscale level) indicative of target white light emission from the display pixel, or any combination thereof. In other words, to display image content at the display pixel, the electronic display may actively control magnitude of light emission from the one or more red sub-pixels of the display pixel based on the red component image data, the magnitude of light emission from the one or more green sub-pixels of the display pixel based on the green component image data, and so on.

Generally, magnitude of light emission from a display pixel (e.g., color component sub-pixel) varies with the amount of electrical energy stored therein. For example, in some instances, a display pixel may include a light-emissive element, such as an organic light-emitting diode (OLED), that varies its light emission with current flow therethrough, a current control switching device (e.g., transistor) coupled between the light-emissive element and a pixel power (e.g., VDD) supply rail, and a storage capacitor coupled to a control (e.g., gate) terminal of the current control switching device at an internal node of the display pixel. As such, varying the amount of electrical energy stored in the storage capacitor may vary voltage applied to the control input of the current control switching device and, thus, magnitude of electrical current supplied from the pixel power supply rail to the light-emissive element. In other words, at least in such instances, light emission from a display pixel may be controlled at least in part by controlling magnitude of electrical power (e.g., voltage and/or current) supplied to its internal node.

However, it should be appreciated that the organic light-emitting diode (OLED) electronic display examples described in the present disclosure are merely intended to be illustrative and not limiting. In particular, it should be appreciated that the techniques described in the present disclosure may be applied to and/or implemented for other types of electronic displays. For example, the techniques may be adapted to a liquid crystal display (LCD) that uses a pixel electrode and a common electrode as a storage capacitor and a light-emitting diode (LED) backlight as a light-emissive element.

To facilitate controlling supply of electrical power and, thus, resulting light emission, an electronic display may include driver circuitry electrically coupled its display pixels. For example, the driver circuitry may include a scan (e.g., gate) driver electrically coupled to each of the display pixels via a corresponding scan line and a data (e.g., source) driver electrically coupled to each of the display pixels via a corresponding scan line. To write a display pixel (e.g., color component sub-pixel), the scan driver may output an activation (e.g., logic high) control signal to a scan line coupled to the display pixel, thereby causing the display pixel to electrically connect its storage capacitor to a data line coupled to the display pixel, and the data driver may output an analog electrical (e.g., voltage and/or current) signal to the data line based at least in part on corresponding image data.

As described above, image data (e.g., image pixel in image content) corresponding with a display pixel on a display panel may be indicative of target characteristics (e.g., color and/or magnitude) of light emission therefrom, for example, by indicating one or more target achromatic brightness (e.g., grayscale) levels (e.g., values) that are mapped to a light emission magnitude range associated with a panel brightness setting used to display corresponding image content on the display panel. Additionally, as described above, a display pixel may include one or more color component sub-pixels, which are each implemented and/or operated to control light emission of a specific color. For example, a display pixel may include a red sub-pixel that controls magnitude of red light emission from the display pixel, a green sub-pixel that controls magnitude of green light emission from the display pixel, a blue sub-pixel that controls magnitude of blue light emission from the display pixel, a white sub-pixel that controls magnitude of white light emission from the display pixel, or any combination thereof.

To facilitate producing light of a target color, at least in some instances, each color component sub-pixel implemented on a display panel may include a color filter cell of an appropriate target color that is disposed between a light-emissive element (e.g., OLED) and an outward-facing viewing surface of the display panel. For example, a red sub-pixel may include a red color filter cell disposed over a red organic light-emitting diode, a green sub-pixel may include a green color filter cell disposed over a green organic light-emitting diode, a blue sub-pixel may include a blue color filter cell disposed over a blue organic light-emitting diode, a white sub-pixel may include a white color filter cell disposed over a white organic light-emitting diode, or any combination thereof. Additionally, at least in some instances, an encapsulation layer, such as thin film encapsulation (TFE) layer, may be formed over the light-emissive elements, for example, to separate one or more light-emissive elements (e.g., OLEDs) from the color filter layer. Thus, at least in such instances, a light ray emitted from a light-emissive element of a color component sub-pixel may pass through the encapsulation layer and the color filter layer before exiting the outward-facing viewing surface of the display panel.

Generally, light emitted from a light source, such as an organic light-emitting diode of a color component sub-pixel, radiates outwardly from the light source, for example, in a conical shape. As such, magnitude of light emission is generally strongest along a normal axis of the light source and weakens the farther the emission angle deviates from the normal axis. Accordingly, color filter cells are often implemented such that their footprints (e.g., width, length, and/or pitch) are centered on the normal axes of corresponding light-emissive elements, for example, to facilitate maximizing perceived brightness resulting from actual light emission of the light-emissive elements when the display panel is viewed by a user's (e.g., human's) eye with a viewing angle of zero (e.g., pupil oriented perpendicular to display panel and/or along normal axis of display panel).

A human's eye generally perceives visible light due to interaction of cones (e.g., photoreceptor cells) in its retina with corresponding light rays. However, a human's eye generally has a limited field of view (FOV), which is centered on its viewing (e.g., gaze or pupil) angle. Due to its limited field of view, at least in some instances, a human's eye may perceive a first portion of light emitted from a display pixel, but not a second portion of the light emitted from the display pixel, for example, due to light rays in the second portion of the emitted light not actually reaching the eye's retina and, thus, being outside its field of view. In other words, luminance perceived by a human's eye may generally be dependent on its field of view.

However, the field of view of a human's eye may generally vary with its viewing characteristics, such as viewing (e.g., gaze or pupil) angle, viewing location (e.g., pupil offset from center and/or pupil relief), and/or viewing aperture (e.g., pupil or eye box) size. For example, orientation (e.g., direction) of the field of view of a human's eye may be dependent on its gaze (e.g., viewing or pupil) angle and, thus, a change in its gaze angle (e.g., due to eye rotation) may change orientation of its field of view. Additionally or alternatively, size (e.g., span) of the field of view of a human's eye may be dependent on its pupil (e.g., viewing aperture or eye box) size and, thus, a change in its pupil size may change the size of its field of view.

Moreover, the sensitivity of a human's eye to visible light generally varies across its field of view. In particular, a central portion (e.g., fovea) of an eye's retina is generally more sensitive to visible light compared to a peripheral (e.g., outer) portion of the eye's retina, for example, due to the central portion of the retina including more and/or denser cones while the peripheral portion includes fewer and/or less dense cones. To facilitate accounting for the variation in sensitivity to visible light, at least in some instances, the field of view of a human's eye may be divided into a focus (e.g., foveal or high resolution) region, which is centered on its viewing angle, corresponding with the central portion of the eye's retina and one or more periphery (e.g., non-foveal or low resolution) regions, which are outside the focus region, corresponding with the peripheral portion of the eye's retina.

In other words, at least in some instances, the portion of light emitted from a display pixel (e.g., color component sub-pixel) that is actually perceived by a user's (e.g., human's) eye may vary with its field of view and, thus, its viewing characteristics (e.g., angle, location, and/or aperture size) that resulted in the field of view. For example, a color component sub-pixel may appear brighter when viewed from a viewing angle of zero (e.g., pupil oriented along normal axis) and darker when viewed from a non-zero viewing angle (e.g., pupil orientation different from normal axis). In fact, due to spatial offset between color component sub-pixels implemented on a display panel, a user's eye may concurrently view multiple color component sub-pixels with different viewing angles. In other words, at least in some instances, a first color component sub-pixel may appear brighter and a second color component sub-pixel may appear darker when the display panel is viewed with a first viewing angle whereas the first color component sub-pixel may appear darker and the second color component sub-pixel may appear brighter when the display panel is viewed with a second (e.g., different) viewing angle. Since a user's eye generally perceives different colors by averaging perceived light emission from multiple color component sub-pixels, at least in some instances, variations in perceived luminance of color component sub-pixels resulting from different sets of viewing characteristics may produce a perceivable color shift in image content displayed on the display panel.

Furthermore, as described above, a display panel may include an encapsulation layer implemented between a light-emissive element, such as an organic light-emitting diode (OLED) of a color component sub-pixel, and a color filter layer and, thus, light rays emitted from the light-emissive element pass through the encapsulation layer and the color filter layer before exiting an outward-facing viewing surface of the display panel. Additionally, as described above, light emitted from a light source, such as a light-emissive element (e.g., OLED) of a color component sub-pixel, generally radiates outwardly from the light source, for example, in a conical shape. In fact, due to radiation (e.g., spread) of light rays emitted from a light-emissive element of a color component sub-pixel and the distance the light rays travel before exiting the color filter layer, at least in some instances, a portion of the light rays emitted from the light-emissive element of the color component sub-pixel may actually pass through a color filter cell of a neighboring (e.g., different colored) color component sub-pixel, thereby producing optical cross-talk. For example, a portion of light emitted from an organic light-emitting diode of a red sub-pixel may pass through a red color filter cell of the red sub-pixel while another portion of the light emitted from the organic light-emitting diode passes through a green color filter cell of a neighboring green sub-pixel.

When color filter cell footprints are centered over corresponding light-emissive elements, viewing a display panel with a viewing angle of zero generally results in the light that is emitted from the light-emissive elements and actually perceived by a user's (e.g., human's) eye passing through appropriately colored color filter cells. However, as viewing angle moves away from zero, a user's eye may end up perceiving more of the light that passes through a neighboring (e.g., inappropriately colored) color filter cell, thereby increasing perceivability of color shift resulting from optical cross-talk. In other words, different sets of viewing characteristics may affect the resulting field of view and, thus, color of light emitted from a display panel that is actually perceived by a user's eye, which, at least in some instances, may result in a perceivable color shift in image content displayed on the display panel. That is, the color shift may result in a perceived color in image content displayed on a display panel perceivably differing from a corresponding target color, which, at last in some instances, may affect perceived quality of the image content and, thus, potentially the display panel displaying the image content, an electronic display including the display panel, and/or an electronic device including the display panel.

Accordingly, to facilitate improving perceived quality, the present disclosure provides techniques for implementing and/or operating an electronic device to reduce perceivability and/or likelihood of a color shift occurring in displayed image content, for example, due to optical cross-talk between neighboring (e.g., differently colored) color component sub-pixels. In particular, the present disclosure provides techniques for implementing and/or operating the electronic device to adaptively process image data to facilitate compensating for (e.g., offsetting) color shift expected to result from optical cross-talk. Additionally, the present disclosure provides techniques for implementing (e.g., designing and/or manufacturing) a display panel of an electronic display included in and/or used by the electronic device to facilitate reducing optical cross-talk and, thus, resulting color shift.

In addition to a display panel and driver circuitry, in some embodiments, an electronic display may include a lens disposed over (e.g., overlaid on or overlapping) its display panel. In particular, in some such embodiments, the lens may be a convex-concave (e.g., meniscus) lens that focuses light emitted from the display panel, for example, to facilitate presenting virtual (e.g., virtual reality and/or augmented reality) image content. In other such embodiments, the lens may be a biconvex lens, a biconcave lens, a plano-convex lens, or a plano-concave lens. However, regardless of whether a lens is implemented in front of the display panel, optical cross-talk and, thus, perceivable color shift may occur under different viewing characteristics. In other words, the techniques described in the present disclosure may be applied to facilitate reducing optical cross-talk and, thus, resulting color shift in electronic displays that includes a lens as well as electronic displays that do not include a lens.

As described above, optical cross-talk may result due to light emitted from a light-emissive element, such as an organic light-emitting diode (OLED), of a color component sub-pixel that passes through a neighboring (e.g., inappropriately colored) color filter cell actually being perceived by a user's (e.g., human's) eye. Moreover, as described above, light emitted from a light-emissive element of a color component sub-pixel may pass through the color filter cell of a neighboring color component sub-pixel due to emitted light rays radiating (e.g., spreading) outwardly. In other words, since spread of light rays emitted from a light source generally increases as distance traveled by the light rays increases, the amount of light emitted from a light-emissive element of a color component sub-pixel that passes through the color filter cell of a neighboring color component sub-pixel may be dependent on the distance the light travels before exiting the color filter layer.

As such, to facilitate reducing color shift resulting from optical cross-talk, in some embodiments, panel implementation parameters may be adjusted to facilitate reducing the distance light rays emitted from a light-emissive element of a color component sub-pixel on a display panel travel before exiting a color filter layer of the display panel, for example, via a design and/or manufacturing process. In particular, in some such embodiments, the panel implementation parameters may be adjusted to reduce thickness (e.g., height) of an encapsulation layer formed between the light-emissive element and the color filter layer. For example, a design process may adjust current (e.g., baseline) panel implementation parameters such that thickness of the encapsulation layer is reduced from a first (e.g., baseline) thickness (e.g., two micrometers) to a second (e.g., adjusted or reduced) thickness (e.g., one micrometer).

Additionally or alternatively, panel implementation parameters may be adjusted to change the size of one or more color filter cells implemented in a color filter layer of a display panel, for example, via a design and/or manufacturing process. In particular, to facilitate reducing the distance light rays emitted from a light-emissive element of a color component sub-pixel travel before exiting the color filter layer, in some embodiments, the panel implementation parameters may be adjusted to reduce thickness (e.g., height) of one or more color filter cells implemented in the color filter layer. For example, a design process may adjust current (e.g., baseline) panel implementation parameters such that thickness of a color filter cell is reduced from a first (e.g., baseline) thickness (e.g., two micrometers) to a second (e.g., adjusted or reduced) thickness (e.g., one micrometer). In fact, in some embodiments, the panel implementation parameters may be adjusted such that thickness of the color filter cell in the color filter layer as well as thickness of the encapsulation layer are both reduced. In this manner, the panel implementation parameters used to implement a display panel may be adjusted to facilitate reducing the distance light rays emitted from a light-emissive element of a color component sub-pixel travel before exiting a color filter layer, which, at least in some instances, may facilitate reducing the amount of light that passes through a neighboring color filter cell and, thus, optical cross-talk and resulting color shift.

Moreover, to facilitate reducing color shift resulting from optical cross-talk, in some embodiments, panel implementation parameters may additionally or alternatively be adjusted to change the footprint (e.g., width, length, and/or pitch) of one or more color filter cells implemented in a color filter layer of a display panel, for example, via a design and/or manufacturing process. In particular, in some embodiments, the panel implementation parameters may be adjusted such that footprint of each color filter cell implemented in the color filter layer is uniformly changed. For example, a design process may adjust the panel implementation parameters such that pitch (e.g., width or length) of each color filter cell is increased from a baseline pitch by the same amount (e.g., one nanometer).

In some embodiments, an adjusted footprint color filter layer may nevertheless be centered on a display panel. In other words, in such embodiments, an increase in footprint of a color filter cell may result in another (e.g., neighboring) color filter cell being shifted outwardly. In fact, in some embodiments, the footprint increase and/or the positional shift resulting from the footprint increase may result in a color filter cell of a color component sub-pixel at least partially overlapping a light-emissive element (e.g., OLED) of a neighboring color component sub-pixel. For example, when footprint of each color filter cell is uniformly increased, the amount of overlap between a light-emissive element of a color component sub-pixel and a color filter cell of a neighboring color component sub-pixel may generally be lower towards the center of the display panel and increase moving away from the center of the display panel.

In other words, adjusting color filter cell footprint may change the portion of light emitted from a light-emissive element of a color component sub-pixel that passes through a color filter cell of a neighboring color component sub-pixel. However, at least in some instances, adjusting color filter cell footprint too much may actually increase perceivable color shift. For example, adjusting the panel implementation parameters to double the baseline footprint of a color filter cell in a color component sub-pixel may result in the color filter cell completely overlapping an organic light-emitting diode (OLED) of a neighboring (e.g., different colored) color component sub-pixel.

Accordingly, to facilitate improving perceived image quality, in some embodiments, a uniform adjustment to color filter cell footprint may be optimized for a focus region in the field of view (FOV) of a user's (e.g., human's) eye resulting from various sets of viewing characteristics, for example, to facilitate reducing the amount of light passing through a neighboring (e.g., inappropriately colored) color filter cell that is perceived in the focus region. However, at least in some instances, a uniform adjustment to color filter cell footprint may result in a color shift spike (e.g., non-monotonic change) in a periphery region of the field of view of a user's eye when the display panel is viewed with a non-zero viewing angle, for example, due to the non-zero viewing angle resulting in light emitted from a light-emissive element of a central color component sub-pixel that passes through a color filter cell of neighboring color component sub-pixel being perceived in the periphery region. Although some amount of color shift in a periphery region of the field of view may be acceptable, a color shift spike may generally be more perceivable than a monotonically changing color shift.

To facilitate further improving perceived image quality, in other embodiments, panel implementation parameters may be adjusted such that color filter cell footprints are non-uniformly adjusted, for example, via a design and/or manufacturing process. In other words, in some such embodiments, the footprint of different color filter cells may be adjusted from a baseline footprint by different amounts. In particular, to facilitate reducing color shift spikes resulting in a periphery region of a field of view when a display panel is viewed with a non-zero viewing angle, in some embodiments, footprint of color filter cells may gradually increase moving from the center of the display panel toward an edge (e.g., side) of the display panel. For example, a design process may adjust current (e.g., baseline) panel implementation parameters such that the color filter cell footprint of a central color component sub-pixel is maintained at the baseline footprint and color filter cell footprint of a first non-central color component is increased from the baseline footprint by a first amount. Additionally, the design process may adjust current panel implementation parameters such that the color filter cell footprint of a second non-central color component sub-pixel, which is farther from the central color component sub-pixel than the first non-central color component sub-pixel, is increased from the baseline footprint by a second amount greater than the first amount.

In other words, varying color filter cell footprint in this manner may facilitate reducing the amount of overlap between light-emissive elements (e.g., OLEDs) of central color component sub-pixels with neighboring (e.g., inappropriately colored) color filter cells while increasing the amount of overlap between light-emissive elements of outer (e.g., non-central) color component sub-pixels with neighboring color filter cells. As such, when a display panel is viewed with a non-zero viewing angle that results in a central color component sub-pixel being perceived in a periphery region of a resulting field of view, the reduced amount of overlap may facilitate reducing the amount of light emitted from a light-emissive element (e.g., OLEDs) of the central color component sub-pixel that passes through a neighboring color filter cell and is perceived in the periphery region of the field of view. However, as described above, at least in some instances, adjusting color filter cell footprint too much may actually increase color shift.

Accordingly, to facilitate improving perceived image quality, in some embodiments, a non-uniform adjustment to color filter cell footprint may be optimized for field of view (FOV) of a user's (e.g., human's) eye resulting from various sets of viewing characteristics, for example, to balance reduction in the amount of light passing through neighboring color filter cell that is perceived in a focus region of a field of view with reduction in the amount of light passing through the neighboring color filter cell (e.g., color shift spike) that is perceived in a periphery region of the field of view. In fact, in some embodiments, panel implementation parameters may be adjusted to change footprint of one or more color filter cells in a color filter layer while also reducing the distance light rays emitted from a light-emissive element of a color component sub-pixel travel before exiting the color filter layer, for example, via a design and/or manufacturing process. Merely as an illustrative example, current (e.g., baseline) panel implementation parameters may be adjusted to reduce thickness (e.g., height) of each color filter cell and/or an encapsulation layer from a baseline thickness while uniformly increasing footprint of each color filter cell from a baseline color filter cell footprint, which, at least in some instances, may facilitate reducing perceivability and/or likelihood of a color shift spike resulting in a periphery region of a field of view. Although implementing a display panel of an electronic display in this manner may facilitate reducing color shift, at least in some instances, some amount of color shift may nevertheless be perceivable in image content displayed on the display panel.

To facilitate further improving perceived image quality, in some embodiments, an electronic device may include image processing circuitry implemented and/or operated to process image data before processed (e.g., display) image data is supplied to an electronic display to display corresponding image content. For example, the image processing circuitry may include a burn-in compensation (BIC) block (e.g., circuitry group), which is implemented and/or operated to process image data to facilitate accounting for light emission variations resulting from display pixel aging (e.g., burn-in), and/or a white point compensation (WPC) block (e.g., circuitry group), which is implemented and/or operated to process image data to facilitate accounting for color variations (e.g., shifts) resulting from environmental conditions, such as temperature (e.g., in addition to backlight brightness level). Moreover, to facilitate reducing color shift resulting from optical cross-talk, the image processing circuitry may include an optical cross-talk compensation (OXTC) block (e.g., circuitry group), which is implemented and/or operated to process image data based at least in part on optical cross-talk compensation parameters.

To facilitate compensating for (e.g., offsetting) color shift resulting from optical cross-talk, in some embodiments, the optical cross-talk compensation (OXTC) parameters may include one or more optical cross-talk compensation factor maps, which each explicitly associates (e.g., maps) one or more pixel positions on a display panel to one or more optical cross-talk compensation factors (e.g., offset values and/or gain values) to be applied to image data corresponding with a display pixel at the pixel position. In fact, in some embodiments, an optical cross-talk compensation factor map may explicitly associate a pixel position with a set of multiple optical cross-talk compensation factors. For example, the optical cross-talk compensation factors associated with a pixel position may be indicated as a three-by-three matrix, which includes a red optical cross-talk compensation factor, a red-to-green optical cross-talk compensation factor, a red-to-blue optical cross-talk compensation factor, a green-to-red optical cross-talk compensation factor, a green optical cross-talk compensation factor, a green-to-blue optical cross-talk compensation factor, a blue-to-red optical cross-talk compensation factor, a blue-to-green optical cross-talk compensation factor, and a blue optical cross-talk compensation factor. Thus, when input image data associated with the pixel position is received, the optical cross-talk compensation block may apply each of the multiple optical cross-talk compensation factors to the input image data, for example, by multiplying the three-by-three matrix with a three-by-one matrix (e.g., vector) including red component input image data, green component input image data, and blue component input image data.

Moreover, in some embodiments, an optical cross-talk compensation factor map to be used by image processing circuitry of an electronic device may be stored in the electronic device, for example, in memory. In other words, in such embodiments, size of the optical cross-talk compensation factor map may affect the amount of storage capacity available in the electronic device. As such, to facilitate conserving (e.g., optimizing) storage capacity of the electronic device, in some embodiments, an optical cross-talk compensation factor map may explicitly associate each of a subset of pixel positions on a display panel with one or more corresponding optical cross-talk compensation factors. In other words, in such embodiments, one or more pixel positions on the display panel and, thus, corresponding optical cross-talk compensation factors may not be explicitly identified in the optical cross-talk compensation factor map.

When a pixel position is not explicitly identified in an optical cross-talk compensation factor map, the optical cross-talk compensation block may determine an optical cross-talk compensation factor to be applied to image data corresponding with the pixel position by interpolating optical cross-talk compensation factors associated with other pixel positions explicitly identified in the optical cross-talk compensation factor map, for example, using linear interpolation, bi-linear interpolation, spline interpolation, and/or the like. As described above, in some embodiments, a pixel position may be associated with a set of multiple optical cross-talk compensation factors. In such embodiments, when a pixel position is not explicitly identified in an optical cross-talk compensation factor map, the optical cross-talk compensation block may determine a set of optical cross-talk compensation factor to be applied to image data corresponding with the pixel position by interpolating sets of optical cross-talk compensation factors associated with other pixel positions explicitly identified in the optical cross-talk compensation factor map. For example, the optical cross-talk compensation block may determine a red optical cross-talk compensation factor to be applied to image data corresponding with the pixel position by interpolating red optical cross-talk compensation factors associated with other pixel positions explicitly identified in the optical cross-talk compensation factor map, a red-to-green optical cross-talk compensation factor to be applied to image data corresponding with the pixel position by interpolating red-to-green optical cross-talk compensation factor associated with the other pixel positions explicitly identified in the optical cross-talk compensation factor map, and so on.

However, at least in some instances, interpolation may result in some amount of error. In fact, interpolation error generally increases as interpolation distance increases. Moreover, at least in some instances, susceptibility to perceivable color shift may vary across a display panel. For example, an outer (e.g., side) portion of the display panel may be more susceptible to perceivable color shift than a central portion of the display panel due to panel implementation parameters being optimized for a viewing angle of zero (e.g., pupil oriented along normal axis of display panel). To facilitate accounting for variation in color shift susceptibility and interpolation error, in some embodiments, the pixel positions on a display panel explicitly identified in an optical cross-talk compensation factor map may be non-uniformly spaced (e.g., distributed). For example, the optical cross-talk compensation factor map may utilize a finer granularity for the outer portion of the display panel by explicitly identifying more pixel positions per area in the outer portion and utilize a coarser granularity for the central portion of the display panel by explicitly identifying fewer pixel positions per area in the central portion.

In some embodiments, a single (e.g., static) optical cross-talk compensation factor map may be calibrated to a display panel to account for multiple different sets of viewing characteristics, for example, which each includes a viewing (e.g., pupil or gaze) angle, a viewing location (e.g., pupil offset from center and/or pupil relief), and a viewing aperture (e.g., pupil or eye box) size. However, as described above, a resulting field of view and, thus, perceivability of color shift resulting from optical cross-talk generally varies when a display panel is viewed using different sets of viewing characteristics. As such, to facilitate improving efficacy of optical cross-talk compensation, in other embodiments, the optical cross-talk compensation block may include and/or have access to multiple candidate optical cross-talk compensation factor maps, which are each calibrated for a different set of viewing characteristics. In other words, in such embodiments, the optical cross-talk compensation block may select a different candidate optical cross-talk compensation factor map as a target candidate optical cross-talk compensation factor map under different sets of viewing characteristics and, thus, adaptively adjust processing of input image data.

To facilitate adaptively adjusting processing performed on image data, in some embodiments, an optical cross-talk compensation block may receive one or more viewing characteristic parameters indicative of a set of viewing characteristics with which a display panel to be used to display corresponding image content is expected to be viewed, for example, from an eye (e.g., pupil) tracking sensor (e.g., camera). In particular, in some embodiments, the viewing characteristic parameters may indicate a horizontal (e.g., x-direction) offset of pupil position from a default (e.g., forward-facing) pupil position and a vertical (e.g., y-direction) offset of pupil position from the default pupil position and, thus, may be indicative of expected viewing angle. Additionally, in some embodiments, the viewing characteristic parameters may indicate a pupil relief (e.g., distance from pupil to display panel) and, thus, may be indicative of expected viewing location. Furthermore, in some embodiments, the viewing characteristic parameters may indicate a pupil size and, thus, may be indicative of expected viewing aperture size.

In addition to an optical cross-talk compensation block, as described above, image processing circuitry implemented in an electronic device may include one or more other compensation blocks, such as a white point compensation (WPC) block and/or a burn-in compensation (BIC) block. In some embodiments, the various compensation blocks (e.g., circuitry groups) may be implemented in a hardware pipeline and, thus, serially process image data. Additionally, before processing by image processing circuitry of an electronic device, in some embodiments, image data may be stored in the electronic device, for example, in memory. Furthermore, as described above, the field of view (FOV) of a human's (e.g., user's) eye generally includes a focus region that is more sensitive to visible light and one or more periphery regions outside the focus region that are less sensitive to visible light.

Leveraging the reduced sensitivity outside the focus region, in some embodiments, image data may be stored in a foveated (e.g., compressed or grouped) domain that utilizes a pixel resolution different from (e.g., lower than) a panel (e.g., native or non-foveated) domain of a display panel to be used to display corresponding image content, for example, to facilitate conserving (e.g., optimizing) storage capacity of the electronic device. In particular, in the foveated domain, an image frame may be divided in multiple foveation regions (e.g., tiles) in which different pixel resolutions are utilized. For example, a central (e.g., first) foveation region may be identified in an image frame such that it is co-located with a focus (e.g., foveal) region of the field of view with which the image frame is expected to be viewed (e.g., visually perceived). Since the sensitivity to visible light in the focus region is higher, in some embodiments, the central foveation region may utilize a pixel resolution that matches the (e.g., full) pixel resolution of the display panel. In other words, in such embodiments, each image pixel (e.g., image data corresponding with point in image) in the central foveation region of the image frame may correspond with single display pixel (e.g., set of one or more color component sub-pixels) implemented on the display panel.

In addition to a central foveation region, in the foveated domain, one or more outer foveation regions that utilize lower pixel resolutions than the central foveation region may be identified in an image frame. In other words, in some embodiments, an outer foveation region in an image frame may be identified such that it is co-located with one or more periphery regions of the field of view with which the image frame is expected to be viewed (e.g., visually perceived). In fact, leveraging the gradual reduction in sensitivity to visible light outside the focus region, in some embodiments, multiple outer foveation regions may be identified in an image frame such that utilized pixel resolution gradually decreases moving away from the central foveation region identified in the image frame.

For example, a first one or more outer foveation regions directly adjacent the central foveation region may each utilize a pixel resolution that is half the pixel resolution of central foveation region and, thus, the display panel. In other words, in the foveated domain, each image pixel (e.g., image data corresponding with point in image) in the first one or more outer foveation regions may correspond with two display pixels (e.g., sets of one or more color component sub-pixels) implemented on the display panel. Additionally, a second one or more outer foveation regions outside of the first one or more outer foveation regions may each utilize a pixel resolution that is half the pixel resolution of the first one or more outer foveation regions and, thus, a quarter of the pixel resolution of the central foveation region and the display panel. In other words, in the foveated domain, each image pixel in the second one or more outer foveation regions may correspond with four display pixels (e.g., sets of one or more color component sub-pixels) implemented on the display panel.

To facilitate improving processing efficiency, in some embodiments, image data may be processed by image processing circuitry at least in part in the foveated domain. For example, a white point compensation (WPC) block (e.g., circuitry group) implemented in the image processing circuitry may process image data in the foveated domain to facilitate accounting for color variations (e.g., shifts) resulting from environmental conditions, such as temperature (e.g., in addition to backlight brightness level). However, the image processing circuitry may also include one or more other compensation blocks, such as a burn-in compensation (BIC) block and/or an optical cross-talk compensation (OXTC) block, that process image data to facilitate accounting for variations between different display pixels (e.g., color component sub-pixels) on a display panel and, thus, may be implemented and/or operated to process image data in a panel (e.g., native) domain of the display panel. In other words, in some embodiments, a first (e.g., upstream) portion of the image processing circuitry may be implemented and/or operated to process image data in the foveated domain while a second (e.g., downstream or different) portion of the image processing circuitry is implemented and/or operated to process image data in the panel domain.

As such, in some embodiments, image processing circuitry in an electronic device may include a domain conversion block (e.g., circuitry group) that is implemented and/or operated to convert between a foveated domain and a panel domain of a display panel used by the electronic device. In other words, the domain conversion block may convert image data between a pixel resolution used in a corresponding foveation region and the (e.g., full) pixel resolution of the display panel. For example, when the pixel resolution used in a central foveation region matches the display panel pixel resolution, image data (e.g., image pixels) corresponding with the central foveation region may pass through the domain conversion block unchanged.

On the other hand, when the pixel resolution of an outer foveation region is lower than the display panel resolution, the domain conversion block may convert image data (e.g., image pixels) corresponding with the outer foveation region from the foveated domain to the panel domain at least in part by outputting multiple instances of the image data. For example, the domain conversion block may convert image data corresponding with a first one or more outer foveation regions, which utilize a pixel resolution half the display panel resolution, to the panel domain by outputting two instances of the image data such that a first instance is associated with a first display pixel and a second instance is associated with a second display pixel. Similarly, the domain conversion block may convert image data corresponding with a second one or more outer foveation regions, which utilize a pixel resolution a quarter of the display panel resolution, to the panel domain by outputting four instances of the image data, for example, to a downstream optical cross-talk compensation (OXTC) block for further processing. In this manner, as will be described in more detail below, the techniques described in present disclosure may facilitate reducing perceivability and/likelihood of color shift occurring in image content displayed on a display panel, which, at least in some instances, may facilitate improving perceived quality of the displayed image content and, thus, potentially the display panel, an electronic display including the display panel, and/or an electronic device that utilizes the display panel.

BRIEF DESCRIPTION OF THE DRAWINGS

Various aspects of the present disclosure may be better understood upon reading the following detailed description and upon reference to the drawings in which.

DETAILED DESCRIPTION

Figure 1:
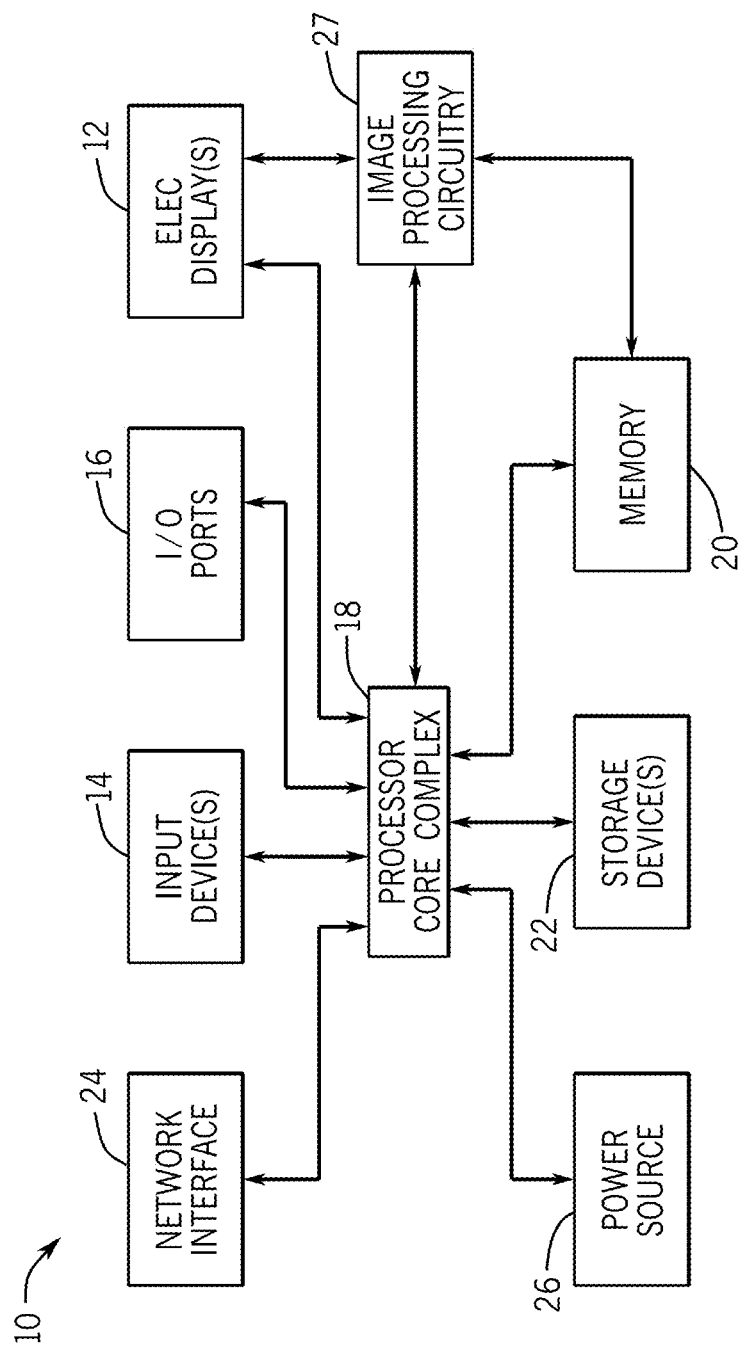
FIG. 1 is a block diagram of an electronic device including one or more electronic displays, in accordance with an embodiment of the present disclosure.

One or more specific embodiments of the present disclosure will be described below. These described embodiments are only examples of the presently disclosed techniques. Additionally, in an effort to provide a concise description of these embodiments, all features of an actual implementation may not be described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but may nevertheless be a routine undertaking of design, fabrication, and manufacture for those of ordinary skill having the benefit of this disclosure.

When introducing elements of various embodiments of the present disclosure, the articles "a," "an," and "the" are intended to mean that there are one or more of the elements. The terms "comprising," "including," and "having" are intended to be inclusive and mean that there may be additional elements other than the listed elements. Additionally, it should be understood that references to "one embodiment" or "an embodiment" of the present disclosure are not intended to be interpreted as excluding the existence of additional embodiments that also incorporate the recited features.

The present disclosure generally relates to electronic displays, which may be implemented and/or operated to present visual representations of information by displaying one or more images (e.g., image frames and/or pictures) on its display panel. Accordingly, electronic devices, such as computers, mobile phones, portable media devices, tablets, televisions, virtual-reality headsets, and vehicle dashboards, among many others, often include and/or utilize one or more electronic displays. In any case, an electronic display may generally display image content by actively controlling light emission from display pixels, which each includes one or more color component sub-pixels, implemented on its display panel based on corresponding image data, which is indicative of target characteristics (e.g., color and/or magnitude) of light emission therefrom.

For example, a display pixel in an electronic display may include one or more red sub-pixels that control magnitude of red light emission from the display pixel, one or more blue sub-pixels that control magnitude of blue light emission from the display pixel, one or more green sub-pixels that control magnitude of green light emission from the display pixel, one or more white sub-pixels that control magnitude of white light emission from the display pixel, or any combination thereof. Additionally, an image pixel (e.g., image data corresponding with point in image content) corresponding with the display pixel may include red component image data (e.g., red grayscale level) indicative of target red light emission from the display pixel, blue component image data (e.g., blue grayscale level) indicative of target blue light emission from the display pixel, green component image data (e.g., green grayscale level) indicative of target green light emission from the display pixel, white component image data (e.g., white grayscale level) indicative of target white light emission from the display pixel, or any combination thereof. In other words, to display image content at the display pixel, the electronic display may actively control magnitude of light emission from the one or more red sub-pixels of the display pixel based on the red component image data, the magnitude of light emission from the one or more green sub-pixels of the display pixel based on the green component image data, and so on.

Generally, magnitude of light emission from a display pixel (e.g., color component sub-pixel) varies with the amount of electrical energy stored therein. For example, in some instances, a display pixel may include a light-emissive element, such as an organic light-emitting diode (OLED), that varies its light emission with current flow therethrough, a current control switching device (e.g., transistor) coupled between the light-emissive element and a pixel power (e.g., $V_{DD}$) supply rail, and a storage capacitor coupled to a control (e.g., gate) terminal of the current control switching device at an internal node of the display pixel. As such, varying the amount of electrical energy stored in the storage capacitor may vary voltage applied to the control input of the current control switching device and, thus, magnitude of electrical current supplied from the pixel power supply rail to the light-emissive element. In other words, at least in such instances, light emission from a display pixel may be controlled at least in part by controlling magnitude of electrical power (e.g., voltage and/or current) supplied to its internal node.

However, it should be appreciated that the organic light-emitting diode (OLED) electronic display examples described in the present disclosure are merely intended to be illustrative and not limiting. In particular, it should be appreciated that the techniques described in the present disclosure may be applied to and/or implemented for other types of electronic displays. For example, the techniques may be adapted to a liquid crystal display (LCD) that uses a pixel electrode and a common electrode as a storage capacitor and a light-emitting diode (LED) backlight as a light-emissive element.

To facilitate controlling supply of electrical power and, thus, resulting light emission, an electronic display may include driver circuitry electrically coupled its display pixels. For example, the driver circuitry may include a scan (e.g., gate) driver electrically coupled to each of the display pixels via a corresponding scan line and a data (e.g., source) driver electrically coupled to each of the display pixels via a corresponding scan line. To write a display pixel (e.g., color component sub-pixel), the scan driver may output an activation (e.g., logic high) control signal to a scan line coupled to the display pixel, thereby causing the display pixel to electrically connect its storage capacitor to a data line coupled to the display pixel, and the data driver may output an analog electrical (e.g., voltage and/or current) signal to the data line based at least in part on corresponding image data.

As described above, image data (e.g., image pixel in image content) corresponding with a display pixel on a display panel may be indicative of target characteristics (e.g., color and/or magnitude) of light emission therefrom, for example, by indicating one or more target achromatic brightness (e.g., grayscale) levels (e.g., values) that are mapped to a light emission magnitude range associated with a panel brightness setting used to display corresponding image content on the display panel. Additionally, as described above, a display pixel may include one or more color component sub-pixels, which are each implemented and/or operated to control light emission of a specific color. For example, a display pixel may include a red sub-pixel that controls magnitude of red light emission from the display pixel, a green sub-pixel that controls magnitude of green light emission from the display pixel, a blue sub-pixel that controls magnitude of blue light emission from the display pixel, a white sub-pixel that controls magnitude of white light emission from the display pixel, or any combination thereof.

To facilitate producing light of a target color, at least in some instances, each color component sub-pixel implemented on a display panel may include a color filter cell of an appropriate target color that is disposed between a light-emissive element (e.g., OLED) and an outward-facing viewing surface of the display panel. For example, a red sub-pixel may include a red color filter cell disposed over a red organic light-emitting diode, a green sub-pixel may include a green color filter cell disposed over a green organic light-emitting diode, a blue sub-pixel may include a blue color filter cell disposed over a blue organic light-emitting diode, a white sub-pixel may include a white color filter cell disposed over a white organic light-emitting diode, or any combination thereof. Additionally, at least in some instances, an encapsulation layer, such as thin film encapsulation (TFE) layer, may be formed over the light-emissive elements, for example, to separate one or more light-emissive elements (e.g., OLEDs) from the color filter layer. Thus, at least in such instances, a light ray emitted from a light-emissive element of a color component sub-pixel may pass through the encapsulation layer and the color filter layer before exiting the outward-facing viewing surface of the display panel.

Generally, light emitted from a light source, such as an organic light-emitting diode of a color component sub-pixel, radiates outwardly from the light source, for example, in a conical shape. As such, magnitude of light emission is generally strongest along a normal axis of the light source and weakens the farther the emission angle deviates from the normal axis. Accordingly, color filter cells are often implemented such that their footprints (e.g., width, length, and/or pitch) are centered on the normal axes of corresponding light-emissive elements, for example, to facilitate maximizing perceived brightness resulting from actual light emission of the light-emissive elements when the display panel is viewed by a user's (e.g., human's) eye with a viewing angle of zero (e.g., pupil oriented perpendicular to display panel and/or along normal axis of display panel).

A human's eye generally perceives visible light due to interaction of cones (e.g., photoreceptor cells) in its retina with corresponding light rays. However, a human's eye generally has a limited field of view (FOV), which is centered on its viewing (e.g., gaze or pupil) angle. Due to its limited field of view, at least in some instances, a human's eye may perceive a first portion of light emitted from a display pixel, but not a second portion of the light emitted from the display pixel, for example, due to light rays in the second portion of the emitted light not actually reaching the eye's retina and, thus, being outside its field of view. In other words, luminance perceived by a human's eye may generally be dependent on its field of view.

However, the field of view of a human's eye may generally vary with its viewing characteristics, such as viewing (e.g., gaze or pupil) angle, viewing location (e.g., pupil offset from center and/or pupil relief), and/or viewing aperture (e.g., pupil or eye box) size. For example, orientation (e.g., direction) of the field of view of a human's eye may be dependent on its gaze (e.g., viewing or pupil) angle and, thus, a change in its gaze angle (e.g., due to eye rotation) may change orientation of its field of view. Additionally or alternatively, size (e.g., span) of the field of view of a human's eye may be dependent on its pupil (e.g., viewing aperture or eye box) size and, thus, a change in its pupil size may change the size of its field of view.

Moreover, the sensitivity of a human's eye to visible light generally varies across its field of view. In particular, a central portion (e.g., fovea) of an eye's retina is generally more sensitive to visible light compared to a peripheral (e.g., outer) portion of the eye's retina, for example, due to the central portion of the retina including more and/or denser cones while the peripheral portion includes fewer and/or less dense cones. To facilitate accounting for the variation in sensitivity to visible light, at least in some instances, the field of view of a human's eye may be divided into a focus (e.g., foveal or high resolution) region, which is centered on its viewing angle, corresponding with the central portion of the eye's retina and one or more periphery (e.g., non-foveal or low resolution) regions, which are outside the focus region, corresponding with the peripheral portion of the eye's retina.

In other words, at least in some instances, the portion of light emitted from a display pixel (e.g., color component sub-pixel) that is actually perceived by a user's (e.g., human's) eye may vary with its field of view and, thus, its viewing characteristics (e.g., angle, location, and/or aperture size) that resulted in the field of view. For example, a color component sub-pixel may appear brighter when viewed from a viewing angle of zero (e.g., pupil oriented along normal axis) and darker when viewed from a non-zero viewing angle (e.g., pupil orientation different from normal axis). In fact, due to spatial offset between color component sub-pixels implemented on a display panel, a user's eye may concurrently view multiple color component sub-pixels with different viewing angles. In other words, at least in some instances, a first color component sub-pixel may appear brighter and a second color component sub-pixel may appear darker when the display panel is viewed with a first viewing angle whereas the first color component sub-pixel may appear darker and the second color component sub-pixel may appear brighter when the display panel is viewed with a second (e.g., different) viewing angle. Since a user's eye generally perceives different colors by averaging perceived light emission from multiple color component sub-pixels, at least in some instances, variations in perceived luminance of color component sub-pixels resulting from different sets of viewing characteristics may produce a perceivable color shift in image content displayed on the display panel.

Furthermore, as described above, a display panel may include an encapsulation layer implemented between a light-emissive element, such as an organic light-emitting diode (OLED) of a color component sub-pixel, and a color filter layer and, thus, light rays emitted from the light-emissive element pass through the encapsulation layer and the color filter layer before exiting an outward-facing viewing surface of the display panel. Additionally, as described above, light emitted from a light source, such as a light-emissive element (e.g., OLED) of a color component sub-pixel, generally radiates outwardly from the light source, for example, in a conical shape. In fact, due to radiation (e.g., spread) of light rays emitted from a light-emissive element of a color component sub-pixel and the distance the light rays travel before exiting the color filter layer, at least in some instances, a portion of the light rays emitted from the light-emissive element of the color component sub-pixel may actually pass through a color filter cell of a neighboring (e.g., different colored) color component sub-pixel, thereby producing optical cross-talk. For example, a portion of light emitted from an organic light-emitting diode of a red sub-pixel may pass through a red color filter cell of the red sub-pixel while another portion of the light emitted from the organic light-emitting diode passes through a green color filter cell of a neighboring green sub-pixel.

When color filter cell footprints are centered over corresponding light-emissive elements, viewing a display panel with a viewing angle of zero generally results in the light that is emitted from the light-emissive elements and actually perceived by a user's (e.g., human's) eye passing through appropriately colored color filter cells. However, as viewing angle moves away from zero, a user's eye may end up perceiving more of the light that passes through a neighboring (e.g., inappropriately colored) color filter cell, thereby increasing perceivability of color shift resulting from optical cross-talk. In other words, different sets of viewing characteristics may affect the resulting field of view and, thus, color of light emitted from a display panel that is actually perceived by a user's eye, which, at least in some instances, may result in a perceivable color shift in image content displayed on the display panel. That is, the color shift may result in a perceived color in image content displayed on a display panel perceivably differing from a corresponding target color, which, at last in some instances, may affect perceived quality of the image content and, thus, potentially the display panel displaying the image content, an electronic display including the display panel, and/or an electronic device including the display panel.

Accordingly, to facilitate improving perceived quality, the present disclosure provides techniques for implementing and/or operating an electronic device to reduce perceivability and/or likelihood of a color shift occurring in displayed image content, for example, due to optical cross-talk between neighboring (e.g., differently colored) color component sub-pixels. In particular, the present disclosure provides techniques for implementing and/or operating the electronic device to adaptively process image data to facilitate compensating for (e.g., offsetting) color shift expected to result from optical cross-talk. Additionally, the present disclosure provides techniques for implementing (e.g., designing and/or manufacturing) a display panel of an electronic display included in and/or used by the electronic device to facilitate reducing optical cross-talk and, thus, resulting color shift.

In addition to a display panel and driver circuitry, in some embodiments, an electronic display may include a lens disposed over (e.g., overlaid on or overlapping) its display panel. In particular, in some such embodiments, the lens may be a convex-concave (e.g., meniscus) lens that focuses light emitted from the display panel, for example, to facilitate presenting virtual (e.g., virtual reality and/or augmented reality) image content. In other such embodiments, the lens may be a biconvex lens, a biconcave lens, a plano-convex lens, or a plano-concave lens. However, regardless of whether a lens is implemented in front of the display panel, optical cross-talk and, thus, perceivable color shift may occur under different viewing characteristics. In other words, the techniques described in the present disclosure may be applied to facilitate reducing optical cross-talk and, thus, resulting color shift in electronic displays that includes a lens as well as electronic displays that do not include a lens.

As described above, optical cross-talk may result due to light emitted from a light-emissive element, such as an organic light-emitting diode (OLED), of a color component sub-pixel that passes through a neighboring (e.g., inappropriately colored) color filter cell actually being perceived by a user's (e.g., human's) eye. Moreover, as described above, light emitted from a light-emissive element of a color component sub-pixel may pass through the color filter cell of a neighboring color component sub-pixel due to emitted light rays radiating (e.g., spreading) outwardly. In other words, since spread of light rays emitted from a light source generally increases as distance traveled by the light rays increases, the amount of light emitted from a light-emissive element of a color component sub-pixel that passes through the color filter cell of a neighboring color component sub-pixel may be dependent on the distance the light travels before exiting the color filter layer.

As such, to facilitate reducing color shift resulting from optical cross-talk, in some embodiments, panel implementation parameters may be adjusted to facilitate reducing the distance light rays emitted from a light-emissive element of a color component sub-pixel on a display panel travel before exiting a color filter layer of the display panel, for example, via a design and/or manufacturing process. In particular, in some such embodiments, the panel implementation parameters may be adjusted to reduce thickness (e.g., height) of an encapsulation layer formed between the light-emissive element and the color filter layer. For example, a design process may adjust current (e.g., baseline) panel implementation parameters such that thickness of the encapsulation layer is reduced from a first (e.g., baseline) thickness (e.g., two micrometers) to a second (e.g., adjusted or reduced) thickness (e.g., one micrometer).

Additionally or alternatively, panel implementation parameters may be adjusted to change the size of one or more color filter cells implemented in a color filter layer of a display panel, for example, via a design and/or manufacturing process. In particular, to facilitate reducing the distance light rays emitted from a light-emissive element of a color component sub-pixel travel before exiting the color filter layer, in some embodiments, the panel implementation parameters may be adjusted to reduce thickness (e.g., height) of one or more color filter cells implemented in the color filter layer. For example, a design process may adjust current (e.g., baseline) panel implementation parameters such that thickness of a color filter cell is reduced from a first (e.g., baseline) thickness (e.g., two micrometers) to a second (e.g., adjusted or reduced) thickness (e.g., one micrometer). In fact, in some embodiments, the panel implementation parameters may be adjusted such that thickness of the color filter cell in the color filter layer as well as thickness of the encapsulation layer are both reduced. In this manner, the panel implementation parameters used to implement a display panel may be adjusted to facilitate reducing the distance light rays emitted from a light-emissive element of a color component sub-pixel travel before exiting a color filter layer, which, at least in some instances, may facilitate reducing the amount of light that passes through a neighboring color filter cell and, thus, optical cross-talk and resulting color shift.

Moreover, to facilitate reducing color shift resulting from optical cross-talk, in some embodiments, panel implementation parameters may additionally or alternatively be adjusted to change the footprint (e.g., width, length, and/or pitch) of one or more color filter cells implemented in a color filter layer of a display panel, for example, via a design and/or manufacturing process. In particular, in some embodiments, the panel implementation parameters may be adjusted such that footprint of each color filter cell implemented in the color filter layer is uniformly changed. For example, a design process may adjust the panel implementation parameters such that pitch (e.g., width or length) of each color filter cell is increased from a baseline pitch by the same amount (e.g., one nanometer).

In some embodiments, an adjusted footprint color filter layer may nevertheless be centered on a display panel. In other words, in such embodiments, an increase in footprint of a color filter cell may result in another (e.g., neighboring) color filter cell being shifted outwardly. In fact, in some embodiments, the footprint increase and/or the positional shift resulting from the footprint increase may result in a color filter cell of a color component sub-pixel at least partially overlapping a light-emissive element (e.g., OLED) of a neighboring color component sub-pixel. For example, when footprint of each color filter cell is uniformly increased, the amount of overlap between a light-emissive element of a color component sub-pixel and a color filter cell of a neighboring color component sub-pixel may generally be lower towards the center of the display panel and increase moving away from the center of the display panel.

In other words, adjusting color filter cell footprint may change the portion of light emitted from a light-emissive element of a color component sub-pixel that passes through a color filter cell of a neighboring color component sub-pixel. However, at least in some instances, adjusting color filter cell footprint too much may actually increase perceivable color shift. For example, adjusting the panel implementation parameters to double the baseline footprint of a color filter cell in a color component sub-pixel may result in the color filter cell completely overlapping an organic light-emitting diode (OLED) of a neighboring (e.g., different colored) color component sub-pixel.

Accordingly, to facilitate improving perceived image quality, in some embodiments, a uniform adjustment to color filter cell footprint may be optimized for a focus region in the field of view (FOV) of a user's (e.g., human's) eye resulting from various sets of viewing characteristics, for example, to facilitate reducing the amount of light passing through a neighboring (e.g., inappropriately colored) color filter cell that is perceived in the focus region. However, at least in some instances, a uniform adjustment to color filter cell footprint may result in a color shift spike (e.g., non-monotonic change) in a periphery region of the field of view of a user's eye when the display panel is viewed with a non-zero viewing angle, for example, due to the non-zero viewing angle resulting in light emitted from a light-emissive element of a central color component sub-pixel that passes through a color filter cell of neighboring color component sub-pixel being perceived in the periphery region. Although some amount of color shift in a periphery region of the field of view may be acceptable, a color shift spike may generally be more perceivable than a monotonically changing color shift.

To facilitate further improving perceived image quality, in other embodiments, panel implementation parameters may be adjusted such that color filter cell footprints are non-uniformly adjusted, for example, via a design and/or manufacturing process. In other words, in some such embodiments, the footprint of different color filter cells may be adjusted from a baseline footprint by different amounts. In particular, to facilitate reducing color shift spikes resulting in a periphery region of a field of view when a display panel is viewed with a non-zero viewing angle, in some embodiments, footprint of color filter cells may gradually increase moving from the center of the display panel toward an edge (e.g., side) of the display panel. For example, a design process may adjust current (e.g., baseline) panel implementation parameters such that the color filter cell footprint of a central color component sub-pixel is maintained at the baseline footprint and color filter cell footprint of a first non-central color component is increased from the baseline footprint by a first amount. Additionally, the design process may adjust current panel implementation parameters such that the color filter cell footprint of a second non-central color component sub-pixel, which is farther from the central color component sub-pixel than the first non-central color component sub-pixel, is increased from the baseline footprint by a second amount greater than the first amount.

In other words, varying color filter cell footprint in this manner may facilitate reducing the amount of overlap between light-emissive elements (e.g., OLEDs) of central color component sub-pixels with neighboring (e.g., inappropriately colored) color filter cells while increasing the amount of overlap between light-emissive elements of outer (e.g., non-central) color component sub-pixels with neighboring color filter cells. As such, when a display panel is viewed with a non-zero viewing angle that results in a central color component sub-pixel being perceived in a periphery region of a resulting field of view, the reduced amount of overlap may facilitate reducing the amount of light emitted from a light-emissive element (e.g., OLEDs) of the central color component sub-pixel that passes through a neighboring color filter cell and is perceived in the periphery region of the field of view. However, as described above, at least in some instances, adjusting color filter cell footprint too much may actually increase color shift.

Accordingly, to facilitate improving perceived image quality, in some embodiments, a non-uniform adjustment to color filter cell footprint may be optimized for field of view (FOV) of a user's (e.g., human's) eye resulting from various sets of viewing characteristics, for example, to balance reduction in the amount of light passing through neighboring color filter cell that is perceived in a focus region of a field of view with reduction in the amount of light passing through the neighboring color filter cell (e.g., color shift spike) that is perceived in a periphery region of the field of view. In fact, in some embodiments, panel implementation parameters may be adjusted to change footprint of one or more color filter cells in a color filter layer while also reducing the distance light rays emitted from a light-emissive element of a color component sub-pixel travel before exiting the color filter layer, for example, via a design and/or manufacturing process. Merely as an illustrative example, current (e.g., baseline) panel implementation parameters may be adjusted to reduce thickness (e.g., height) of each color filter cell and/or an encapsulation layer from a baseline thickness while uniformly increasing footprint of each color filter cell from a baseline color filter cell footprint, which, at least in some instances, may facilitate reducing perceivability and/or likelihood of a color shift spike resulting in a periphery region of a field of view. Although implementing a display panel of an electronic display in this manner may facilitate reducing color shift, at least in some instances, some amount of color shift may nevertheless be perceivable in image content displayed on the display panel.

To facilitate further improving perceived image quality, in some embodiments, an electronic device may include image processing circuitry implemented and/or operated to process image data before processed (e.g., display) image data is supplied to an electronic display to display corresponding image content. For example, the image processing circuitry may include a burn-in compensation (BIC) block (e.g., circuitry group), which is implemented and/or operated to process image data to facilitate accounting for light emission variations resulting from display pixel aging (e.g., burn-in), and/or a white point compensation (WPC) block (e.g., circuitry group), which is implemented and/or operated to process image data to facilitate accounting for color variations (e.g., shifts) resulting from environmental conditions, such as temperature (e.g., in addition to backlight brightness level). Moreover, to facilitate reducing color shift resulting from optical cross-talk, the image processing circuitry may include an optical cross-talk compensation (OXTC) block (e.g., circuitry group), which is implemented and/or operated to process image data based at least in part on optical cross-talk compensation parameters.

To facilitate compensating for (e.g., offsetting) color shift resulting from optical cross-talk, in some embodiments, the optical cross-talk compensation (OXTC) parameters may include one or more optical cross-talk compensation factor maps, which each explicitly associates (e.g., maps) one or more pixel positions on a display panel to one or more optical cross-talk compensation factors (e.g., offset values and/or gain values) to be applied to image data corresponding with a display pixel at the pixel position. In fact, in some embodiments, an optical cross-talk compensation factor map may explicitly associate a pixel position with a set of multiple optical cross-talk compensation factors. For example, the optical cross-talk compensation factors associated with a pixel position may be indicated as a three-by-three matrix, which includes a red optical cross-talk compensation factor, a red-to-green optical cross-talk compensation factor, a red-to-blue optical cross-talk compensation factor, a green-to-red optical cross-talk compensation factor, a green optical cross-talk compensation factor, a green-to-blue optical cross-talk compensation factor, a blue-to-red optical cross-talk compensation factor, a blue-to-green optical cross-talk compensation factor, and a blue optical cross-talk compensation factor. Thus, when input image data associated with the pixel position is received, the optical cross-talk compensation block may apply each of the multiple optical cross-talk compensation factors to the input image data, for example, by multiplying the three-by-three matrix with a three-by-one matrix (e.g., vector) including red component input image data, green component input image data, and blue component input image data.

Moreover, in some embodiments, an optical cross-talk compensation factor map to be used by image processing circuitry of an electronic device may be stored in the electronic device, for example, in memory. In other words, in such embodiments, size of the optical cross-talk compensation factor map may affect the amount of storage capacity available in the electronic device. As such, to facilitate conserving (e.g., optimizing) storage capacity of the electronic device, in some embodiments, an optical cross-talk compensation factor map may explicitly associate each of a subset of pixel positions on a display panel with one or more corresponding optical cross-talk compensation factors. In other words, in such embodiments, one or more pixel positions on the display panel and, thus, corresponding optical cross-talk compensation factors may not be explicitly identified in the optical cross-talk compensation factor map.

When a pixel position is not explicitly identified in an optical cross-talk compensation factor map, the optical cross-talk compensation block may determine an optical cross-talk compensation factor to be applied to image data corresponding with the pixel position by interpolating optical cross-talk compensation factors associated with other pixel positions explicitly identified in the optical cross-talk compensation factor map, for example, using linear interpolation, bi-linear interpolation, spline interpolation, and/or the like. As described above, in some embodiments, a pixel position may be associated with a set of multiple optical cross-talk compensation factors. In such embodiments, when a pixel position is not explicitly identified in an optical cross-talk compensation factor map, the optical cross-talk compensation block may determine a set of optical cross-talk compensation factor to be applied to image data corresponding with the pixel position by interpolating sets of optical cross-talk compensation factors associated with other pixel positions explicitly identified in the optical cross-talk compensation factor map. For example, the optical cross-talk compensation block may determine a red optical cross-talk compensation factor to be applied to image data corresponding with the pixel position by interpolating red optical cross-talk compensation factors associated with other pixel positions explicitly identified in the optical cross-talk compensation factor map, a red-to-green optical cross-talk compensation factor to be applied to image data corresponding with the pixel position by interpolating red-to-green optical cross-talk compensation factor associated with the other pixel positions explicitly identified in the optical cross-talk compensation factor map, and so on.

However, at least in some instances, interpolation may result in some amount of error. In fact, interpolation error generally increases as interpolation distance increases. Moreover, at least in some instances, susceptibility to perceivable color shift may vary across a display panel. For example, an outer (e.g., side) portion of the display panel may be more susceptible to perceivable color shift than a central portion of the display panel due to panel implementation parameters being optimized for a viewing angle of zero (e.g., pupil oriented along normal axis of display panel). To facilitate accounting for variation in color shift susceptibility and interpolation error, in some embodiments, the pixel positions on a display panel explicitly identified in an optical cross-talk compensation factor map may be non-uniformly spaced (e.g., distributed). For example, the optical cross-talk compensation factor map may utilize a finer granularity for the outer portion of the display panel by explicitly identifying more pixel positions per area in the outer portion and utilize a coarser granularity for the central portion of the display panel by explicitly identifying fewer pixel positions per area in the central portion.

In some embodiments, a single (e.g., static) optical cross-talk compensation factor map may be calibrated to a display panel to account for multiple different sets of viewing characteristics, for example, which each includes a viewing (e.g., pupil or gaze) angle, a viewing location (e.g., pupil offset from center and/or pupil relief), and a viewing aperture (e.g., pupil or eye box) size. However, as described above, a resulting field of view and, thus, perceivability of color shift resulting from optical cross-talk generally varies when a display panel is viewed using different sets of viewing characteristics. As such, to facilitate improving efficacy of optical cross-talk compensation, in other embodiments, the optical cross-talk compensation block may include and/or have access to multiple candidate optical cross-talk compensation factor maps, which are each calibrated for a different set of viewing characteristics. In other words, in such embodiments, the optical cross-talk compensation block may select a different candidate optical cross-talk compensation factor map as a target candidate optical cross-talk compensation factor map under different sets of viewing characteristics and, thus, adaptively adjust processing of input image data.

To facilitate adaptively adjusting processing performed on image data, in some embodiments, an optical cross-talk compensation block may receive one or more viewing characteristic parameters indicative of a set of viewing characteristics with which a display panel to be used to display corresponding image content is expected to be viewed, for example, from an eye (e.g., pupil) tracking sensor (e.g., camera). In particular, in some embodiments, the viewing characteristic parameters may indicate a horizontal (e.g., x-direction) offset of pupil position from a default (e.g., forward-facing) pupil position and a vertical (e.g., y-direction) offset of pupil position from the default pupil position and, thus, may be indicative of expected viewing angle. Additionally, in some embodiments, the viewing characteristic parameters may indicate a pupil relief (e.g., distance from pupil to display panel) and, thus, may be indicative of expected viewing location. Furthermore, in some embodiments, the viewing characteristic parameters may indicate a pupil size and, thus, may be indicative of expected viewing aperture size.

In addition to an optical cross-talk compensation block, as described above, image processing circuitry implemented in an electronic device may include one or more other compensation blocks, such as a white point compensation (WPC) block and/or a burn-in compensation (BIC) block. In some embodiments, the various compensation blocks (e.g., circuitry groups) may be implemented in a hardware pipeline and, thus, serially process image data. Additionally, before processing by image processing circuitry of an electronic device, in some embodiments, image data may be stored in the electronic device, for example, in memory. Furthermore, as described above, the field of view (FOV) of a human's (e.g., user's) eye generally includes a focus region that is more sensitive to visible light and one or more periphery regions outside the focus region that are less sensitive to visible light.

Leveraging the reduced sensitivity outside the focus region, in some embodiments, image data may be stored in a foveated (e.g., compressed or grouped) domain that utilizes a pixel resolution different from (e.g., lower than) a panel (e.g., native or non-foveated) domain of a display panel to be used to display corresponding image content, for example, to facilitate conserving (e.g., optimizing) storage capacity of the electronic device. In particular, in the foveated domain, an image frame may be divided in multiple foveation regions (e.g., tiles) in which different pixel resolutions are utilized. For example, a central (e.g., first) foveation region may be identified in an image frame such that it is co-located with a focus (e.g., foveal) region of the field of view with which the image frame is expected to be viewed (e.g., visually perceived). Since the sensitivity to visible light in the focus region is higher, in some embodiments, the central foveation region may utilize a pixel resolution that matches the (e.g., full) pixel resolution of the display panel. In other words, in such embodiments, each image pixel (e.g., image data corresponding with point in image) in the central foveation region of the image frame may correspond with single display pixel (e.g., set of one or more color component sub-pixels) implemented on the display panel.

In addition to a central foveation region, in the foveated domain, one or more outer foveation regions that utilize lower pixel resolutions than the central foveation region may be identified in an image frame. In other words, in some embodiments, an outer foveation region in an image frame may be identified such that it is co-located with one or more periphery regions of the field of view with which the image frame is expected to be viewed (e.g., visually perceived). In fact, leveraging the gradual reduction in sensitivity to visible light outside the focus region, in some embodiments, multiple outer foveation regions may be identified in an image frame such that utilized pixel resolution gradually decreases moving away from the central foveation region identified in the image frame.

For example, a first one or more outer foveation regions directly adjacent the central foveation region may each utilize a pixel resolution that is half the pixel resolution of central foveation region and, thus, the display panel. In other words, in the foveated domain, each image pixel (e.g., image data corresponding with point in image) in the first one or more outer foveation regions may correspond with two display pixels (e.g., sets of one or more color component sub-pixels) implemented on the display panel. Additionally, a second one or more outer foveation regions outside of the first one or more outer foveation regions may each utilize a pixel resolution that is half the pixel resolution of the first one or more outer foveation regions and, thus, a quarter of the pixel resolution of the central foveation region and the display panel. In other words, in the foveated domain, each image pixel in the second one or more outer foveation regions may correspond with four display pixels (e.g., sets of one or more color component sub-pixels) implemented on the display panel.

To facilitate improving processing efficiency, in some embodiments, image data may be processed by image processing circuitry at least in part in the foveated domain. For example, a white point compensation (WPC) block (e.g., circuitry group) implemented in the image processing circuitry may process image data in the foveated domain to facilitate accounting for color variations (e.g., shifts) resulting from environmental conditions, such as temperature (e.g., in addition to backlight brightness level). However, the image processing circuitry may also include one or more other compensation blocks, such as a burn-in compensation (BIC) block and/or an optical cross-talk compensation (OXTC) block, that process image data to facilitate accounting for variations between different display pixels (e.g., color component sub-pixels) on a display panel and, thus, may be implemented and/or operated to process image data in a panel (e.g., native) domain of the display panel. In other words, in some embodiments, a first (e.g., upstream) portion of the image processing circuitry may be implemented and/or operated to process image data in the foveated domain while a second (e.g., downstream or different) portion of the image processing circuitry is implemented and/or operated to process image data in the panel domain.

As such, in some embodiments, image processing circuitry in an electronic device may include a domain conversion block (e.g., circuitry group) that is implemented and/or operated to convert between a foveated domain and a panel domain of a display panel used by the electronic device. In other words, the domain conversion block may convert image data between a pixel resolution used in a corresponding foveation region and the (e.g., full) pixel resolution of the display panel. For example, when the pixel resolution used in a central foveation region matches the display panel pixel resolution, image data (e.g., image pixels) corresponding with the central foveation region may pass through the domain conversion block unchanged.

On the other hand, when the pixel resolution of an outer foveation region is lower than the display panel resolution, the domain conversion block may convert image data (e.g., image pixels) corresponding with the outer foveation region from the foveated domain to the panel domain at least in part by outputting multiple instances of the image data. For example, the domain conversion block may convert image data corresponding with a first one or more outer foveation regions, which utilize a pixel resolution half the display panel resolution, to the panel domain by outputting two instances of the image data such that a first instance is associated with a first display pixel and a second instance is associated with a second display pixel. Similarly, the domain conversion block may convert image data corresponding with a second one or more outer foveation regions, which utilize a pixel resolution a quarter of the display panel resolution, to the panel domain by outputting four instances of the image data, for example, to a downstream optical cross-talk compensation (OXTC) block for further processing. In this manner, as will be described in more detail below, the techniques described in present disclosure may facilitate reducing perceivability and/or likelihood of color shift occurring in image content displayed on a display panel, which, at least in some instances, may facilitate improving perceived quality of the displayed image content and, thus, potentially the display panel, an electronic display including the display panel, and/or an electronic device that utilizes the display panel.

To help illustrate, an example of an electronic device 10, which includes and/or utilizes one or more electronic displays 12, is shown in FIG. 1. As will be described in more detail below, the electronic device 10 may be any suitable electronic device, such as a computer, a mobile (e.g., portable) phone, a portable media device, a tablet device, a television, a handheld game platform, a personal data organizer, a virtual-reality headset, a mixed-reality headset, a vehicle dashboard, and/or the like. Thus, it should be noted that FIG. 1 is merely one example of a particular implementation and is intended to illustrate the types of components that may be present in an electronic device 10.

In addition to the electronic display 12, as depicted, the electronic device 10 includes one or more input devices 14, one or more input/output (I/O) ports 16, a processor core complex 18 having one or more processors or processor cores, main memory 20, one or more storage devices 22, a network interface 24, a power supply 26, and image processing circuitry 27. The various components described in FIG. 1 may include hardware elements (e.g., circuitry), software elements (e.g., a tangible, non-transitory computer-readable medium storing instructions), or a combination of both hardware and software elements. It should be noted that the various depicted components may be combined into fewer components or separated into additional components. For example, the main memory 20 and a storage device 22 may be included in a single component. Additionally or alternatively, the image processing circuitry 27 may be included in the processor core complex 18 or the electronic display 12.

As depicted, the processor core complex 18 is operably coupled with main memory 20 and a storage device 22. As such, in some embodiments, the processor core complex 18 may execute instructions stored in main memory 20 and/or the storage device 22 to perform operations, such as generating image data in a foveated (e.g., grouped or compressed) domain. Additionally or alternatively, the processor core complex 18 may operate based on circuit connections formed therein. As such, in some embodiments, the processor core complex 18 may include one or more general purpose microprocessors, one or more application specific processors (ASICs), one or more field programmable logic arrays (FPGAs), or any combination thereof.

In addition to instructions, in some embodiments, the main memory 20 and/or the storage device 22 may store data, such as image data. Thus, in some embodiments, the main memory 20 and/or the storage device 22 may include one or more tangible, non-transitory, computer-readable media that store instructions executable by processing circuitry, such as the processor core complex 18 and/or the image processing circuitry 27, and/or data to be processed by the processing circuitry. For example, the main memory 20 may include random access memory (RAM) and the storage device 22 may include read only memory (ROM), rewritable non-volatile memory, such as flash memory, hard drives, optical discs, and/or the like.

As depicted, the processor core complex 18 is also operably coupled with the network interface 24. In some embodiments, the network interface 24 may enable the electronic device 10 to communicate with a communication network and/or another electronic device 10. For example, the network interface 24 may connect the electronic device 10 to a personal area network (PAN), such as a Bluetooth network, a local area network (LAN), such as an 802.11x Wi-Fi network, and/or a wide area network (WAN), such as a 4G or LTE cellular network. In other words, in some embodiments, the network interface 24 may enable the electronic device 10 to transmit data (e.g., image data) to a communication network and/or receive data from the communication network.

Additionally, as depicted, the processor core complex 18 is operably coupled to the power supply 26. In some embodiments, the power supply 26 may provide electrical power to operate the processor core complex 18 and/or other components in the electronic device 10, for example, via one or more power supply rails. Thus, the power supply 26 may include any suitable source of electrical power, such as a rechargeable lithium polymer (Li-poly) battery and/or an alternating current (AC) power converter.

Furthermore, as depicted, the processor core complex 18 is operably coupled with one or more I/O ports 16. In some embodiments, an I/O port 16 may enable the electronic device 10 to interface with another electronic device 10. For example, a portable storage device may be connected to an I/O port 16, thereby enabling the electronic device 10 to communicate data, such as image data, with the portable storage device.

As depicted, the processor core complex 18 is also operably coupled with one or more input devices 14. In some embodiments, an input device 14 may enable a user to interact with the electronic device 10. For example, the input devices 14 may include one or more buttons, one or more keyboards, one or more mice, one or more trackpads, and/or the like. Additionally or alternatively, the input devices 14 may include touch sensing components implemented in the electronic display 12. In such embodiments, the touch sensing components may receive user inputs by detecting occurrence and/or position of an object contacting the display surface of the electronic display 12.

In addition to enabling user inputs, the electronic display 12 may facilitate providing visual representations of information by displaying one or more images (e.g., image frames or pictures). For example, the electronic display 12 may display a graphical user interface (GUI) of an operating system, an application interface, text, a still image, or video content. To facilitate displaying images, the electronic display 12 may include one or more display pixels. Additionally, in some embodiments, each display pixel may include one or more color component sub-pixels, which each controls light emission of a specific color (e.g., red, blue, green, or white).

As described above, an electronic display 12 may display an image by controlling light emission from its display pixels based at least in part on image data associated with corresponding image pixels (e.g., points) in the image. In some embodiments, image data may be generated by an image source, such as the processor core complex 18, a graphics processing unit (GPU), and/or an image sensor. Additionally or alternatively, image data may be received from another electronic device 10, for example, via the network interface 24 and/or an I/O port 16. In any case, as described above, the electronic device 10 may be any suitable electronic device.

Figure 2:
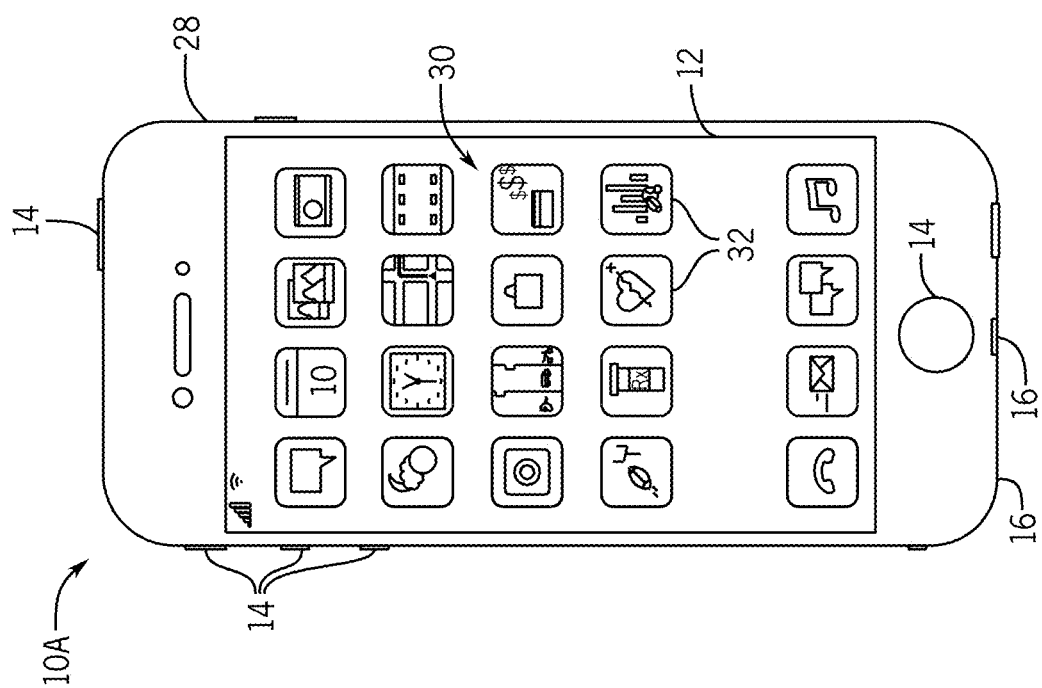
FIG. 2 is an example of the electronic device of FIG. 1, in accordance with an embodiment of the present disclosure.

To help illustrate, an example of a suitable electronic device 10, specifically a handheld device 10A, is shown in FIG. 2. In some embodiments, the handheld device 10A may be a portable phone, a media player, a personal data organizer, a handheld game platform, and/or the like. Merely for illustrative purposes, the handheld device 10A may be a smart phone, such as any iPhone® model available from Apple Inc.

As depicted, the handheld device 10A includes an enclosure 28 (e.g., housing). In some embodiments, the enclosure 28 may protect interior components from physical damage and/or shield them from electromagnetic interference. Additionally, as depicted, the enclosure 28 surrounds the electronic display 12. In the depicted embodiment, the electronic display 12 is displaying a graphical user interface (GUI) 30 having an array of icons 32. By way of example, when an icon 32 is selected either by an input device 14 or a touch sensing component of the electronic display 12, an application program may launch.

Furthermore, as depicted, input devices 14 open through the enclosure 28. As described above, the input devices 14 may enable a user to interact with the handheld device 10A. For example, the input devices 14 may enable the user to activate or deactivate the handheld device 10A, navigate a user interface to a home screen, navigate a user interface to a user-configurable application screen, activate a voice-recognition feature, provide volume control, and/or toggle between vibrate and ring modes. As depicted, the I/O ports 16 also open through the enclosure 28. In some embodiments, the I/O ports 16 may include, for example, an audio jack to connect to external devices.

Figure 3:
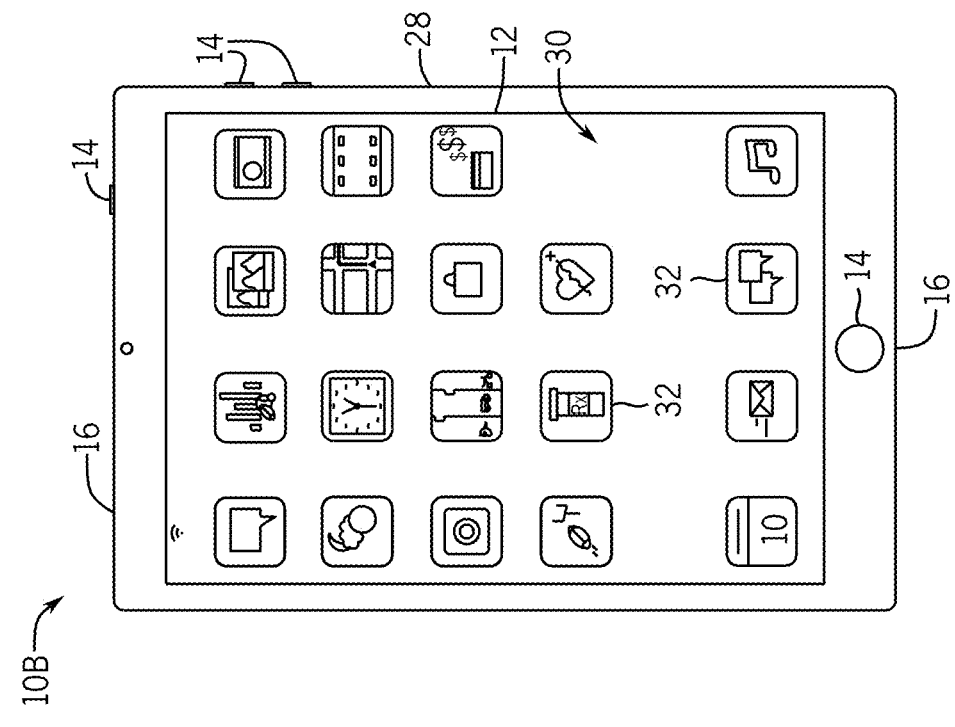
FIG. 3 is another example of the electronic device of FIG. 1, in accordance with an embodiment of the present disclosure.
Figure 4:
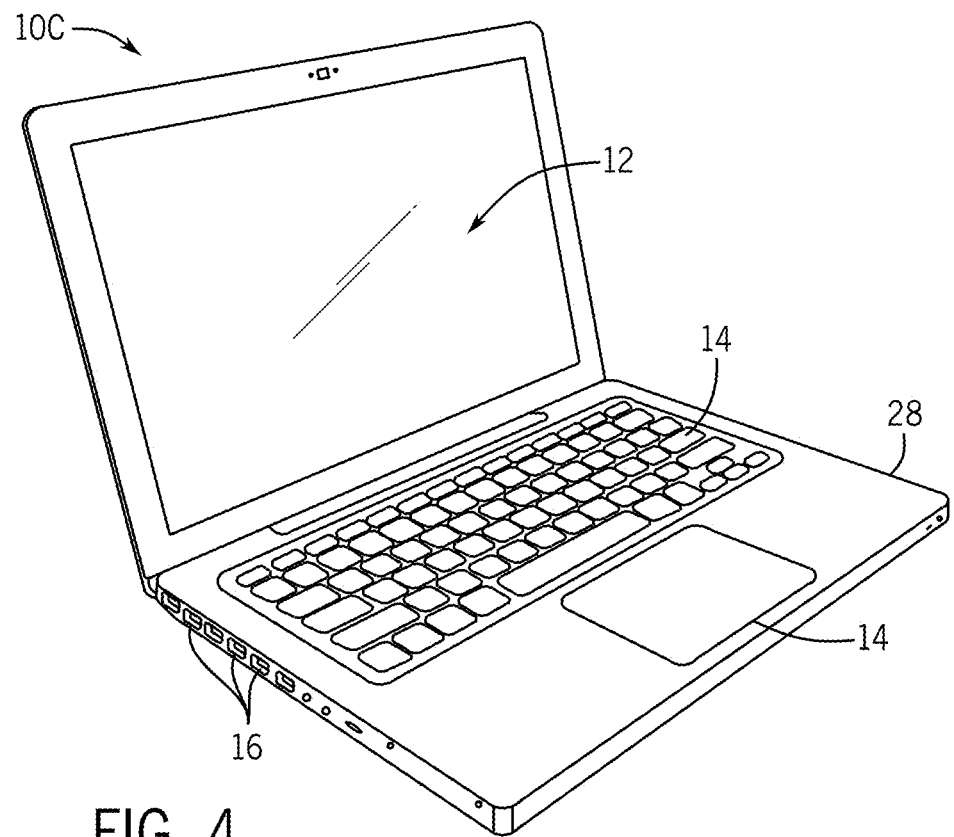
FIG. 4 is another example of the electronic device of FIG. 1, in accordance with an embodiment of the present disclosure.
Figure 5:
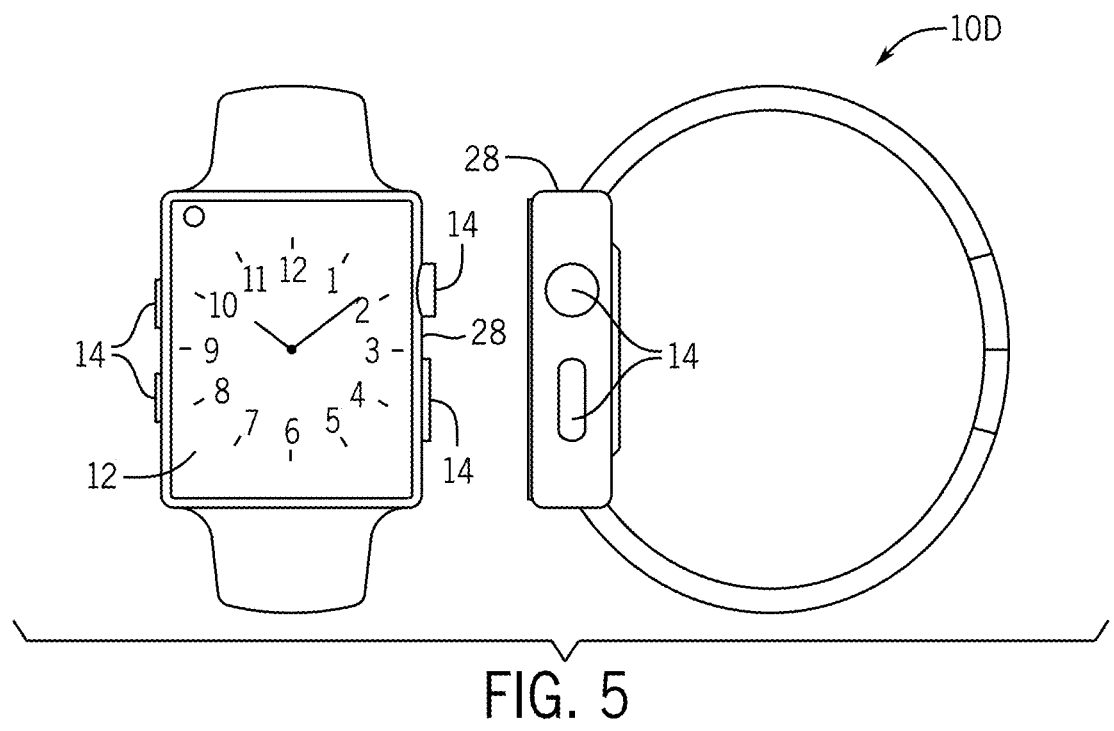
FIG. 5 is another example of the electronic device of FIG. 1, in accordance with an embodiment of the present disclosure.

To help further illustrate, another example of a suitable electronic device 10, specifically a tablet device 10B, is shown in FIG. 3. Merely for illustrative purposes, the tablet device 10B may be any iPad® model available from Apple Inc. A further example of a suitable electronic device 10, specifically a computer 10C, is shown in FIG. 4. Merely for illustrative purposes, the computer 10C may be any Macbook® or iMac® model available from Apple Inc. Another example of a suitable electronic device 10, specifically a watch 10D, is shown in FIG. 5. Merely for illustrative purposes, the watch 10D may be any Apple Watch® model available from Apple Inc. As depicted, the tablet device 10B, the computer 10C, and the watch 10D each also includes an electronic display 12, one or more input devices 14, one or more I/O ports 16, and an enclosure 28. In other embodiments, an electronic device 10 may include and/or utilize multiple electronic displays 12.

Figure 6:
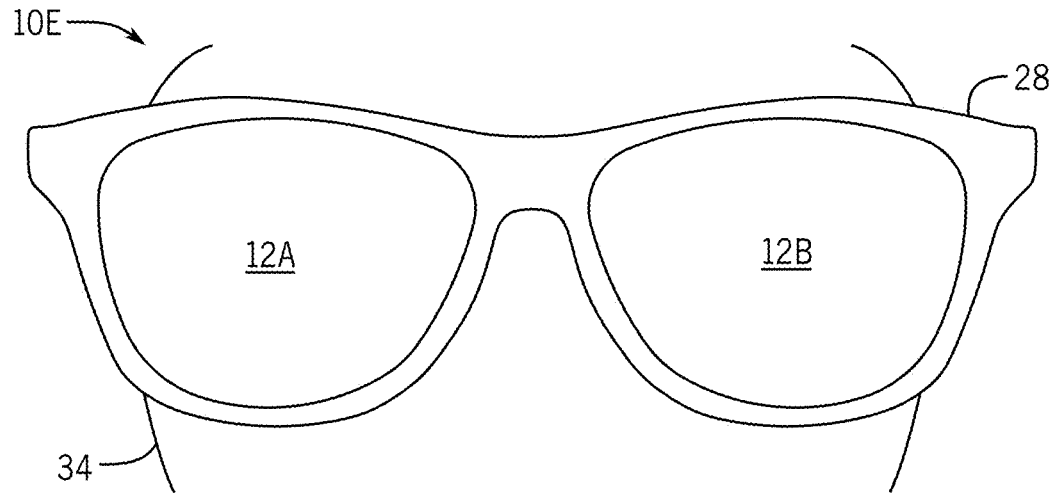
FIG. 6 is another example of the electronic device of FIG. 1, in accordance with an embodiment of the present disclosure.

To help illustrate, another example of a suitable electronic device 10, specifically a (e.g., virtual-reality and/or mixed-reality) headset 10E, is shown in FIG. 6. As depicted, the headset 10E includes a first electronic display 12A and a second electronic display 12B housed in an enclosure 28. When worn by a user (e.g., human) 34, the first electronic display 12A may be used to display image content to a first (e.g., right) eye of the user 34 and the second electronic display 12B may be used to display image content to a second (e.g., left) eye of the user 34.

However, it should be appreciated that the depicted example is merely intended to illustrative and not limiting. For example, in other embodiments, a headset 10E may include a single electronic display 12 implemented and/or operated to present image content to multiple (e.g., both) eyes of a user 34. In any case, as described above, an electronic display 12 may generally display image content by actively controlling light emission from display pixels (e.g., color component sub-pixels) implemented on its display panel. In some embodiments, an electronic display 12 may additionally include one or more lens disposed in front (e.g., over) its display panel, for example, to bend light emitted from display pixels on the display panel in a manner that facilitates presenting virtual (e.g., virtual reality and/or augmented reality) image content to a user 34.

Figure 7:
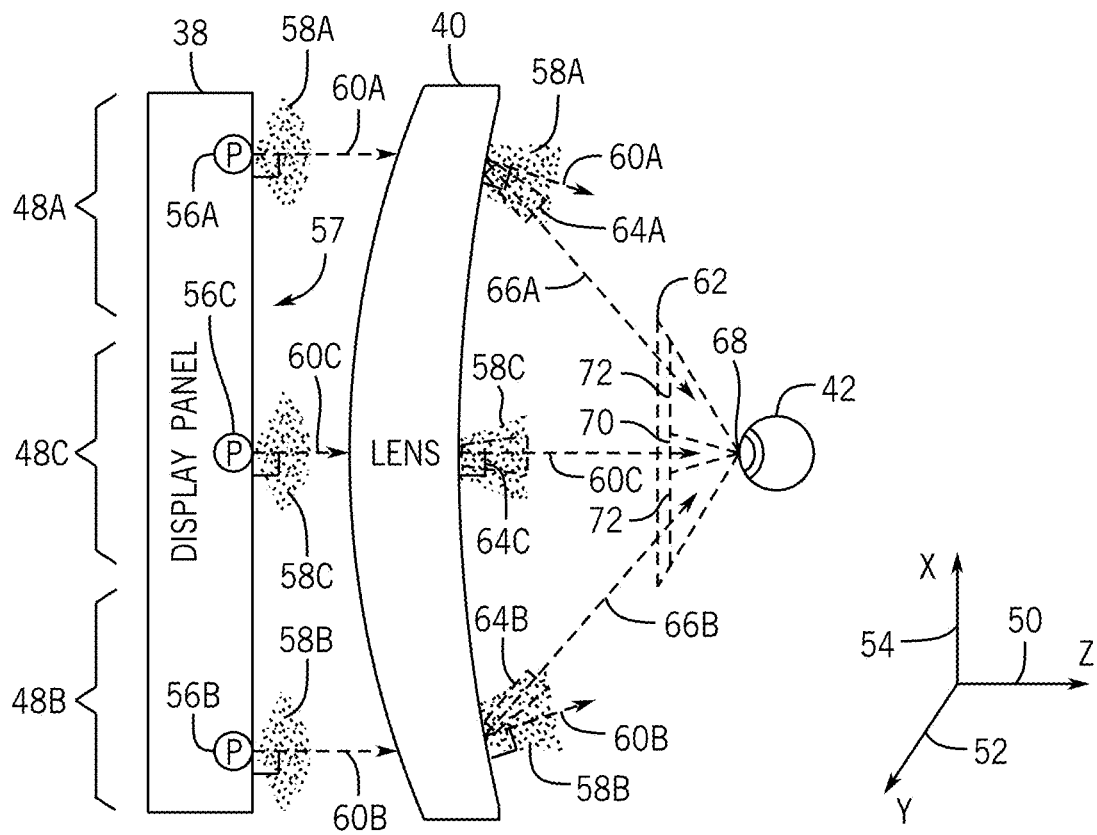
FIG. 7 is side (e.g., profile) view of an example portion of the electronic device of FIG. 1 including a display panel, in accordance with an embodiment of the present disclosure.

To help illustrate, an example of a portion 36 of an electronic display 12, which includes a display panel 38 and a lens 40, relative to an eye 42 of a user 34 is shown in FIG. 7. As in the depicted example, the lens 40 may be a convex-concave (e.g., meniscus) lens. However, it should be appreciated that the depicted example is merely intended to be illustrate and not limiting. For example, in other embodiments, the lens 40 may be a biconvex lens, a biconcave lens, a plano-convex lens, or a plano-concave lens.

As depicted, the electronic display 12 includes multiple side (e.g., off-axis) portions 48—namely a first side portion 48A and a second side portion 48B—and a central (e.g., middle and/or on-axis) portion 48C. Additionally, as in the depicted example, the lens 40 may be curved in a z-direction 50 relative to an axis in a y-direction 52 and, thus, the first side portion 48A may include a right portion of the display panel 38 and the second side portion 48B may include a left portion of the display panel 38. Additionally or alternatively, the lens 40 may be curved in the z-direction 50 relative to an axis in an x-direction 54 and, thus, the first side portion 48A may include a top portion of the display panel 38 and the second side portion 48B may include a bottom portion of the display panel 38.

As described above, to facilitate displaying image content, a display panel 38 may include multiple display pixels 56, which each include one or more color component sub-pixels. For example, as depicted, a first side (e.g., off-axis) display pixel 56A is implemented on the display panel 38 in the first side portion 48A of the electronic display 12, a second side display pixel 56B is implemented on the display panel 38 in the second side portion 48B of the electronic display 12, and a central (e.g., middle and/or on-axis) display pixel 56C is implemented on the display panel 38 in the central portion 48C of the electronic display 12. Furthermore, as depicted, each of the display pixels 56 emits light 58 centered on its normal axis 60. In particular, the first side display pixel 56A emits light 58A centered on a first normal axis 60A, the second side display pixel 56B emits light 58B centered on a second normal axis 60B, and the central display pixel 56C emits light 58C centered on a third normal axis 60C.

Moreover, as depicted, the lens 40 is disposed between a viewing surface 57 of the display panel 38 and the user's eye 42. In other words, in some embodiments, the lens 40 may be implemented in front of and/or over the viewing surface 57 of the display panel 38. Additionally, the lens 40 may be implemented (e.g., formed) using one or more light-transmissive materials, such as glass and/or plastic. Thus, as in the depicted example, light 58 emitted from display pixels 56 implemented on the display panel 38 may pass through the lens 40.

In fact, as in the depicted example, curvature of the lens 40 may bend the light 58 passing therethrough, for example, to facilitate presenting virtual (e.g., virtual reality and/or augmented reality) image content to a user 34. In particular, due to the higher degree of curvature overlapping the first side display pixel 56A and the second side display pixel 56B, the lens 40 may bend the first normal axis 60A of light 58A emitted from the first side display pixel 56A and the second normal axis 60B of light 58B emitted from the second side display pixel 56B toward the eye 42 of the user 34. On the other hand, due to the lower degree of curvature overlapping the central display pixel 56C, the lens 40 may produce less bending in light 58C emitted from the central display pixel 56C, for example, such that the third normal axis 60C of the light 58C emitted from the central display pixel 56C remains relatively unchanged and, thus, oriented toward the eye 42 of the user 34.

Generally, a human's eye 42 perceives visible light due to interaction of corresponding light rays with cones (e.g., photoreceptor cells) in its retina. However, as described above, a human's eye 42 generally has a limited field of view (FOV) 62. In other words, at least in some instances, the limited field of view 62 may result in at least a portion of light 58 emitted from a display pixel 56 on a display panel 38 not actually reaching the cones of a human's eye 42 and, thus, not being perceived by the human's eye 42.

For example, a first perceived portion 64A of light 58A emitted from the first side display pixel 56A may be in the field of view 62 of the eye 42 and, thus, perceived by the eye 42 while a remaining portion of the light 58A is not. Additionally, a second perceived portion 64B of light 58B emitted from the second side display pixel 56B may be in the field of view 62 of the eye 42 and, thus, perceived by the eye 42 while a remaining portion of the light 58B is not. Furthermore, a third perceived portion 68C of light 58C emitted from the central display pixel 56C may be in the field of view 62 of the eye 42 and, thus, perceived by the eye 42 while a remaining portion of the light 58C is not.

Merely for illustrative purposes, as depicted, the third perceived portion 64C of the light 58C emitted from the central display pixel 56C is centered on the third normal axis 60C while the first perceived portion 64A of the light 58A emitted from the first side display pixel 56A is centered on a first (e.g., non-normal) axis 66A, which deviates from the adjusted (e.g., bent) first normal axis 60A, and the second perceived portion 64B of the light 58B emitted from the second side display pixel 56B is centered on a second (e.g., non-normal) axis 66B, which deviates from the adjusted (e.g., bent) second normal axis 60B of the light 58B. As described above, magnitude of light rays (e.g., light 58) emitted from a display pixel 56 is generally strongest along its normal axis 60 and weakens as emission angle moves away from the normal axis. In other words, when the first side display pixel 56A, the second side display pixel 56B, and the central display pixel 56C each emit light 58 of the same magnitude (e.g., strength), perceived luminance resulting from the third perceived portion 64C of the light 58C emitted from the central display pixel 56C may be brighter than the perceived luminance resulting from the first perceived portion 64A of the light 58A emitted from the first side display pixel 56A and the perceived luminance resulting from the second perceived portion 64B of the light 58B emitted from the second side display pixel 56B.

However, at least in some instances, the field of view 62 of a user's (e.g., human's) eye 42 and, thus, the perceived portion of light 58 emitted from a display pixel 56 may change with viewing characteristics, such as viewing (e.g., pupil or gave) angle, viewing location (e.g., pupil relief), and/or viewing aperture (e.g., pupil or eye box) size. For example, viewing location may change due to a change in pupil relief (e.g., distance from electronic display 12) resulting from a translation (e.g., shift) of the eye 42 in the z-direction 50. Merely as an illustrative example, an increase in pupil relief may increase the first perceived portion 64A of light 58A emitted from the first side display pixel 56A that is included in the field of view 62, the second perceived portion 64B of light 58B emitted from the second side display pixel 56B that is included in the field of view 62, and/or the third perceived portion 64C of light 58C emitted from the central display pixel 56C that is included in the field of view 62.

Additionally or alternatively, viewing location may change due to a translation (e.g., shift) of the eye 42 in the x-direction 54 and/or the y-direction 52. For example, translating the eye 42 in the x-direction 54 toward the first side display pixel 56A and away from the second side display pixel 56B may increase the first perceived portion 64A of light 58A emitted from the first side display pixel 56A that is included in the field of view 62 while reducing the second perceived portion 64B of light 58B emitted from the second side display pixel 56B that is included in the field of view 62. Conversely, translating the eye 42 in the x-direction 54 toward the second side display pixel 56B and away from the first side display pixel 56A may increase the second perceived portion 64B of the light 58A emitted from the second side display pixel 56B that is included in the field of view 62 while reducing the first perceived portion 64A of the light 58A emitted from the first side display pixel 56A that is included in the field of view 62.

Furthermore, viewing characteristics may additionally or alternatively change due to a change in viewing (e.g., pupil or gaze) angle resulting from rotation of the user's eye 42. In particular, rotation of the user's eye 42 may result in its pupil 68 and, thus, resulting field of view 62 rotating. For example, rotating the pupil 68 from the default (e.g., forward-facing) pupil position shown in FIG. 7 toward the first side display pixel 56A may result in the field of view 62 rotating toward the first side display pixel 56A, which, at least in some instances, may increase the first perceived portion 64A of light 58A emitted from the first side display pixel 56A that is included in the field of view 62 while reducing the second perceived portion 64B of light 58B emitted from the second side display pixel 56B that is included in the field of view 62. Conversely, rotating the pupil 68 from the default pupil position shown in FIG. 7 toward the second side display pixel 56B may result in the field of view 62 rotating toward the second side display pixel 56B, which, at least in some instances, may increase the second perceived portion 64B of light 58B emitted from the second side display pixel 56B that is included in the field of view 62 while reducing the first perceived portion 64A of light 58A emitted from the first side display pixel 56A that is included in the field of view 62.

Moreover, viewing characteristics may additionally or alternatively change due to a change in viewing aperture (e.g., pupil or eye box) size resulting from contraction or dilation of the pupil 68 of a user's eye 42. In particular, contraction of the eye's pupil 68 may reduce the amount of visible light that reaches cones in the user's eye 42 and, thus, size (e.g., span) of the eye's field of view. Conversely, dilation of the eye's pupil may increase the amount of visible light that reaches cones in the user's eye 42 and, thus, size of the eye's field of view.

Figure 8A:
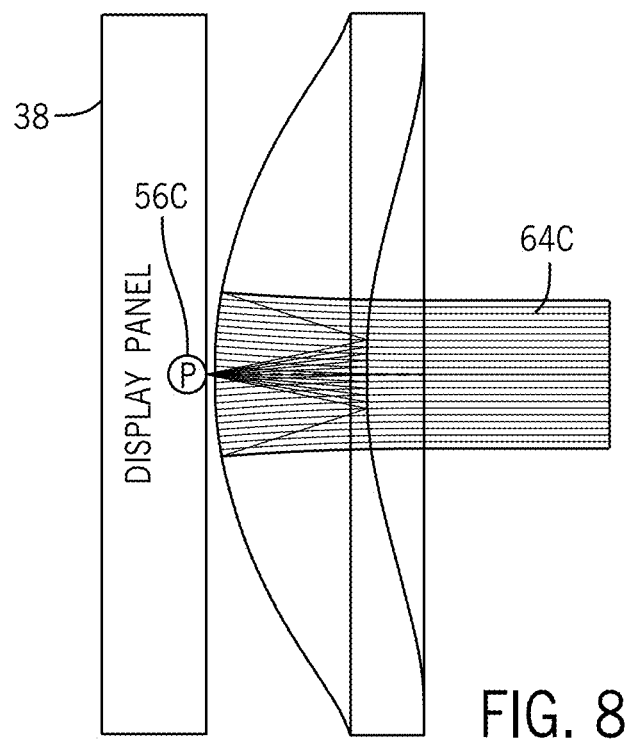
FIG. 8A is a diagrammatic representation of a perceived portion of light emitted from a display pixel on the display panel of FIG. 7 that results from a first set of viewing characteristics, in accordance with an embodiment of the present disclosure.
Figure 8B:
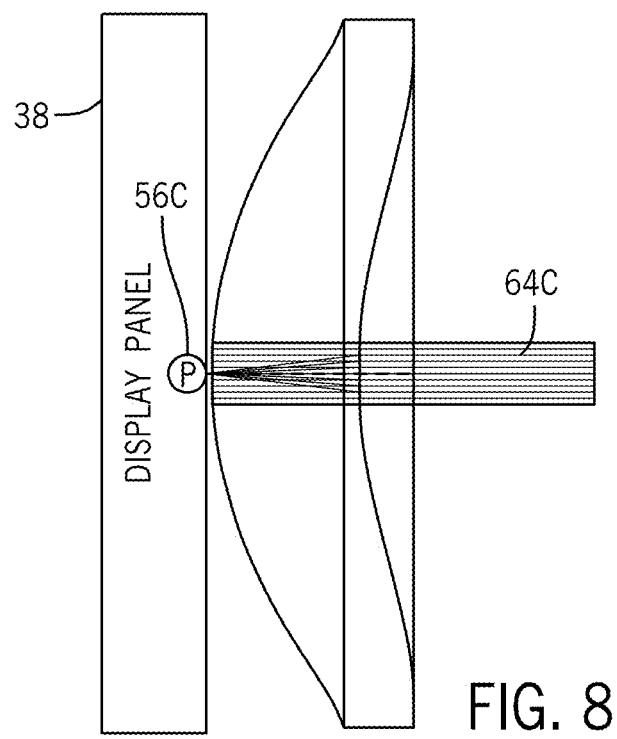
FIG. 8B is a diagrammatic representation of a perceived portion of light emitted from the display pixel on the display panel resulting from a second (e.g., different) set of viewing characteristics, in accordance with an embodiment of the present disclosure.

To help further illustrate, examples of a perceived portion 64 of light 58 emitted from a display pixel 56 on a display panel 38 under different sets of viewing characteristics are shown in FIGS. 8A and 8B. In particular, FIG. 8A depicts the perceived portion 64C of light 58C emitted a central display pixel 56C under a first set of viewing characteristics. On the other hand, FIG. 8B depicts the perceived portion 64C of light emitted from the central display pixel 56C under a second (e.g., different) set of viewing characteristics.

As depicted, the perceived portion 64C in FIG. 8A is larger than the perceived portion 64C in FIG. 8B. In other words, the first set of viewing characteristics result in more of the light 58C emitted from the central display 56C being perceived by a user's (e.g., human's) eye 42 and, thus, appearing brighter. On the other hand, the second set of viewing characteristics result in less of the light 58C emitted from the central display 56C being perceived by the user's eye 42 and, thus, appearing darker.

As described above, the perceived portion 64 of light 58 emitted from a display pixel 56 may vary under different viewing characteristics, such as different viewing (e.g., gaze or pupil) angles, different viewing locations (e.g., pupil offset and/or pupil relief), and/or different viewing aperture (e.g., pupil or eye box) size. For example, the perceived portion 64C of FIG. 8A may result due to the first set of viewing characteristics including a viewing angle of zero whereas the perceived portion 64C of FIG. 8B may result due to the second set of viewing characteristics including a non-zero viewing angle. Additionally or alternatively, the perceived portion 64C of FIG. 8A may result due to the first set of viewing characteristics including a larger viewing aperture size whereas the perceived portion 64C of FIG. 8B may result due to the second set of viewing characteristics including a smaller viewing aperture size.

Moreover, as described above, sensitivity to visible light generally varies across the retina of a human's eye 42. For example, a central portion (e.g., fovea) of the retina may include more and/or denser cones (e.g., photoreceptor cells) and, thus, have a greater sensitivity to visible light. On the other hand, an outer portion of the retina may include fewer and/or less dense cones and, thus, have lower sensitivity to visible light.

To facilitate accounting for the variation in sensitivity to visible light, returning to FIG. 7, the field of view 62 of the user's eye 42 may be divided into a focus region 70 and one or more periphery regions 72. In particular, the focus region 70 may correspond with the central portion of the eye's retina (e.g., fovea). On the other hand, the one or more periphery regions 72 may correspond with a peripheral (e.g., outer) portion of the eye's retina.

In other words, a change in viewing characteristics may change the perceived portion 64 of light 58 emitted from a display pixel 56 that is included in a field of view 62 of a user's eye 42 as well as whether the perceived portion 64 is in a focus region 70 of the field of view 62 or a periphery region 72 of the field of view 62. That is, at least in some instances, light 58 emitted from display pixels 56 implemented on a display panel 38 may result in varying perceived luminances under different viewing characteristics, such as different viewing angles, different viewing locations, and/or different viewing aperture sizes. In fact, at least in some instances, variations in perceived luminance may result in a perceivable visual artifact, such as a color shift, occurring in image content displayed on the display panel 38, for example, due to display pixel 56 on the display panel 38 including component sub-pixels that each control light emission of a specific color and a human's eye 42 generally averaging light emission from multiple color component sub-pixels to perceive different colors.

Figure 9:
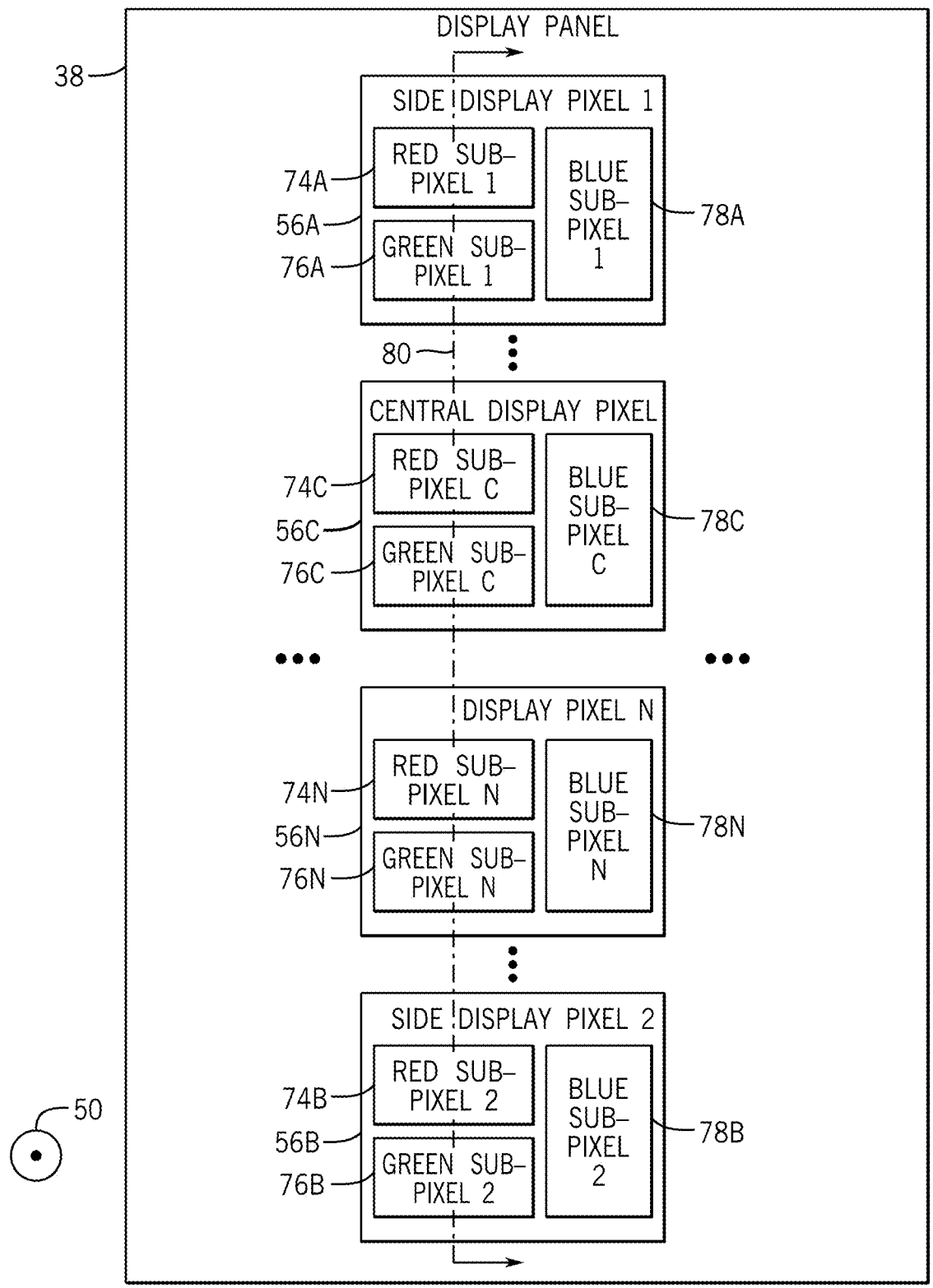
FIG. 9 is a top view of an example of a display panel used by the electronic device of FIG. 1, in accordance with an embodiment of the present disclosure.

To help illustrate, an example of a portion of a display panel 38 including multiple display pixels 56 is shown in FIG. 9. As depicted, the display panel 38 includes a first side display pixel 56A, a second side display pixel 56B, a central display pixel 56C, and an Nth display pixel 56N, which directly neighbors the central display pixel 56C. Additionally, as depicted, each display pixel 56 includes multiple color component sub-pixels—namely a red sub-pixel 74, a green sub-pixel 76, and a blue sub-pixel 78.

In particular, as depicted, the first side display pixel 56A includes a first side red sub-pixel 74A, a first side green sub-pixel 76A, and a first side blue sub-pixel 78A while the second side display pixel 56B includes a second side red sub-pixel 74B, a second side green sub-pixel 76B, and a second side blue sub-pixel 78B. Additionally, as depicted, the central display pixel 56C include a central red sub-pixel 74C, a central green sub-pixel 76C, and a central blue sub-pixel 78C. Furthermore, as depicted, the Nth display pixel 56N includes an Nth red sub-pixel 74N, an Nth green sub-pixel 76N, and an Nth blue sub-pixel 78N.

However, it should be appreciated that the depicted example is merely intended to be illustrative and not limiting. For example, in other embodiments, a display panel 38 may include a first set (e.g., half) of display pixels 56, which each include a red sub-pixel and a green sub-pixel, and a second set (e.g., half) of display pixels 56, which each includes a blue sub-pixel and a green sub-pixel. In some embodiments, one or more display pixel 56 implemented on a display panel 38 may additionally or alternatively include a white sub-pixel. In any case, to facilitate emitting light of a target color, in some embodiments, a color component sub-pixel on a display panel 38 may include a color filter cell that matches the target color, for example, implemented between a light-emissive element (e.g., OLED) of the color component sub-pixel and a viewing surface 57 of the display panel 38.

Figure 10:
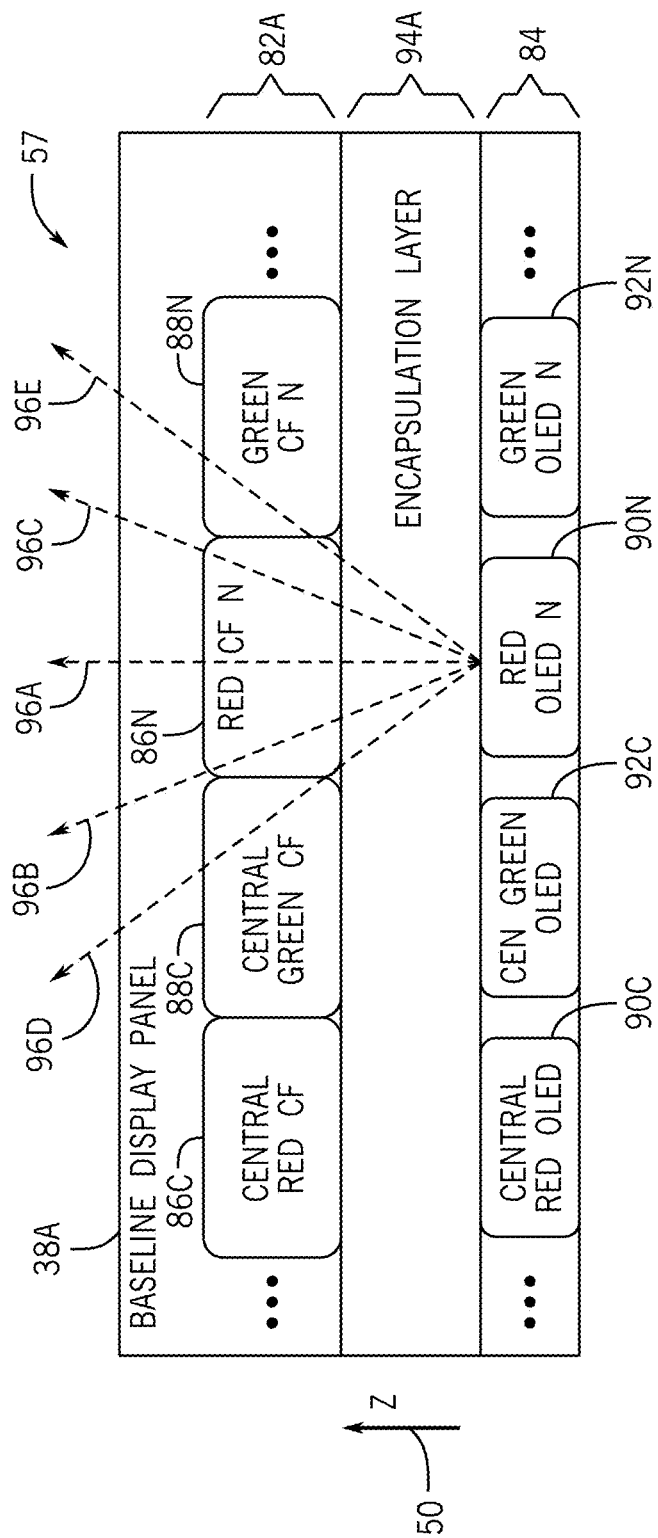
FIG. 10 is a cross-sectional view of an example baseline display panel, in accordance with an embodiment of the present disclosure.

To help illustrate, an example of a portion of a baseline display panel 38A, which is viewed along the cross-sectional line 80 of FIG. 9, is shown in FIG. 10. As depicted, the baseline display panel 38A includes a color filter layer 82—namely a baseline color filter layer 82A implemented with a baseline color filter cell thickness—and a light-emissive element (e.g., OLED) layer 84. In particular, the baseline color filter layer 82A includes a central red color filter cell 86C of a central red sub-pixel 74C, a central green color filter cell 88C of a central green sub-pixel 76C, an Nth red color filter cell 86N of an Nth red sub-pixel 74N, and an Nth green color filter cell 88N of an Nth green sub-pixel 76N. Additionally, the light-emissive element layer 84 includes a central red organic light-emitting diode (OLED) 90C of the central red sub-pixel 74C, a central green organic light-emitting diode 92C of the central green sub-pixel 76C, an Nth red organic light-emitting diode 90N of the Nth red sub-pixel 74N, and an Nth green organic light-emitting diode 92N of the Nth green sub-pixel 76N.

Furthermore, as depicted, the baseline display panel 38A includes an encapsulation layer 94—namely a baseline encapsulation layer 94A—implemented between the baseline color filter layer 82A and the light-emissive element layer 84. In some embodiments, the encapsulation layer 94 may be a thin film encapsulation (TFE) layer. Additionally, in some embodiments, the encapsulation layer 94 may be implemented using one or more light-transmissive materials deposited over the light-emissive element layer 84. For example, the baseline encapsulation layer 94A may be deposited over the light-emissive element layer 84 with a baseline encapsulation thickness (e.g., height). Thus, as in the depicted example, light rays 96 output (e.g., emitted) from the light-emissive element layer 84 may pass through the baseline encapsulation layer 84A and the baseline color filter layer 82A before exiting a viewing surface 57 of the baseline display panel 38A.

Moreover, in the baseline display panel 38A, the footprint of each color filter cell may be centered on a corresponding light-emissive element (e.g., OLED). In other words, in the baseline display panel 38A, each color filter cell in the baseline color filter layer 82A may have a default color filter cell footprint (e.g., length, width, and/or pitch) that is centered on a normal axis of a corresponding light-emissive element. For example, the footprint of the Nth red color filter cell 86N may be centered on the normal axis of the Nth red organic light-emitting diode 90N and, thus, a first light ray 96A emitted along the normal axis may pass through the baseline encapsulation layer 94A and the Nth red color filter cell 86N before exiting the viewing surface 57 of the baseline display panel 38A.

Additionally, as depicted, a second light ray 96B and a third light ray 96C, which are emitted from the Nth red organic light-emitting diode 90N with emission angles that deviate from the normal axis of the Nth red organic light-emitting diode 90N, may also pass through the baseline encapsulation layer 94A and the Nth red color filter cell 86N before exiting the viewing surface 57 of the baseline display panel 38A. However, as depicted, a fourth light ray 96D emitted from the Nth red organic light-emitting diode 90N with an emission angle that deviates from the normal axis of the Nth red organic light-emitting diode 90N by more than the emission angle of the second light ray 96B may actually pass through the central green color filter cell 88C before exiting the viewing surface 57 of the baseline display panel 38A. Additionally, as depicted, a fifth light ray 96E emitted from the Nth red organic light-emitting diode 90N with an emission angle that deviates from the normal axis of the Nth red organic light-emitting diode 90N by more than the emission angle of the third light ray 96C may actually pass through the Nth green color filter cell 88N before exiting the viewing surface 57 of the baseline display panel 38A.

In other words, optical cross-talk may result in the baseline display panel 38A due to light emitted from a light-emissive element (e.g., OLED) of a color component sub-pixel passing through a color filter cell of a neighboring (e.g., differently colored) color component sub-pixel. That is, although a portion of light emitted from a light-emissive element passes through a corresponding (e.g., appropriately colored) color filter cell, optical cross-talk may nevertheless result due to another portion of the light emitted from the light-emissive element passing through a neighboring (e.g., inappropriately colored) color filter cell before exiting the viewing surface 57 of the baseline display panel 38A. When light passing through a neighboring color filter cell is within the field of view 62 of a user's eye 42, the optical cross-talk may result in a perceivable color shift in image content displayed on the baseline display panel 38A.

Moreover, as described above, the field of view 62 of a user's eye 42 generally varies with viewing characteristics, such as viewing angle and/or viewing location, used to view a display panel 38 and, thus, image content displayed on the display panel 38. In particular, as described above, a change in the field of view 62 may change the perceived portion 64 of light 58 emitted from a display pixel 56. For example, a first field of view 62 may result in the first light ray 96A, which passes through the Nth red (e.g., appropriately colored) color filter cell 86N, being perceived by the user's eye 42. On the other hand, a second (e.g., different) field of view 62 may result in the fifth light ray 96, which passes through the Nth green (e.g., inappropriately colored) color filter cell 88N, being perceived by the user's eye 42 and, thus, potentially increase perceivable color shift resulting from optical cross-talk compared to the first field of view 62. In other words, at least in some instances, perceivability of color shift resulting from optical cross-talk may vary with viewing characteristics used to view image content displayed on a display panel 38.

Figure 11:
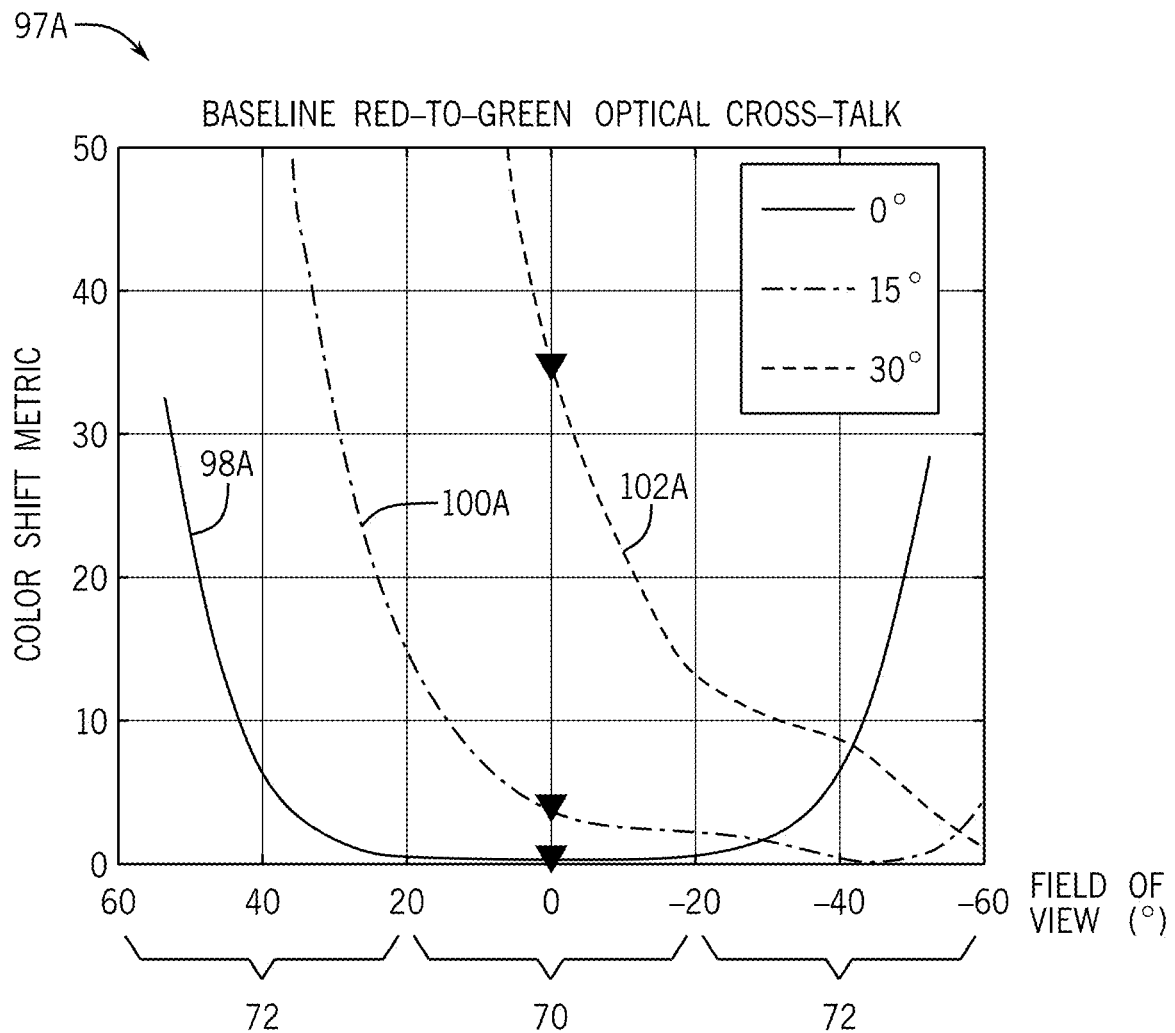
FIG. 11 is a plot illustrating color shift resulting from the baseline display panel of FIG. 10 when viewed from various viewing angles, in accordance with an embodiment of the present disclosure.

To help illustrate, an example plot 97A, which describes perceivability of color shift resulting across a (e.g., apparent and/or local) field of view of a user's eye 42 when the baseline display panel 38A of FIG. 10 is viewed using different sets of viewing characteristics, is shown in FIG. 11. In particular, the plot 97A includes a first curve 98A, which describes color shift perceivability resulting from a first set of viewing characteristics that includes a viewing angle of zero degrees, a second curve 100A, which describes color shift perceivability resulting from a second set of viewing characteristics that includes a viewing angle of fifteen degrees, and a third curve 102A, which describes color shift perceivability resulting from a third set of viewing characteristics that includes a viewing angle of thirty degrees. In other words, merely for illustrative purposes, the first set of viewing characteristics, the second set of viewing characteristics, and the third set of viewing characteristics each include the same viewing location.

Nevertheless, as depicted, the different viewing angles result in different color shift profiles. For example, as described by the first curve 98A, minimal (e.g., no) color shift results in a focus region 70 of the field of view 62 when the baseline display panel 38A is viewed with a viewing angle of zero degrees (e.g., first set of viewing characteristics). However, as described by the first curve 98A, color shift increases in periphery regions 72 of the field of view 62.

As described above, a focus region 70 in a field of view 62 generally corresponds to a central portion of an eye's retina, which is more sensitive to visible light, while a periphery region 72 in the field of view 62 generally corresponds to an outer portion of the eye's retina, which is less sensitive to visible light. In other words, perceivability of color shift occurring in the focus region 70 may be greater than color shift in a periphery region 72 and, thus, more color shift may be acceptable in the periphery region 72. However, as described by the second curve 100A, color shift resulting in the focus region 70 of the field of view 62 increases when the baseline display panel 38A is viewed with a viewing angle of fifteen degrees (e.g., second set of viewing characteristics). Moreover, as described by the third curve 102A, color shift resulting in the focus region 70 of the field of view 62 may further increase when the baseline display panel 38A is viewed with a viewing angle of thirty degrees (e.g., third set of viewing characteristics).

As described above, optical cross-talk may produce a perceivable color shift in displayed image content due to light emitted from a light-emissive element (e.g., OLED) of a color component sub-pixel that passes through a neighboring (e.g., inappropriately colored) color filter cell actually being perceived by a user's eye 42. In other words, perceivability and/or likelihood of color shift occurring in displayed image content may be reduced at least in part by reducing the amount of light that passes through neighboring (e.g., inappropriately colored) color filter cells and is actually being perceived by the user's eye 42. In fact, in some embodiments, one or more panel implementation parameters used to implement (e.g., manufacture) a display panel 38 may be adjusted to facilitate reducing perceivability and/or likelihood of color shift occurring in displayed image content, for example, via a design (e.g., manufacturing) process.

Figure 12:
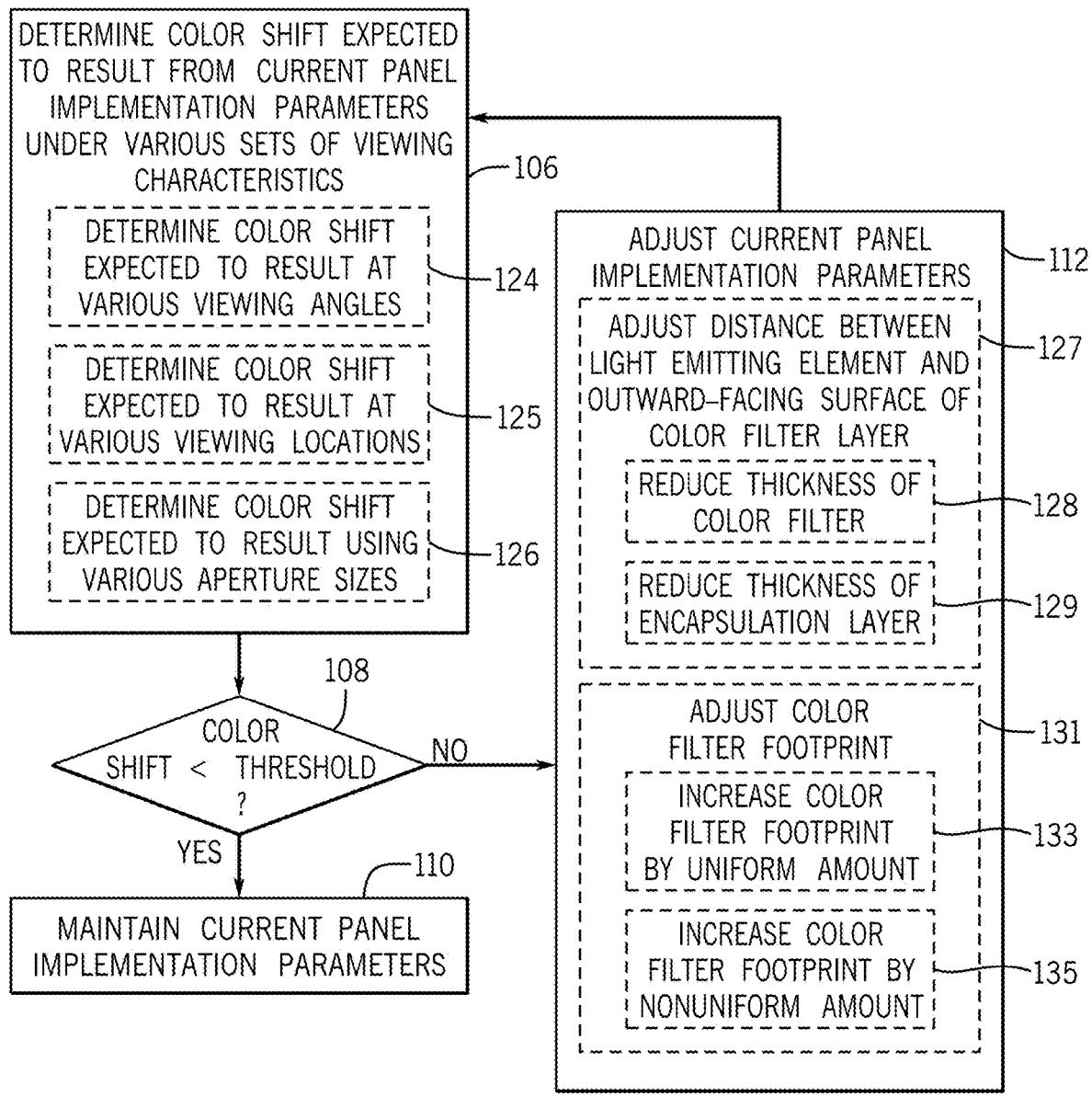
FIG. 12 is a flow diagram of an example process for designing (e.g., tuning and/or calibrating) panel implementation parameters, in accordance with an embodiment of the present disclosure.

To help illustrate, an example of a process 104 for designing (e.g., manufacturing, calibrating, and/or tuning) a display panel 38 is described in FIG. 12. Generally, the design process 104 includes determining color shift expected to result from current panel implementation parameters under various sets of viewing parameters (process block 106) and determining whether the expected color shift is less than a color shift threshold (decision block 108). Additionally, the design process 104 includes maintaining the current panel implementation parameters when the expected color shift is less than the color shift threshold (process block 110) and adjusting the current panel implementation parameters when the expected color shift is not less than the color shift threshold (process block 112).

Although described in a particular order, which represents a particular embodiment, it should be noted that the design process 104 may be performed in any suitable order. Additionally, embodiments of the design process 104 may omit process blocks and/or include additional process blocks. Moreover, in some embodiments, the design process 104 may be performed at least in part by a design system (e.g., one or more devices). In other words, at least in some such embodiments, the design process 104 may be implemented at least in part by executing instructions stored in a tangible, non-transitory, computer-readable medium, such as design memory implemented in the design system, using processing circuitry, such as a design processor implemented in the design system.

Figure 13:
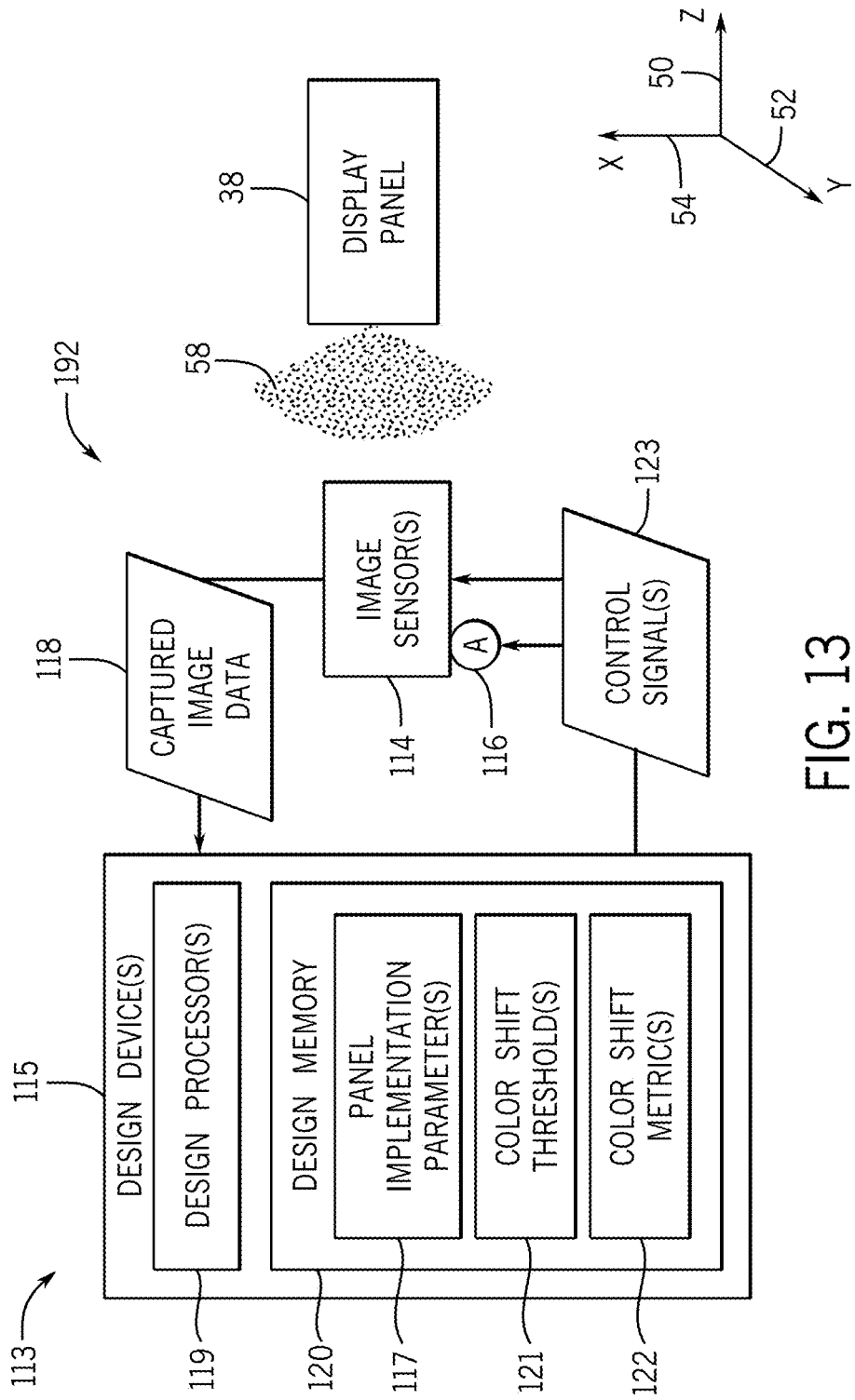
FIG. 13 is a block diagram of an example of a design system that facilitates designing one or more panel implementation parameters of a display panel, in accordance with an embodiment of the present disclosure.

To help illustrate, an example of a design (e.g., manufacturing and/or calibration) system 113, which may operate to facilitate designing (e.g., determining and/or adjusting) panel implementation parameters of a display panel 38, is shown in FIG. 13. As in the depicted example, the design system 113 may include one or more image sensors 114, such as one or more cameras, one or more design (e.g., computing) devices 115, and one or more actuators 116, such as one or more electrical motors. However, it should be appreciated that the depicted example is merely intended to be illustrative and not limiting. In particular, in other embodiments, a design system 113 may not include an actuator 116, for example, when the viewing characteristics of an image sensor 114 is manually adjusted.

As will be described in more detail below, the one or more design devices 115 may design one or more panel implementation parameters 117 based at least in part on captured image data 118 output from an image sensor 114. To facilitate designing panel implementation parameters 117, as in the depicted example, a design device 115 may include one or more design processors 119 and calibration memory 120. In particular, in some embodiments, the design memory 120 may be included in a tangible, non-transitory, computer-readable medium implemented and/or operated to store instructions, data, or both. Additionally, in some embodiments, the design processor 119 may include processing circuitry that executes instructions and/or processes data stored in the design memory 120.

For example, the design memory 120 may store one or more current (e.g., baseline) panel implementation parameters 117 and/or one or more adjusted panel implementation parameters 117. Additionally, as in the depicted example, the design memory 120 may store one or more color shift thresholds 121, which may be used to determine whether to adjust a current panel implementation parameter 117. Furthermore, in some embodiments, the design processor 119 may output one or more control signals 123, for example, to instruct an actuator 116 to adjust one or more viewing characteristics of an image sensor 114 and/or to instruct the image sensor 114 to capture a picture.

In some embodiments, an image sensor 114, such as a camera, may capture a picture by generating captured image data 118 that indicates visual characteristics, such as color and/or achromatic brightness (e.g., grayscale) level, of light 58 sensed (e.g., measured) at one or more pixel positions on the display panel 38. For example, the captured image data 118 corresponding with a pixel position may include captured red component image data 118 that indicates brightness level of red light sensed at the pixel position, captured blue component image data 118 that indicates brightness level of blue light sensed at the pixel position, captured green component image data 118 that indicates brightness level of green light sensed at the pixel position, captured white component image data 118 that indicates brightness level of white light sensed at the pixel position, or any combination thereof. In other words, captured image data 118 corresponding with a picture of image content being displayed on a display panel 38 may be indicative of luminance that would actually be perceived by a user's eye 42 and, thus, used to determine one or more color shift metrics 122 indicative of color shift that would actually be perceived by the user's eye 42.

As such, returning to the design process 104 of FIG. 12, in some embodiments, a design system 113 may determine color shift expected to result in image content displayed on a display panel 38, which is implemented using current panel implementation parameters, under various sets of viewing characteristics based at least in part on corresponding captured image data 118, for example, received from an image sensor 114 (process block 106). In particular, in some embodiments, the design system 113 may determine a color shift metric 122 indicative of color shift expected to occur at a pixel position on the display panel 38 under a set of viewing characteristics based at least in part on deviation of a sensed brightness level indicated in captured image data 118, which is captured using the set of viewing characteristics, from a corresponding target brightness level. For example, the design system 113 may determine a color shift metric 122 associated with a pixel position based at least in part on deviation of sensed red light brightness level indicated in captured red component image data 118 from a target red light brightness level corresponding with the pixel position, deviation of sensed green light brightness level indicated in captured green component image data 118 from a target green light brightness level corresponding with the pixel position, deviation of sensed blue light brightness level indicated in captured blue component image data 118 from a target blue light brightness level corresponding with the pixel position, deviation of sensed white light brightness level indicated in captured white component image data 118 from a target white light brightness level corresponding with the pixel position, or any combination thereof.

Additionally, for each set of viewing characteristics, in some embodiments, the design system 113 may determine a color shift profile that includes color shift metrics 122 corresponding with multiple pixel positions on the display panel 38, for example, similar to the plot 97A of FIG. 11. Furthermore, as described above, a set of viewing characteristics may include a viewing (e.g., pupil or gaze) angle, a viewing location (e.g., pupil offset or pupil relief), a view aperture (e.g., pupil or eye box) size. Thus, in some embodiments, the design system 113 may determine color shift expected to result when the display panel 38 is viewed with various different viewing angles (process block 124). Additionally or alternatively, the design system 113 may determine color shift expected to result when the display panel 38 is viewed from various different viewing locations (process block 125). Furthermore, the design system 113 may determine color shift expected to result when the display panel 38 is viewed using various aperture sizes (process block 126).

To facilitate determining color shift metrics 122 resulting from different sets of viewing characteristics, as described above, in some embodiments, a design device 115 in the design system 113 may output one or more control signals 123 that instruct an actuator 116 to adjust one or more viewing characteristics of the image sensor 114. For example, the design device 115 may instruct the actuator 116 to translate the image sensor 114 in a z-direction 50, an x-direction 54, and/or a y-direction 52 to adjust viewing location of the image sensor 114. Additionally or alternatively, the design device 115 may instruct the actuator 116 to rotate the image sensor 114 in the x-direction 54 and/or the y-direction 52 to adjust viewing angle of the image sensor 114. Furthermore, the design device 115 may additionally or alternatively instruct the actuator 116 to adjust shutter size and/or shutter speed to adjust aperture size of the image sensor 114. In other embodiments, one or more viewing characteristics of the image sensor 114 may be manually adjusted.

The design system 113 may then determine whether the expected color shift is less than a color shift threshold 121 (process block 108). In some embodiments, the color shift threshold may be predetermined and stored in a tangible, non-transitory, computer-readable medium of the design system 113. Thus, in such embodiments, the design system 113 may determine the color shift threshold 121 at least in part by retrieving the color shift threshold from the tangible, non-transitory, computer-readable medium.

In fact, in some embodiments, the design system 113 may evaluate the expected color shift using multiple different color shift thresholds 121. For example, the design system 113 may evaluate color shift expected to result in a focus region 70 of the field of view 62 using a first (e.g., lower) color shift threshold. On the other hand, the design system 113 may evaluate color shift expected to result in a periphery region 72 of the field of view 62 using a second (e.g., higher) color shift threshold. In other words, utilizing multiple different color shift thresholds may enable the design system 113 to vary acceptable color shift in different regions of the field of view 62, for example, in coordination with variation in light sensitivity across the retina of a user's eye 42.

When the expected color shift is less than the color shift threshold, the design system 113 may maintain the current panel implementation parameters (process block 110). In some embodiments, the panel implementation parameters may govern size (e.g., thickness) of a color filter layer 82, size (e.g., thickness) of an encapsulation layer 94 disposed between the color filter layer 82 and a light-emissive element (e.g., OLED) layer 84, and/or size (e.g., thickness and/or footprint) of one or more color filter cells included in the color filter layer 82. As described above, light rays 96 emitted from the light-emissive element layer 84 may pass through the encapsulation layer 94 and the color filter layer 82 before exiting a (e.g., forward-facing) viewing surface 57 of a display panel 38. Additionally, as described above, perceivable color shift may occur due to light rays 96 emitted from a light-emissive element (e.g., OLED) of a color component sub-pixel that pass through a neighboring (e.g., inappropriately colored) color filter cell actually being perceived by a user's eye 42.

Thus, when the expected color shift is not less than (e.g., greater than or equal to) the color shift threshold, the design system 113 may adjust one or more of the current panel implementation parameters to facilitate reducing perceivability and/or likelihood of color shift resulting in displayed image content (process block 112). In particular, in some embodiments, the design system 113 may adjust one or more of the current panel implementation parameters to adjust (e.g., reduce) the distance between a light emitting element (e.g., OLED) of a color component sub-pixel and an outward-facing surface of the color filter layer 82 (process block 127). For example, to facilitate reducing the distance between the organic light-emitting diode (OLED) of the color component sub-pixel and the outward-facing surface of the color filter layer 82, the design system 113 adjust one or more of the current (e.g., baseline) implementation parameters to reduce thickness (e.g., height) of one or more color filter cells in the color filter layer 82 (e.g., from a baseline color filter cell thickness) (process block 128).

Figure 14:
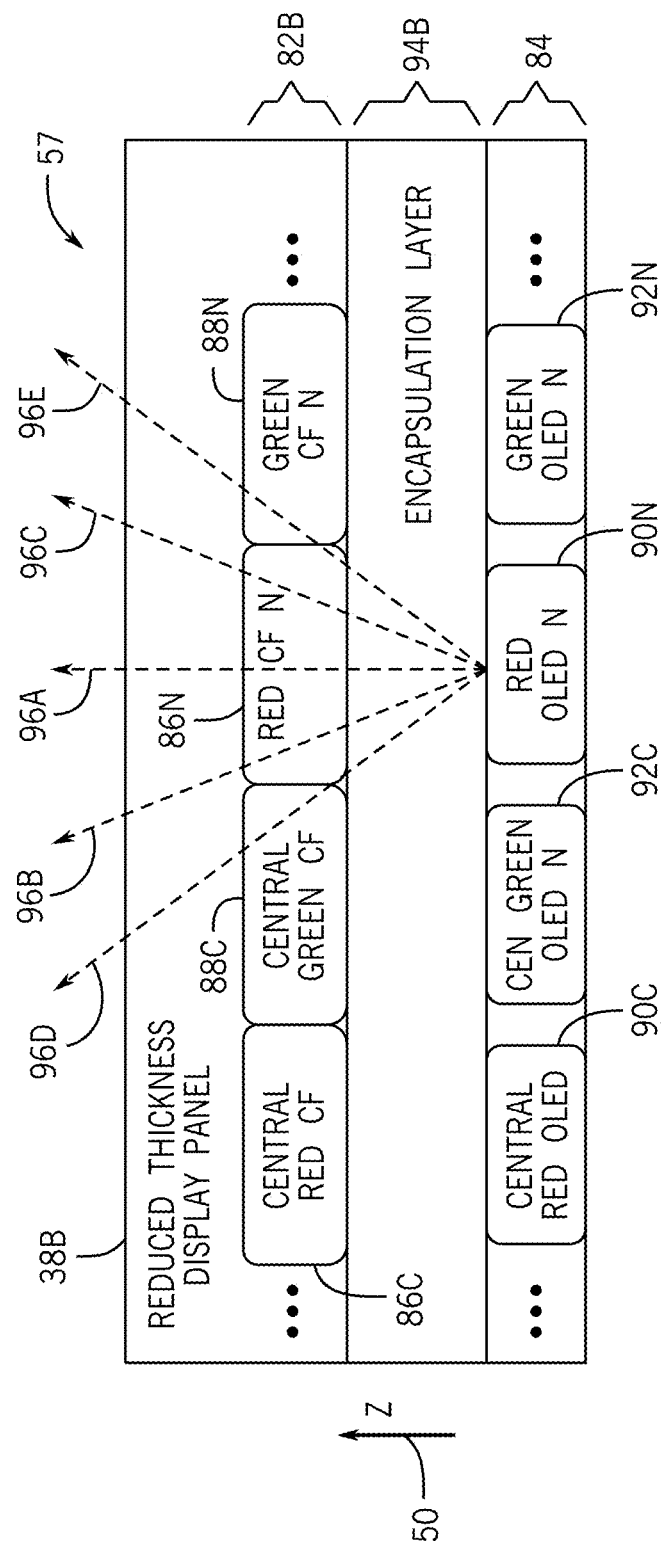
FIG. 14 is a cross-sectional view of an example display panel implemented with reduced color filter cell thickness compared to the baseline display panel of FIG. 10, in accordance with an embodiment of the present disclosure.

To help illustrate, an example of a reduced color filter cell thickness display panel 38B, which is viewed along the cross-sectional line 80 of FIG. 9, is shown in FIG. 14. As in the baseline display panel 38A of FIG. 10, the reduced color filter cell thickness display panel 38B of FIG. 14 includes a color filter layer 82, an encapsulation layer 94, and a light-emissive element (e.g., OLED) layer 84. Merely for illustrative purposes, the light-emissive element layer 84 of the reduced color filter cell thickness display panel 38B matches the light-emissive element layer 84 of the baseline display panel 38A.

Additionally, merely for illustrative purposes, the encapsulation layer 94 of FIG. 14 matches the baseline encapsulation layer 94A of FIG. 10. In other words, merely for illustrative purposes, the encapsulation layer 94 of the reduced color filter cell thickness display panel 38B is implemented with the baseline encapsulation thickness. However, the adjusted color filter layer 82B of FIG. 14 is thinner than the baseline color filter layer 82A of FIG. 10. In other words, thickness of the adjusted color filter layer 82B may be reduced from the baseline color filter cell thickness, thereby reducing the distance light rays 96 travel before exiting an outward-facing surface of the adjusted color filter layer 82C.

As in the depicted example, the reduced travel distance resulting from the reduced thickness of the adjusted color filter layer 82C may facilitate reducing the distance that light rays 96 emitted from a light-emissive element (e.g., OLED) of a color component sub-pixel travel through a neighboring (e.g., inappropriately colored) color filter cell. For example, the reduced thickness of the adjusted color filter layer 82C may facilitate reducing the distance that the fourth light ray 96D emitted from the Nth red organic light-emitting diode (OLED) 90N travels through the central green color filter cell 88C compared to the baseline display panel 38A of FIG. 10 and, thus, may facilitate reducing optical cross-talk and potentially resulting color shift. Additionally, the reduced thickness of the adjusted color filter layer 82C may facilitate reducing the distance that the fifth light ray 96E emitted from the Nth red organic light-emitting diode (OLED) 90N travels through the Nth green color filter cell 88N compared to the baseline display panel 38A of FIG. 10 and, thus, may facilitate reducing optical cross-talk and potentially resulting color shift. In this manner, one or more current (e.g., baseline) panel implementation parameters to be used to implement a display panel 38 may be adjusted to adjust (e.g., reduce) thickness of its color filter layer 82, which, at least in some instances, may facilitate improving perceived image quality provided by the display panel 38, for example, by reducing optical cross-talk between different color component sub-pixels on the display panel 38 and, thus, resulting color shift in displayed image content.

However, it should be appreciated that the depicted examples are merely intended to be illustrative and not limiting. For example, in other embodiments, thickness of one or more color filter cells may be adjusted different amounts. Merely as an illustrative example, the Nth red color filter cell 86N may be implemented with a baseline color filter cell thickness whereas the central green color filter cell 88C and/or the Nth green color filter cell 88N are implemented with an adjusted (e.g., reduced) color filter cell thickness. Moreover, returning to the design process 104 of FIG. 12, to adjust (e.g., reduce) the distance between the light emitting element (e.g., OLED) of the color component sub-pixel and the outward-facing surface of the color filter layer 82, the design system 113 may additionally or alternatively adjust one or more of the current (e.g., baseline) implementation parameters to reduce thickness (e.g., height) of an encapsulation layer 94 (e.g., from a baseline encapsulation thickness) (process block 129).

Figure 15:
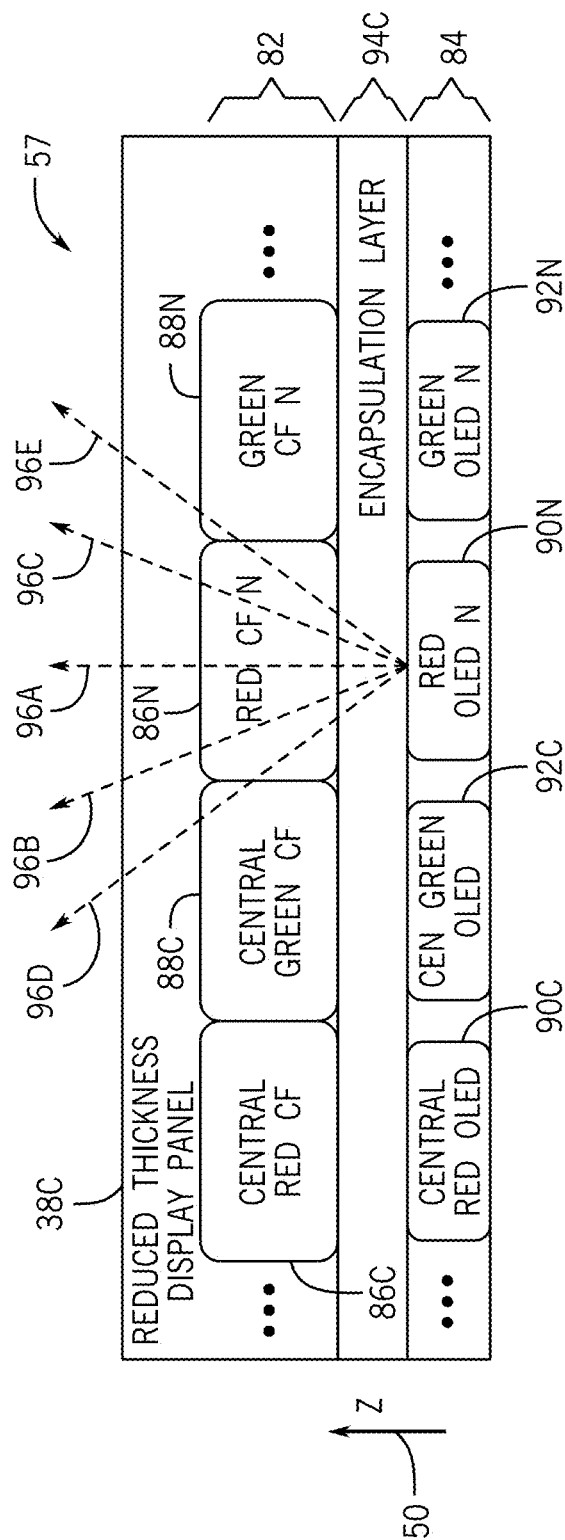
FIG. 15 is a cross-sectional view of an example display panel implemented with reduced encapsulation layer thickness compared to the baseline display panel of FIG. 10, in accordance with an embodiment of the present disclosure.

To help illustrate, an example of a reduced encapsulation thickness display panel 38C, which is viewed along the cross-sectional line 80 of FIG. 9, is shown in FIG. 15. As in the baseline display panel 38A of FIG. 10, the reduced encapsulation thickness display panel 38C of FIG. 15 includes a color filter layer 82, an encapsulation layer 94, and a light-emissive element (e.g., OLED) layer 84. Merely for illustrative purposes, the light-emissive element layer 84 of the reduced encapsulation thickness display panel 38C matches the light-emissive element layer 84 of the baseline display panel 38A.

Additionally, merely for illustrative purposes, the color filter layer 82 of FIG. 15 matches the baseline encapsulation layer 94A of FIG. 10. In other words, merely for illustrative purposes, the color filter layer 82C of the reduced encapsulation thickness display panel 38C is implemented with the baseline color filter cell thickness. However, the adjusted encapsulation layer 94C of FIG. 15 is thinner than the baseline encapsulation layer 94A of FIG. 10. In other words, thickness of the adjusted encapsulation layer 94C may be reduced from the baseline encapsulation thickness, thereby reducing the distance light rays 96 travel before exiting an outward-facing surface of the color filter layer 82C.

As in the depicted example, the reduced travel distance resulting from the reduced thickness of the adjusted encapsulation layer 94C may facilitate reducing the distance that light rays 96 emitted from a light-emissive element (e.g., OLED) of a color component sub-pixel travel through a neighboring (e.g., inappropriately colored) color filter cell. For example, the reduced thickness of the adjusted encapsulation layer 94C may facilitate reducing the distance that the fourth light ray 96D emitted from the Nth red organic light-emitting diode (OLED) 90N travels through the central green color filter cell 88C compared to the baseline display panel 38A of FIG. 10 and, thus, may facilitate reducing optical cross-talk and potentially resulting color shift. Additionally, the reduced thickness of the adjusted encapsulation layer 94C may facilitate reducing the distance that the fifth light ray 96E emitted from the Nth red organic light-emitting diode (OLED) 90N travels through the Nth green color filter cell 88N compared to the baseline display panel 38A of FIG. 10 and, thus, may facilitate reducing optical cross-talk and potentially resulting color shift.

However, it should be appreciated that the depicted example is are merely intended to be illustrative and not limiting. In fact, in other embodiments, one or more current (e.g., baseline) panel implementation parameters may be adjusted to adjust color filter cell thickness as well as encapsulation thickness. For example, to facilitate further reducing optical cross-talk and potentially resulting color shift, in some embodiments, a display panel 38 may be implemented with reduced color filter cell thickness as well as reduced encapsulation thickness.

Figure 16:
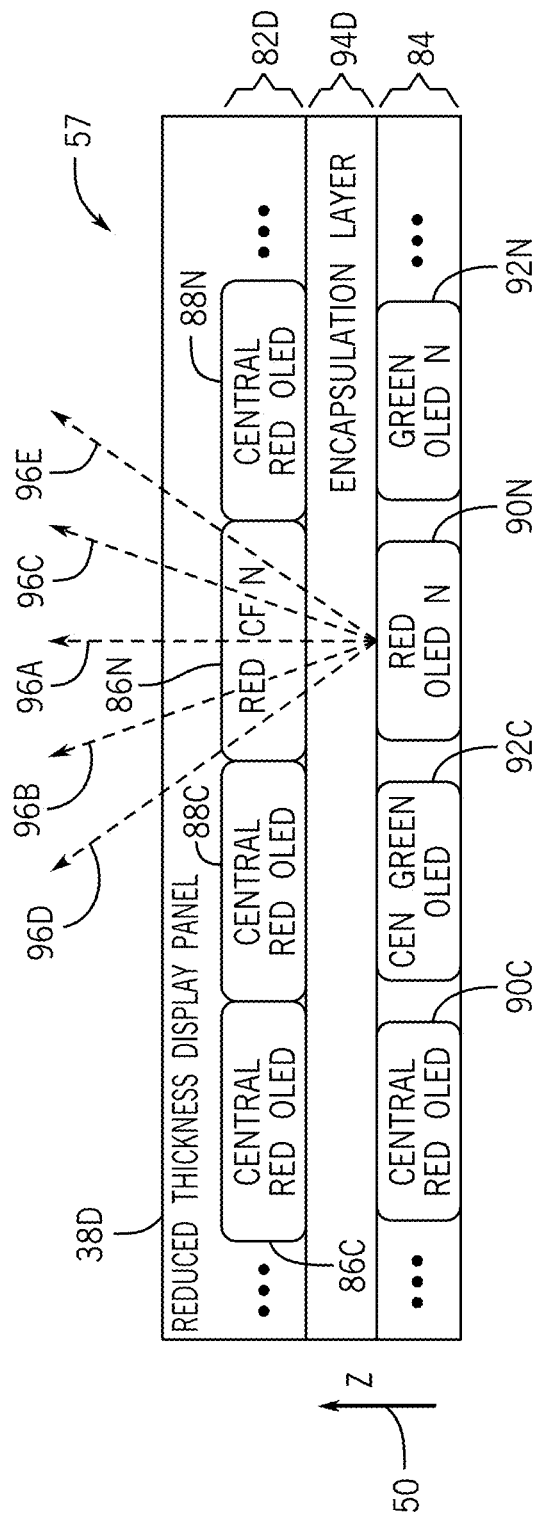
FIG. 16 is a cross-sectional view of an example display panel implemented with reduced color filter cell thickness compared to the baseline display panel of FIG. 10 and reduced encapsulation layer thickness compared to the baseline display panel of FIG. 10, in accordance with an embodiment of the present disclosure.

To help illustrate, another example of a reduced thickness display panel 38D, which is viewed along the cross-sectional line 80 of FIG. 9, is shown in FIG. 16. As in the baseline display panel 38A of FIG. 10, the reduced thickness display panel 38D of FIG. 16 includes a color filter layer 82, an encapsulation layer 94, and a light-emissive element (e.g., OLED) layer 84. Merely for illustrative purposes, the light-emissive element layer 84 of the reduced thickness display panel 38D matches the light-emissive element layer 84 of the baseline display panel 38A.

However, the adjusted color filter layer 82D of FIG. 16 differs from the baseline color filter layer 82A of FIG. 10 and the adjusted encapsulation layer 94D of FIG. 16 differs from the baseline encapsulation layer 94A of FIG. 10. In particular, similar to the adjusted color filter layer 82B of FIG. 14, the adjusted color filter layer 82D of FIG. 16 is thinner than the baseline color filter layer 82A of FIG. 10. In other words, thickness of the adjusted color filter layer 82D may be reduced from the baseline color filter cell thickness, thereby reducing the distance light rays 96 travel before exiting an outward-facing surface of the adjusted color filter layer 82D. Additionally, similar to the adjusted encapsulation layer 94C of FIG. 15, the adjusted encapsulation layer 94D of FIG. 16 is thinner than the baseline encapsulation layer 94A of FIG. 10. In other words, thickness of the adjusted encapsulation layer 94D may be reduced from the baseline encapsulation thickness, thereby further reducing the distance light rays 96 travel before exiting the outward-facing surface of the adjusted color filter layer 82D.

As in the depicted example, the further reduced travel distance resulting from the reduced thickness of the adjusted color filter layer 82D and the reduced thickness of the adjusted encapsulation layer 94D may facilitate further reducing the distance that light rays 96 emitted from a light-emissive element (e.g., OLED) of a color component sub-pixel travel through a neighboring (e.g., inappropriately colored) color filter cell. In fact, merely as an illustrative example, the reduced thickness of the adjusted color filter layer 82D and the reduced thickness of the adjusted encapsulation layer 94D may result in the fourth light ray 96D emitted from the Nth red organic light-emitting diode (OLED) 90N exiting the adjusted color filter layer 82D without passing through the central green color filter cell 88C and/or the fifth light ray 96E emitted from the Nth red organic light-emitting diode (OLED) 90N exiting the adjusted color filter layer 82D without passing through the Nth green color filter cell 88N. In this manner, one or more panel implementation parameters may be adjusted to facilitate reducing optical cross-talk between different color component sub-pixels on a display panel 38 and, thus, resulting color shift in image content displayed on the display panel 38.

Figure 17:
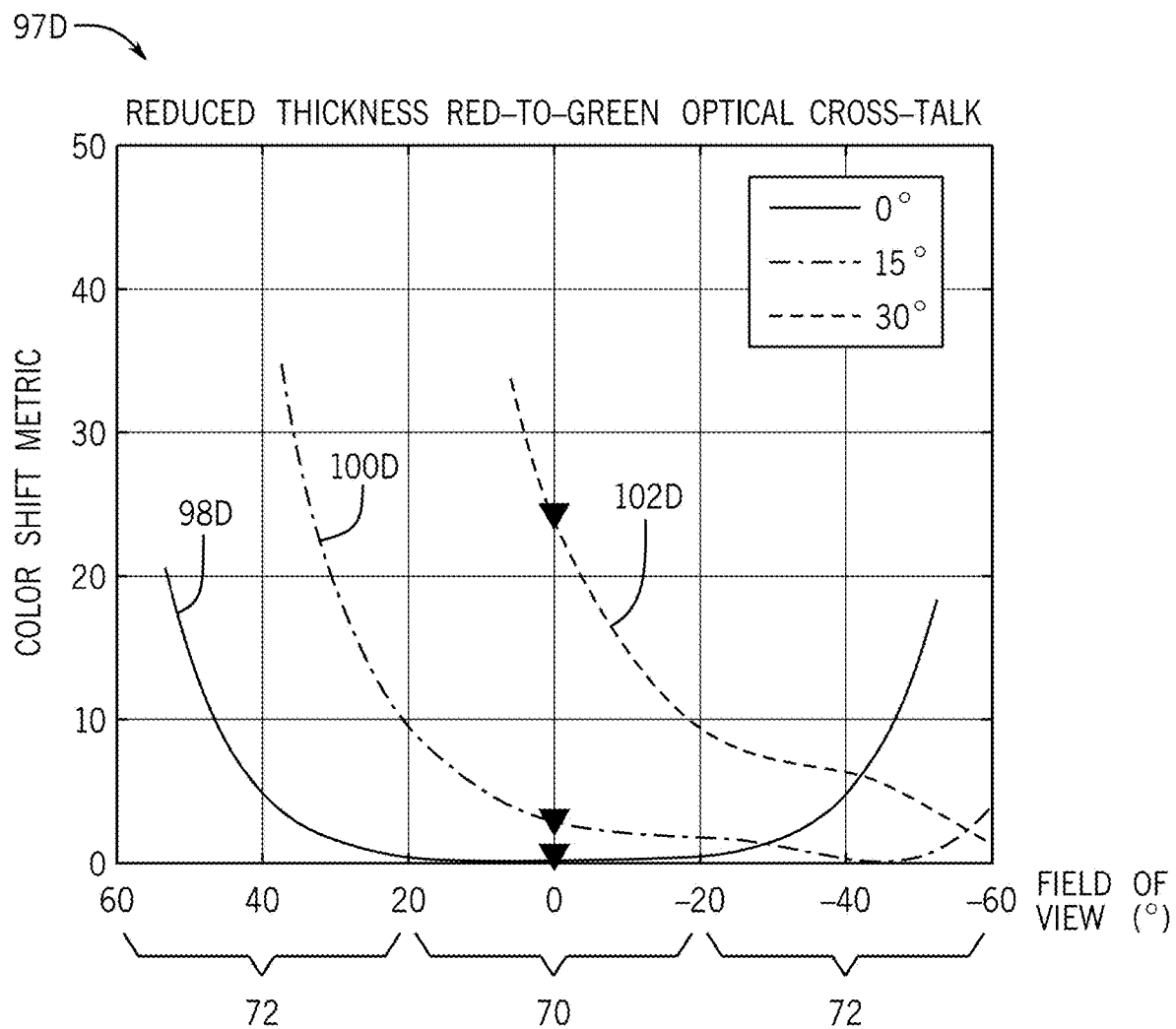
FIG. 17 is a plot illustrating color shift resulting from the reduced thickness display panel of FIG. 16 when viewed from various viewing angles, in accordance with an embodiment of the present disclosure.

To help further illustrate, an example plot 97D, which describes perceivability of color shift resulting across a (e.g., apparent and/or local) field of view of a user's eye 42 when the reduced thickness display panel 38D of FIG. 16 is viewed using different sets of viewing characteristics, is shown in FIG. 17. In particular, the plot 97D includes a first curve 98D, which describes color shift perceivability resulting from a first set of viewing characteristics that includes a viewing angle of zero degrees, a second curve 100D, which describes color shift perceivability resulting from a second set of viewing characteristics that includes a viewing angle of fifteen degrees, and a third curve 102D, which describes color shift perceivability resulting from a third set of viewing characteristics that includes a viewing angle of thirty degrees. In other words, merely for illustrative purposes, the first set of viewing characteristics described in the plot 97D of FIG. 17 matches the first set of viewing characteristics described in the plot 97A of FIG. 11, the second set of viewing characteristics described in the plot 97D of FIG. 17 matches the second set of viewing characteristics described in the plot 97A of FIG. 11, and the third set of viewing characteristics described in the plot 97D of FIG. 17 matches the third set of viewing characteristics described in the plot 97A of FIG. 11.

As depicted, the different viewing angles may result in different color shift profiles. For example, similar to the first curve 98A of FIG. 11, as described by the first curve 98D of FIG. 17, minimal (e.g., no) color shift results in a focus region 70 of the field of view 62 and an increase in color shift occurs in in periphery regions 72 of the field of view 62 when the reduced thickness display panel 38D is viewed with a viewing angle of zero degrees (e.g., first set of viewing characteristics). In fact, as described by the first curve 98D of FIG. 17, the reduced thickness display panel 38D may facilitate reducing color shift resulting in the periphery regions 72 of the field of view 62 compared to the baseline display panel 38A.

Nevertheless, similar to the second curve 100A of FIG. 11, as described by the second curve 100D of FIG. 17, color shift resulting in the focus region 70 of the field of view 62 increases when the reduced thickness display panel 38D is viewed with a viewing angle of fifteen degrees (e.g., second set of viewing characteristics). Additionally, similar to the third curve 102A of FIG. 11, as described by the third curve 102D of FIG. 17, color shift resulting in the focus region 70 of the field of view 62 further increases when the reduced thickness display panel 38D is viewed with a viewing angle of thirty degrees (e.g., third set of viewing characteristics). However, as described by the second curve 100D and the third curve 102D of FIG. 17, the reduced thickness display panel 38D may facilitate reducing color shift resulting in the field of view 62 compared to the baseline display panel 38A. In this manner, adjusting one or more baseline (e.g., current) panel implementation parameters to reduce the distance between light emitting elements (e.g., OLEDs) of color component sub-pixels and an outward-facing surface of a color filter layer 82 may facilitate improving perceived image quality provided by a display panel 38, for example, due to the reduced distance reducing optical cross-talk between different color component sub-pixels and, thus, resulting color shift in displayed image content.

Returning to the design process 104 of FIG. 12, in addition to color filter cell thickness (e.g., height) and/or encapsulation thickness, as described above, panel implementation parameters may govern footprint (e.g., width, length, and/or pitch) of one or more color filter cells in the color filter layer 82. Thus, to facilitate reducing color shift resulting from optical cross-talk, the design system 113 may additionally or alternatively adjust one or more current (e.g., baseline) panel implementation parameters to adjust footprint (e.g., width, length, and/or pitch) of one or more color filter cells in the color filter layer 82 (process block 131). For example, the design system 113 may increase footprint of each color filter cell in the color filter layer 82 by a uniform amount (e.g., from a baseline color filter cell footprint) (process block 133).

Figure 18:
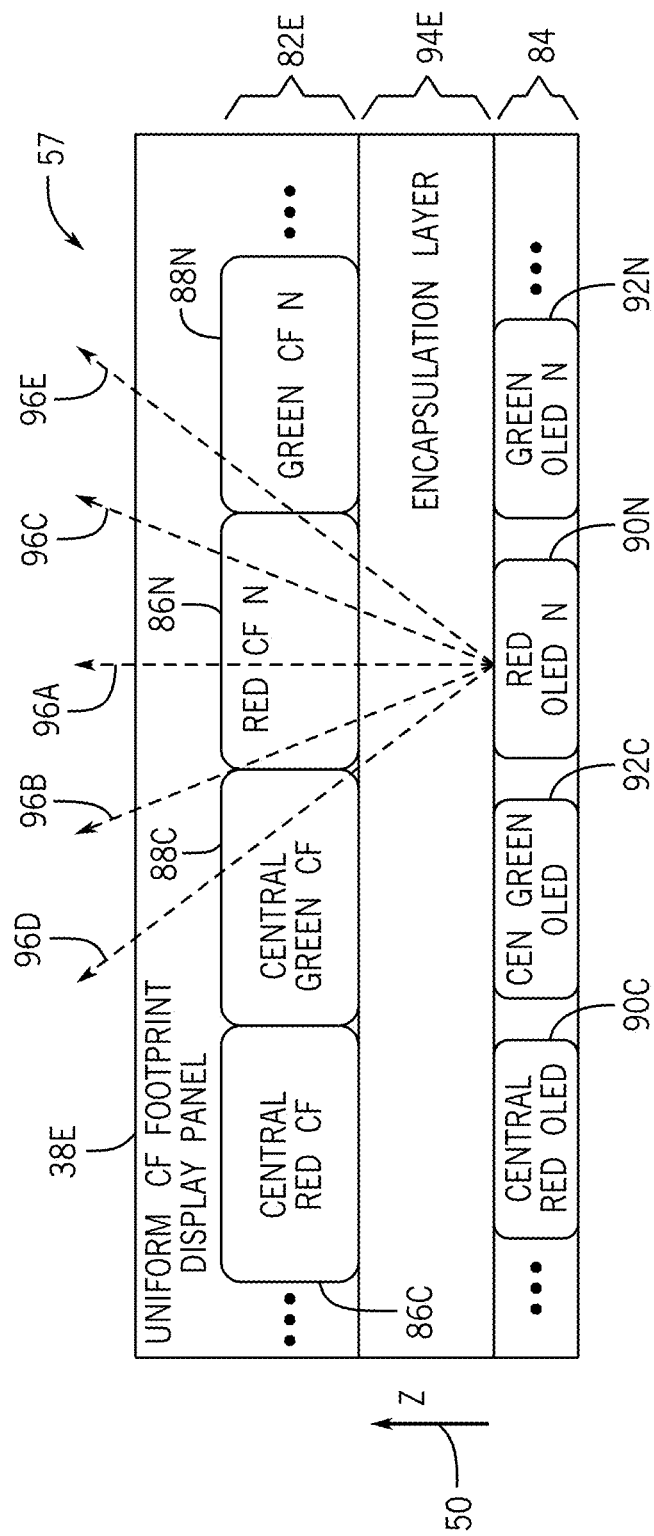
FIG. 18 is a cross-sectional view of an example display panel implemented with color filter cell footprints uniformly increased compared to the baseline display panel of FIG. 10, in accordance with an embodiment of the present disclosure.

To help illustrate, an example of a uniform color filter cell (CF) footprint display panel 38E, which is viewed along the cross-sectional line 80 of FIG. 9, is shown in FIG. 18. As in the baseline display panel 38A of FIG. 10, the uniform color filter cell footprint display panel 38E of FIG. 18 includes a color filter layer 82, an encapsulation layer 94, and a light-emissive element (e.g., OLED) layer 84. Merely for illustrative purposes, the light-emissive element layer 84 of the uniform color filter cell footprint display panel 38E matches the light-emissive element layer 84 of the baseline display panel 38A.

Additionally, merely for illustrative purposes, the encapsulation layer 94 of FIG. 18 matches the baseline encapsulation layer 94A of FIG. 10. In other words, merely for illustrative purposes, the encapsulation layer 94 of the uniform color filter cell footprint display panel 38E is implemented with the baseline encapsulation thickness. Furthermore, merely for illustrative purposes, thickness of the adjusted color filter layer 82E of FIG. 18 matches thickness of the baseline color filter layer 82A of FIG. 10. In other words, merely for illustrative purposes, the adjusted color filter layer 82E of the uniform color filter cell footprint display panel 38E is implemented with the baseline color filter cell thickness.

However, the footprint (e.g., width, height, and/or pitch) of each color filter cell in the adjusted color filter layer 82E of FIG. 18 uniformly differs for the footprint of corresponding color filter cells in the baseline color filter layer 82A of FIG. 10. In other words, in some embodiments, the footprint (e.g., width, height, and/or pitch) of each color filter cell in the adjusted color filter layer 82E of the uniform color filter cell footprint display panel 38E may be uniformly increased from the baseline color filter cell footprint. Moreover, as in the depicted example, in some embodiments, the adjusted color filter layer 82E may nevertheless be centered over the light-emissive element layer 84, for example, such that the adjusted color filter layer 82E is relative to a central display pixel 56C on the uniform color filter cell footprint display panel 38E. In other words, in such embodiments, increasing color filter cell footprint may result in color filter cells being shifted outward.

In fact, in some embodiments, the outward shift produced by a uniform color footprint increase may result in the adjusted color filter layer 82E of the uniform color filter cell footprint display panel 38E overhanging one or more edges (e.g., sides) its light-emissive element (e.g., OLED) layer 84 and/or its encapsulation layer 94. Moreover, as in the depicted example, the uniformly increased color filter cell footprint of the adjusted color filter layer 82E may affect the distance that light rays 96 emitted from a light-emissive element (e.g., OLED) of a color component sub-pixel travel through a neighboring (e.g., inappropriately colored) color filter cell. For example, the uniformly increased color filter cell footprint of the adjusted color filter layer 82E may reduce the distance the fifth light ray 96E emitted from the Nth red organic light-emitting diode (OLED) 90N travels through the Nth green color filter cell 88N before exiting the adjusted color filter layer 82E of the uniform color filter cell footprint display panel 38E. In this manner, one or more panel implementation parameters may be adjusted to facilitate reducing optical cross-talk between different color component sub-pixels on a display panel 38 and, thus, resulting color shift in image content displayed on the display panel 38.

To help further illustrate, an example plot 97E, which describes perceivability of color shift resulting across a (e.g., apparent and/or local) field of view of a user's eye 42 when the uniform color filter cell footprint display panel 38E of FIG. 18 is viewed using different sets of viewing characteristics, is shown in FIG. 17. In particular, the plot 97E includes a first curve 98E, which describes color shift perceivability resulting from a first set of viewing characteristics that includes a viewing angle of zero degrees, a second curve 100E, which describes color shift perceivability resulting from a second set of viewing characteristics that includes a viewing angle of fifteen degrees, and a third curve 102E, which describes color shift perceivability resulting from a third set of viewing characteristics that includes a viewing angle of thirty degrees. In other words, merely for illustrative purposes, the first set of viewing characteristics described in the plot 97E of FIG. 19 matches the first set of viewing characteristics described in the plot 97A of FIG. 11, the second set of viewing characteristics described in the plot 97E of FIG. 19 matches the second set of viewing characteristics described in the plot 97A of FIG. 11, and the third set of viewing characteristics described in the plot 97E of FIG. 19 matches the third set of viewing characteristics described in the plot 97A of FIG. 11.

As depicted, the different viewing angles may result in different color shift profiles. For example, similar to the first curve 98A of FIG. 11, as described by the first curve 98E of FIG. 19, minimal (e.g., no) color shift results in a focus region 70 of the field of view 62 and an increase in color shift occurs in periphery regions 72 of the field of view 62 when the uniform color filter cell footprint display panel 38E is viewed with a viewing angle of zero degrees (e.g., first set of viewing characteristics). In fact, similar to the first curve 98D of FIG. 17, as described by the first curve 98E of FIG. 19, the uniform color filter cell footprint display panel 38E may facilitate reducing color shift resulting in the periphery regions 72 of the field of view 62 compared to the baseline display panel 38A.

Figure 19:
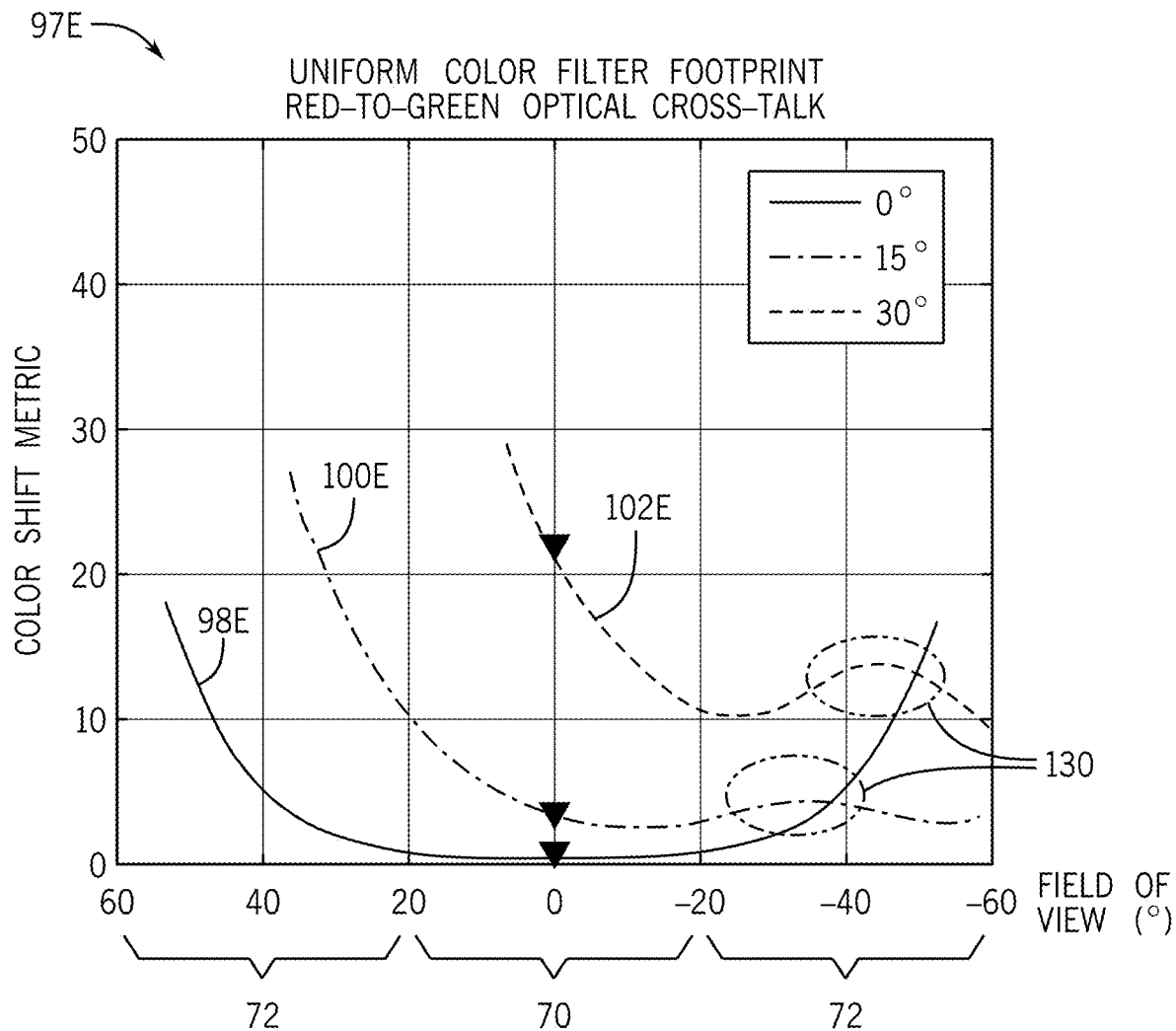
FIG. 19 is a plot illustrating color shift resulting from the uniform color filter cell footprint display panel of FIG. 18 when viewed from various viewing angles, in accordance with an embodiment of the present disclosure.

Nevertheless, similar to the second curve 100A of FIG. 11, as described by the second curve 100E of FIG. 19, color shift resulting in the focus region 70 of the field of view 62 increases when the uniform color filter cell footprint display panel 38E is viewed with a viewing angle of fifteen degrees (e.g., second set of viewing characteristics). Additionally, similar to the third curve 102A of FIG. 11, as described by the third curve 102E of FIG. 19, color shift resulting in the focus region 70 of the field of view 62 further increases when the uniform color filter cell footprint display panel 38E is viewed with a viewing angle of thirty degrees (e.g., third set of viewing characteristics). However, as described by the second curve 100E and the third curve 102E of FIG. 19, the uniform color filter cell footprint display panel 38E may facilitate reducing color shift resulting in the field of view 62 compared to the baseline display panel 38A. In this manner, adjusting one or more baseline (e.g., current) panel implementation parameters to uniformly increase color filter cell footprint may facilitate improving perceived image quality provided by a display panel 38, for example, at least in a focus region 70 of the field of view 62 of a user's eye 42.

However, as described by the second curve 100E of FIG. 19, adjusting one or more baseline (e.g., current) panel implementation parameters to uniformly increase color filter cell footprint may produce a color shift spike 130 (e.g., non-monotonic change) in a periphery region 72 of the field of view 62 when the uniform color filter cell footprint display panel 38E is viewed with a viewing angle of fifteen degrees (e.g., second set of viewing characteristics). Moreover, as described by the third curve 102E of FIG. 19, adjusting one or more baseline (e.g., current) panel implementation parameters to uniformly increase color filter cell footprint may produce an even larger color shift spike 130 in the periphery region 72 of the field of view 62 when the uniform color filter cell footprint display panel 38E is viewed with a viewing angle of thirty degrees (e.g., third set of viewing characteristics). In other words, at least in some instances, the uniform color filter cell footprint display panel 38E may result in a color shift spike 130 in a periphery region 72 of the field of view (FOV) 62 when viewed with a non-zero viewing angle. For example, with regard to FIG. 18, a color shift spike 130 in a periphery region 72 of the field of view 62 may result due to the uniform color filter cell footprint display panel 38E increasing the distance the fourth light ray 96D emitted from the Nth red organic light-emitting diode (OLED) 90N travels through the central green color filter cell 88C before exiting the adjusted color filter layer 82E.

As described above, a focus region 70 in a field of view 62 generally corresponds to a central portion of an eye's retina, which is more sensitive to visible light, while a periphery region 72 in the field of field 62 generally corresponds to an outer portion of the eye's retina, which is less sensitive to visible light. In other words, perceivability of color shift occurring in the focus region 70 may be greater than color shift in a periphery region 72 and, thus, more color shift may be acceptable in the periphery region 72. Nevertheless, a color shift spike 130, even in the periphery region 72 of the field of view 62, may generally be more perceivable than a monotonically changing color shift. To facilitate reducing perceivability of color shift resulting in a periphery region 72, returning to the design process 104 of FIG. 12, the design system 113 may additionally or alternatively adjust color filter cell footprint (e.g., width, length, and/or pitch) in the color filter layer 82 by increasing footprint of one or more color filter cells by non-uniform (e.g., different) amounts, for example, from a baseline color filter cell footprint (process block 135).

Figure 20:
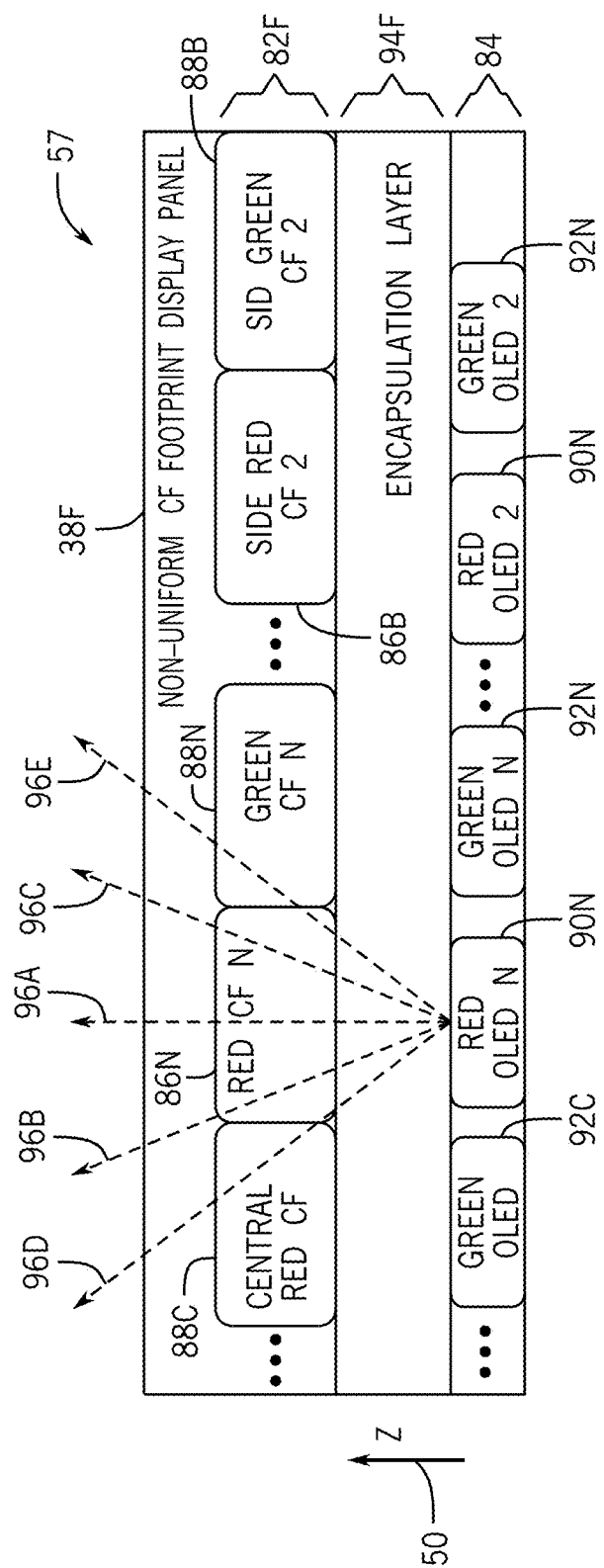
FIG. 20 is a cross-sectional view of an example display panel implemented with color filter cell footprints non-uniformly increased compared to the baseline display panel of FIG. 10, in accordance with an embodiment of the present disclosure.

To help illustrate, an example of a non-uniform color filter cell (CF) footprint display panel 38F, which is viewed along the cross-sectional line 80 of FIG. 9, is shown in FIG. 20. As in the baseline display panel 38A of FIG. 10, the non-uniform color filter cell footprint display panel 38F of FIG. 20 includes a color filter layer 82, an encapsulation layer 94, and a light-emissive element (e.g., OLED) layer 84. Merely for illustrative purposes, the light-emissive element layer 84 of the non-uniform color filter cell footprint display panel 38F matches the light-emissive element layer 84 of the baseline display panel 38A.

Additionally, merely for illustrative purposes, the encapsulation layer 94 of FIG. 20 matches the baseline encapsulation layer 94A of FIG. 10. In other words, merely for illustrative purposes, the encapsulation layer 94 of the non-uniform color filter cell footprint display panel 38F is implemented with the baseline encapsulation thickness. Furthermore, merely for illustrative purposes, thickness of the adjusted color filter layer 82F of FIG. 20 matches thickness of the baseline color filter layer 82A of FIG. 10. In other words, merely for illustrative purposes, the adjusted color filter layer 82F of the non-uniform color filter cell footprint display panel 38F is implemented with the baseline color filter cell thickness.

However, the footprint (e.g., width, height, and/or pitch) of different color filter cells in the adjusted color filter layer 82F of FIG. 20 differ from one another. For example, the footprint of the central green color filter cell 88C may match the baseline color filter cell footprint. However, the footprint of the Nth red color filter cell 86N and/or the Nth green color filter cell 88N may be increased from the baseline color filter cell footprint by a first amount. Additionally, the footprint of a second side red color filter cell 86B corresponding with a second side red sub-pixel 74B and/or the footprint of a second side green color filter cell 88B corresponding with a second side green sub-pixel 76B may be increased from the baseline color filter cell footprint by a second amount.

In fact, in some embodiments, the footprint of color filter cells in the adjusted color filter layer 82F of the non-uniform color filter cell footprint display panel 38F may gradually increase moving away from its central display pixel 56C. In other words, in such embodiments, the second amount with which footprint of the second side red color filter cell 86B and/or the footprint of the second side green color filter cell 88B is increased from the baseline color filter cell footprint may be greater than the first amount with which footprint of the Nth red color filter cell 86N and/or the footprint of the Nth green color filter cell 88N is increased from the baseline color filter cell footprint. Moreover, similar to the uniform color filter cell footprint display panel 38E of FIG. 18, in some embodiments, the adjusted color filter layer 82F of FIG. 20 may nevertheless being centered over the light-emissive element layer 84, for example, such that the adjusted color filter layer 82F is centered over a central display pixel 56C on the non-uniform color filter cell footprint display panel 38F. In other words, in such embodiments, increasing color filter cell footprint may result in color filter cells being shifted outward.

In fact, in some embodiments, the outward shift produced by a non-uniform color footprint increase may result in the adjusted color filter layer 82F of the non-uniform color filter cell footprint display panel 38F overhanging one or more edges (e.g., sides) of its light-emissive element (e.g., OLED) layer 84 and/or its encapsulation layer 94. Moreover, as in the depicted example, the non-uniformly increased color filter cell footprint of the adjusted color filter layer 82F may affect the distance that light rays 96 emitted from a light-emissive element (e.g., OLED) of a color component sub-pixel travel through a neighboring (e.g., inappropriately colored) color filter cell. For example, compared to the uniform color filter cell footprint display panel 38E of FIG. 18, the non-uniformly increased color filter cell footprint of the non-uniform color filter cell footprint display panel 38F of FIG. 20 may reduce the distance the fourth light ray 96D emitted from the Nth red organic light-emitting diode (OLED) 90N travels through central green color filter cell 88C before exiting the adjusted color filter layer 82F, which, at least in some instances, may facilitate reducing likelihood of a color shift spike 130 occurring in a periphery region 72 of the field of view 62 of a user's eye 42.

Figure 21:
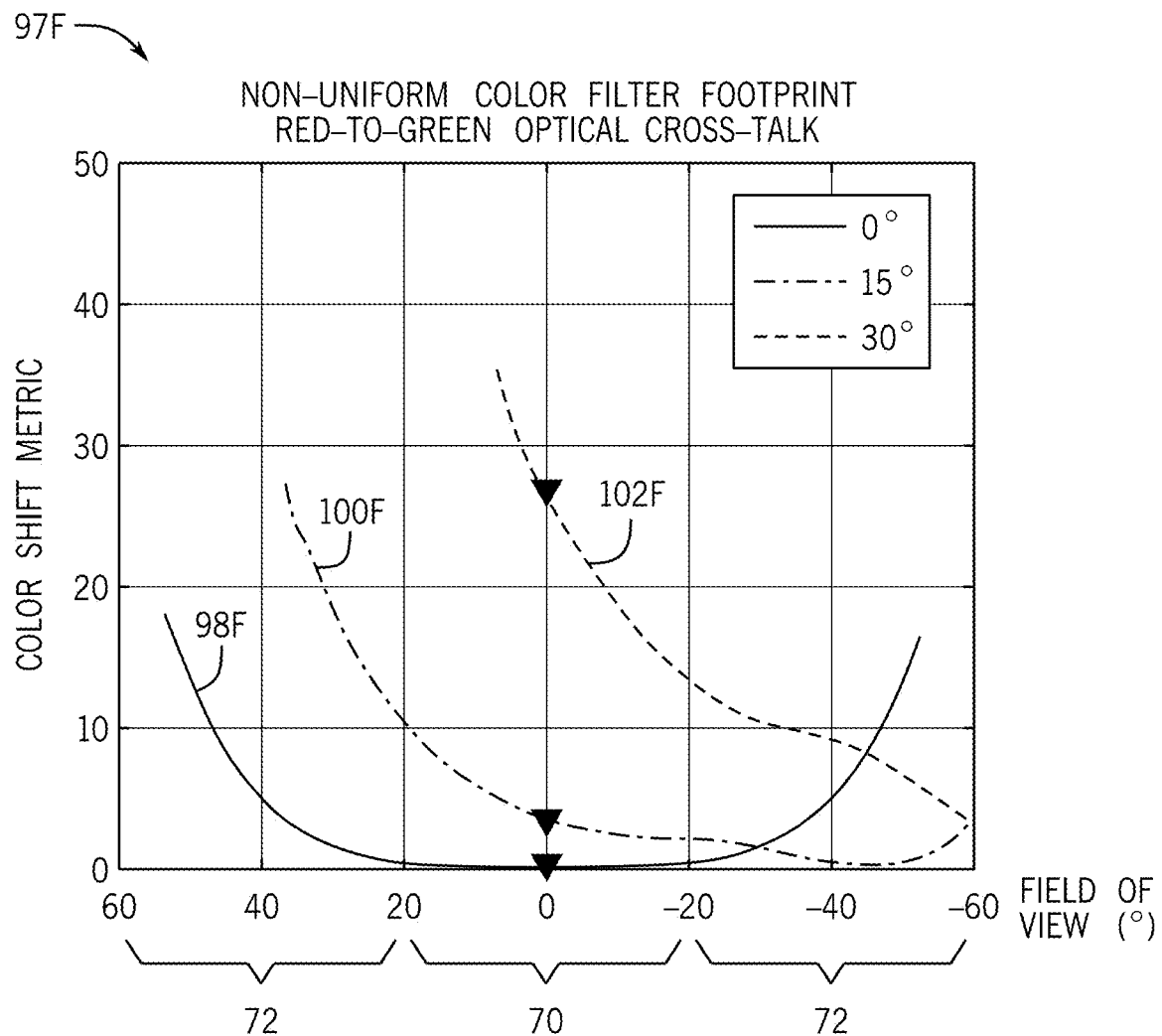
FIG. 21 is a plot illustrating color shift resulting from the non-uniform color filter cell footprint display panel of FIG. 20 when viewed from various viewing angles, in accordance with an embodiment of the present disclosure.

To help further illustrate, an example plot 97F, which describes perceivability of color shift resulting across a (e.g., apparent and/or local) field of view of a user's eye 42 when the non-uniform color filter cell footprint display panel 38F of FIG. 20 is viewed using different sets of viewing characteristics, is shown in FIG. 21. In particular, the plot 97F includes a first curve 98F, which describes color shift perceivability resulting from a first set of viewing characteristics that includes a viewing angle of zero degrees, a second curve 100F, which describes color shift perceivability resulting from a second set of viewing characteristics that includes a viewing angle of fifteen degrees, and a third curve 102F, which describes color shift perceivability resulting from a third set of viewing characteristics that includes a viewing angle of thirty degrees. In other words, merely for illustrative purposes, the first set of viewing characteristics described in the plot 97F of FIG. 21 matches the first set of viewing characteristics described in the plot 97A of FIG. 11, the second set of viewing characteristics described in the plot 97F of FIG. 21 matches the second set of viewing characteristics described in the plot 97A of FIG. 11, and the third set of viewing characteristics described in the plot 97F of FIG. 21 matches the third set of viewing characteristics described in the plot 97A of FIG. 11.

As depicted, the different viewing angles may result in different color shift profiles. For example, similar to the first curve 98A of FIG. 11, as described by the first curve 98F of FIG. 21, minimal (e.g., no) color shift results in a focus region 70 of the field of view 62 and an increase in color shift occurs in in periphery regions 72 of the field of view 62 when the non-uniform color filter cell footprint display panel 38F is viewed with a viewing angle of zero degrees (e.g., first set of viewing characteristics). In fact, similar to the first curve 98D of FIG. 17 and the first curve 98E of FIG. 19, as described by the first curve 98F of FIG. 21, the non-uniform color filter cell footprint display panel 38F may facilitate reducing color shift resulting in the periphery regions 72 of the field of view 62 compared to the baseline display panel 38A.

Nevertheless, similar to the second curve 100A of FIG. 11, as described by the second curve 100F of FIG. 21, color shift resulting in the focus region 70 of the field of view 62 increases when the uniform color filter cell footprint display panel 38E is viewed with a viewing angle of fifteen degrees (e.g., second set of viewing characteristics). Additionally, similar to the third curve 102A of FIG. 11, as described by the third curve 102F of FIG. 21, color shift resulting in the focus region 70 of the field of view 62 further increases when the uniform color filter cell footprint display panel 38E is viewed with a viewing angle of thirty degrees (e.g., third set of viewing characteristics). However, as described by the second curve 100F and the third curve 102F of FIG. 21, the non-uniform color filter cell footprint display panel 38F may facilitate reducing color shift resulting in the field of view 62 compared to the baseline display panel 38A. Moreover, as described by the second curve 100F and the third curve 102F of FIG. 21, the non-uniform color filter cell footprint display panel 38F may facilitate reducing color shift spikes 130 resulting a periphery region 72 of the field of view 62 compared to uniform color filter cell footprint display panel 38E. In this manner, adjusting one or more baseline (e.g., current) panel implementation parameters to non-uniformly increase color filter cell footprint may facilitate improving perceived image quality provided by a display panel 38 in a focus region 70 and/or a periphery region 72 of the field of view 62 of a user's eye 42.

However, it should be appreciated that the depicted example is merely intended to be illustrative and not limiting. In particular, in other embodiments, magnitude and/or likelihood of color shift spikes 130 occurring in a periphery region 72 of the field of view 62 may be reduced by adjusting one or more current (e.g., baseline) panel implementation parameters in a different manner. For example, to facilitate reducing magnitude and/or likelihood of color shift spikes 130 occurring in a periphery region 72, in some embodiments, a display panel 38 implemented with uniformly increased color filter cell footprints may additionally be implemented with a reduced color filter cell thickness and/or a reduced encapsulation thickness.

Figure 22:
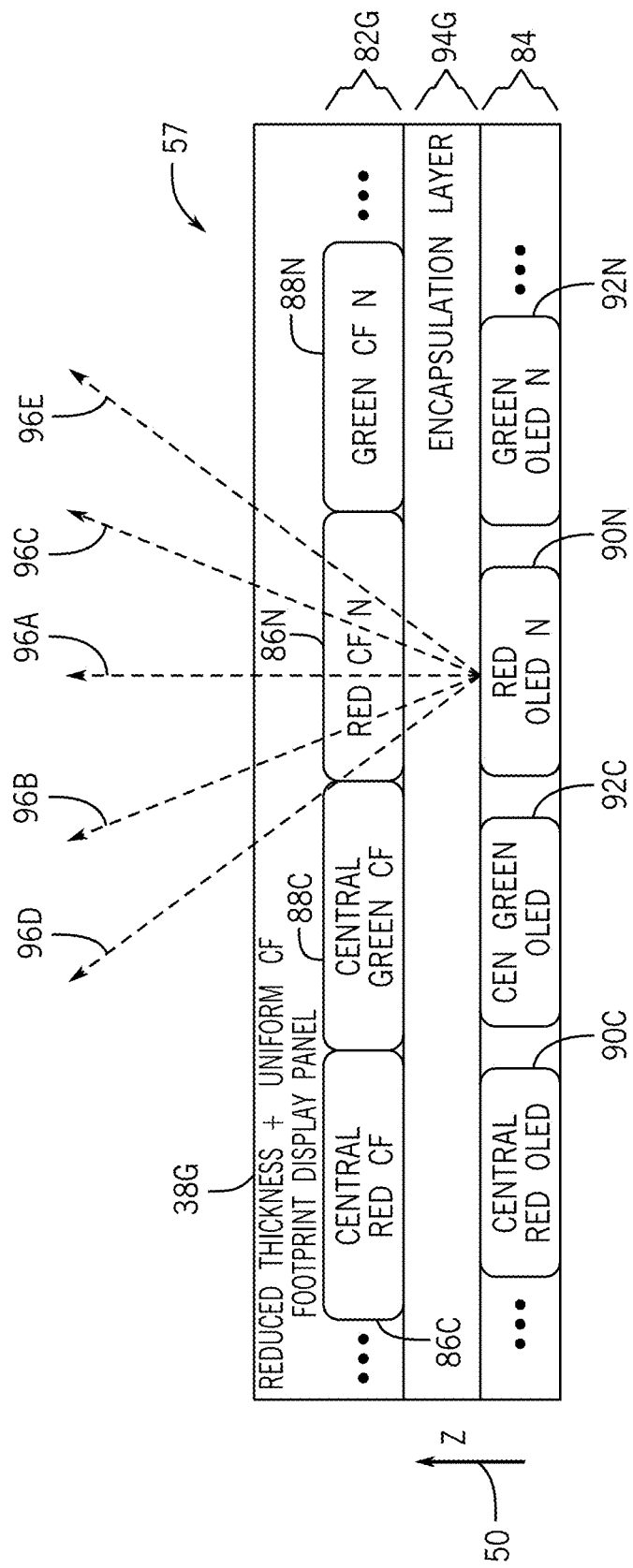
FIG. 22 is a cross-sectional view of an example display panel implemented with reduced color filter cell thickness compared to the baseline display panel of FIG. 10, reduced encapsulation layer thickness compared to the baseline display panel of FIG. 10, and color filter cell footprints uniformly increased compared to the baseline display panel of FIG. 10, in accordance with an embodiment of the present disclosure.

To help illustrate, an example of a reduced thickness and uniform color filter cell (CF) footprint display panel 38G, which is viewed along the cross-sectional line 80 of FIG. 9, is shown in FIG. 22. As in the baseline display panel 38A of FIG. 10, the reduced thickness and uniform color filter cell footprint display panel 38G of FIG. 22 includes a color filter layer 82, an encapsulation layer 94, and a light-emissive element (e.g., OLED) layer 84. Merely for illustrative purposes, the light-emissive element layer 84 of the reduced thickness and uniform color filter cell footprint display panel 38G matches the light-emissive element layer 84 of the baseline display panel 38A.

However, the adjusted encapsulation layer 94G of FIG. 22 differs from the baseline encapsulation layer 94A of FIG. 10. In particular, the adjusted encapsulation layer 94G of the reduced thickness and uniform color filter cell footprint display panel 38G is thinner than the baseline encapsulation layer 94A of the baseline display panel 38A. For example, thickness of the adjusted encapsulation layer 94G of FIG. 22 may match thickness of the adjusted encapsulation layer 94C of FIG. 15 and, thus, differ from the baseline encapsulation thickness. In other words, thickness of the adjusted encapsulation layer 94G of the reduced thickness and uniform color filter cell footprint display panel 38G may be reduced from the baseline encapsulation thickness, thereby reducing the distance light rays 96 travel before exiting an outward-facing surface of the adjusted color filter layer 82G.

Moreover, the adjusted color filter layer 82G of FIG. 22 differs from the baseline color filter layer 82A of FIG. 10. In particular, the adjusted color filter layer 82G of the reduced thickness and uniform color filter cell footprint display panel 38G is thinner than the baseline color filter layer 82A of the baseline display panel 38A. For example, thickness of the adjusted color filter layer 82G of FIG. 22 may match thickness of the adjusted color filter layer 82B of FIG. 14 and, thus, differ from the baseline color filter cell thickness. In other words, thickness of the adjusted color filter layer 82G of the reduced thickness and uniform color filter cell footprint display panel 38G may be reduced from the baseline color filter cell thickness, thereby reducing the distance light rays 96 travel before exiting an outward-facing surface of the adjusted color filter layer 82G.

In addition to thickness, color filter cell footprint in the adjusted color filter layer 82G of the reduced thickness and uniform color filter cell footprint display panel 38G differs from color filter cell footprint in the baseline color filter layer 82A of the baseline display panel 38A. For example, color filter cell footprint in the adjusted color filter layer 82G of FIG. 22 may match color filter cell footprint in the adjusted color filter layer 82E of FIG. 18. In other words, footprint of color filter cells in the adjusted color filter layer 82G of the reduced thickness and uniform color filter cell footprint display panel 38G may be uniformly increased from the baseline color filter cell footprint.

As described above, at least in some instances, uniformly increasing color filter cell footprint may result in a color shift spike 130 occurring in a periphery region 72 of the field of view 62 of a user's eye 42. For example, with regard to the uniform color filter cell footprint display panel 38E of FIG. 18, a color shift spike 130 may occur in the periphery region 72 due to the uniformly increased color filter cell footprint increasing the distance the fourth light ray 96D emitted from the Nth red organic light-emitting diode (OLED) 90N travels through the central green color filter cell 88C. However, as depicted in the reduced thickness and uniform color filter cell footprint display panel 38G of FIG. 22, the reduced color filter cell thickness and the reduced encapsulation thickness may facilitate reducing the distance the fourth light ray 96D emitted from the Nth red organic light-emitting diode (OLED) 90N travels through the central green color filter cell 88C, which, at least in some instances, may facilitate reducing magnitude and/or likelihood of color shift spikes 130 and, thus, improving perceived quality of displayed image content.

Figure 23:
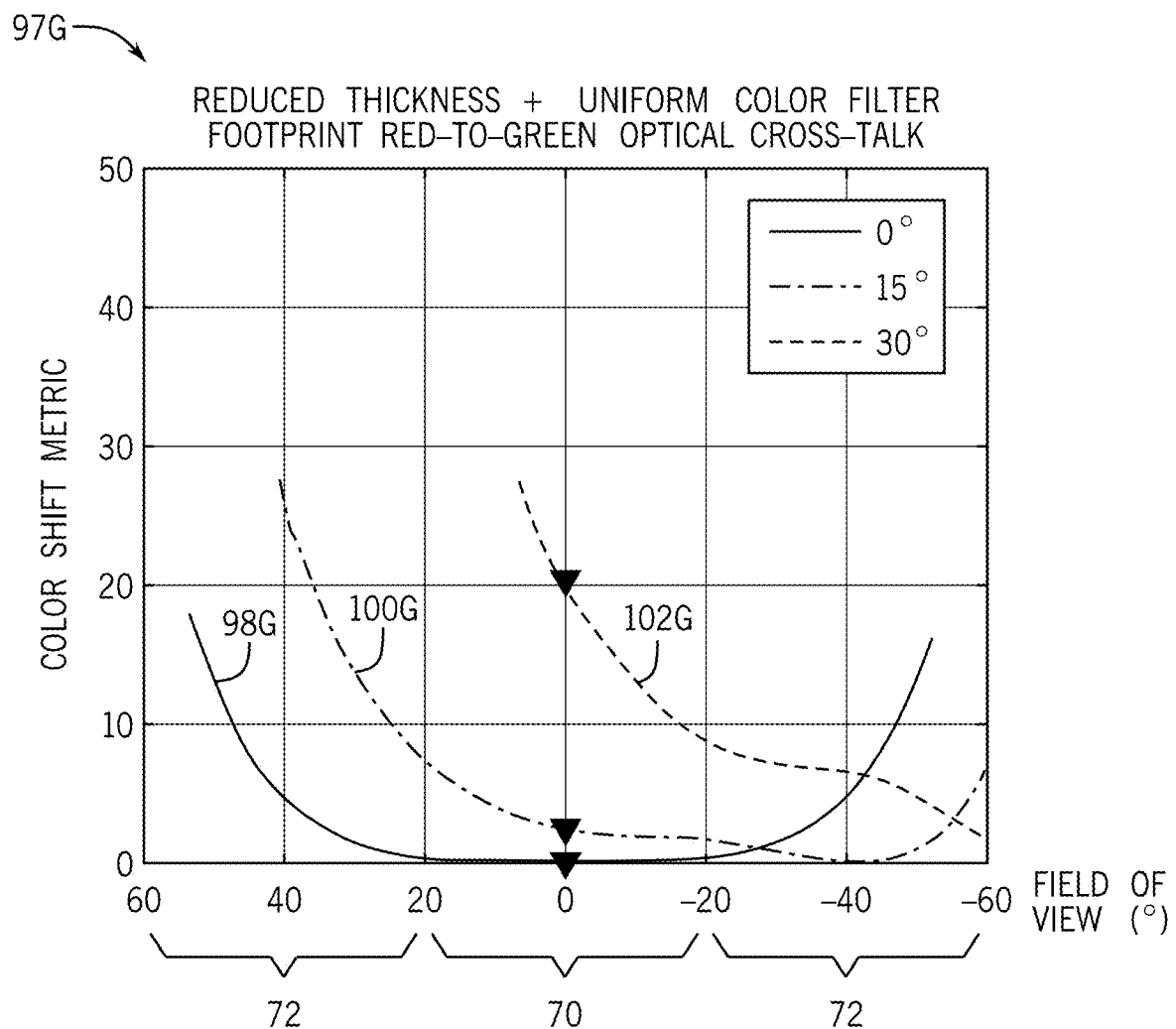
FIG. 23 is a plot illustrating color shift resulting from the reduced thickness uniform color filter cell footprint display panel of FIG. 22 when viewed from various viewing angles, in accordance with an embodiment of the present disclosure.

To help further illustrate, an example plot 97G, which describes perceivability of color shift resulting across a (e.g., apparent and/or local) field of view of a user's eye 42 when the reduced thickness and uniform color filter cell footprint display panel 38G of FIG. 22 is viewed using different sets of viewing characteristics, is shown in FIG. 23. In particular, the plot 97G includes a first curve 98G, which describes color shift perceivability resulting from a first set of viewing characteristics that includes a viewing angle of zero degrees, a second curve 100G, which describes color shift perceivability resulting from a second set of viewing characteristics that includes a viewing angle of fifteen degrees, and a third curve 102G, which describes color shift perceivability resulting from a third set of viewing characteristics that includes a viewing angle of thirty degrees. In other words, merely for illustrative purposes, the first set of viewing characteristics described in the plot 97G of FIG. 23 matches the first set of viewing characteristics described in the plot 97A of FIG. 11, the second set of viewing characteristics described in the plot 97G of FIG. 23 matches the second set of viewing characteristics described in the plot 97A of FIG. 11, and the third set of viewing characteristics described in the plot 97G of FIG. 23 matches the third set of viewing characteristics described in the plot 97A of FIG. 11.

As depicted, the different viewing angles may result in different color shift profiles. For example, similar to the first curve 98A of FIG. 11, as described by the first curve 98G of FIG. 23, minimal (e.g., no) color shift results in a focus region 70 of the field of view 62 and an increase in color shift occurs in in periphery regions 72 of the field of view 62 when the the reduced thickness and uniform color filter cell footprint display panel 38G is viewed with a viewing angle of zero degrees (e.g., first set of viewing characteristics). In fact, similar to the first curve 98D of FIG. 17 and the first curve 98E of FIG. 19, as described by the first curve 98G of FIG. 23, the reduced thickness and uniform color filter cell footprint display panel 38G may facilitate reducing color shift resulting in the periphery regions 72 of the field of view 62 compared to the baseline display panel 38A.

Nevertheless, similar to the second curve 100A of FIG. 11, as described by the second curve 100G of FIG. 23, color shift resulting in the focus region 70 of the field of view 62 increases when the reduced thickness and uniform color filter cell footprint display panel 38G is viewed with a viewing angle of fifteen degrees (e.g., second set of viewing characteristics). Additionally, similar to the third curve 102A of FIG. 11, as described by the third curve 102G of FIG. 23, color shift resulting in the focus region 70 of the field of view 62 further increases when the reduced thickness and uniform color filter cell footprint display panel 38G is viewed with a viewing angle of thirty degrees (e.g., third set of viewing characteristics). However, as described by the second curve 100G and the third curve 102G of FIG. 22, the reduced thickness and uniform color filter cell footprint display panel 38G may facilitate reducing color shift resulting in the field of view 62 compared to the baseline display panel 38A. Moreover, as described by the second curve 100G and the third curve 102G of FIG. 23, the reduced thickness and uniform color filter cell footprint display panel 38G may facilitate reducing color shift spikes 130 resulting in a periphery region of the field of view 62 compared to the uniform color filter cell footprint display panel 38E.

In this manner, adjusting one or more baseline (e.g., current) panel implementation parameters to adjust (e.g., reduce) color filter cell thickness, to adjust (e.g., reduce) encapsulation thickness, and to uniformly adjust (e.g., increase) color filter cell footprint may facilitate reducing perceivability of color shift resulting from optical cross-talk and, thus, improving perceived image quality provided by a display panel 38. However, at least in some instances, even when panel implementation parameters are adjusted in this manner, some amount of color shift resulting from optical cross-talk may nevertheless be perceivable in image content displayed on a display panel 38. As described above, an electronic display 12 may display image content on its display panel 38 by actively controlling light emission from display pixels 56 on the display panel 38 based on corresponding image data, for example, which is indicative of target characteristics (e.g., color and/or magnitude) of light emission therefrom. Thus, to facilitate improving perceived image quality provided by the electronic display 12, in some embodiments, an electronic device 10 may process image data to compensate for expected optical cross-talk and, thus, resulting color shift before processed (e.g., display) image data is supplied to the electronic display 12 to display corresponding image content, for example, via image processing circuitry 27.

Figure 24:
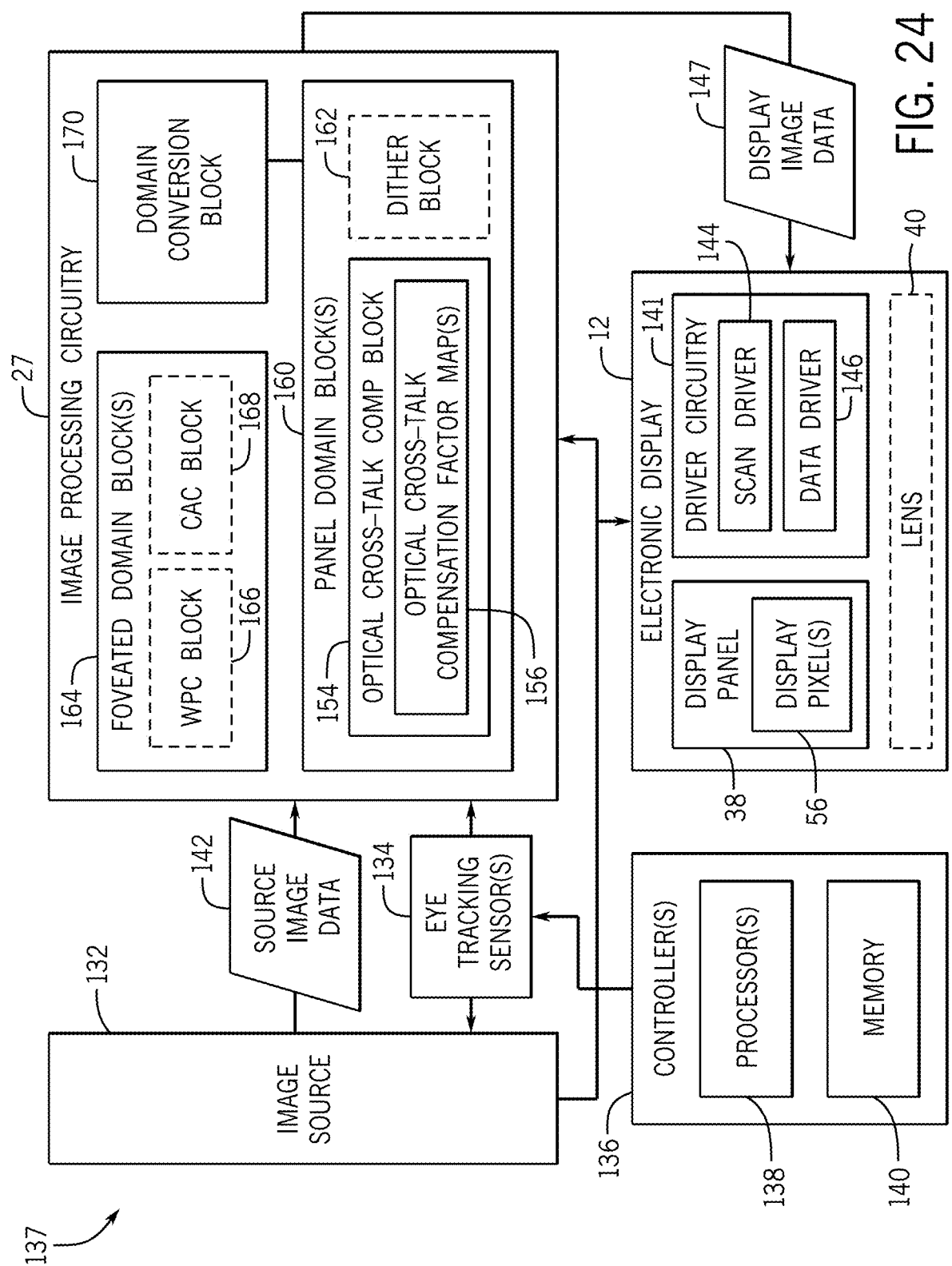
FIG. 24 is a block diagram of an example portion of the electronic device of FIG. 1 including an electronic display and image processing circuitry, in accordance with an embodiment of the present disclosure.

To help illustrate, an example of a portion 137 of an electronic device 10, which includes image processing circuitry 27, is shown in FIG. 24. As in the depicted example, the image processing circuitry 27 may be communicatively coupled between an image source 132 and an electronic display 12. Additionally, as in the depicted example, the image processing circuitry 27 and/or the image source 132 may be communicatively coupled to one or more eye tracking sensors (e.g., cameras) 134.

As will be described in more detail below, in some embodiments, an eye tracking sensor 134 may output viewing characteristic parameters indicative of viewing characteristics with which a user's eye 42 is viewing or is expected to view a display panel 38 of the electronic display 12. For example, the viewing characteristic parameters may indicate a horizontal (e.g., x-direction 54) offset of the eye's pupil 68 from a default (e.g., forward facing) pupil position and a vertical (e.g., y-direction 52) offset of the eye's pupil 68 from the default pupil position and, thus, may be indicative of expected viewing angle. Additionally or alternatively, the viewing characteristic parameters may indicate a pupil relief (e.g., distance from pupil 68 to display panel 38) and, thus, may be indicative of expected viewing location. Furthermore, as in the depicted example, the image processing circuitry 27 may be communicatively coupled to one or more controllers (e.g., control circuitry) 136. However, it should be appreciated that the depicted example is merely intended to illustrative and not limiting.

In some embodiments, a controller 136 may generally control operation of the image source 132, the image processing circuitry 27, the electronic display 12, the one or more eye tracking sensors 134 or any combination thereof. Although depicted as a single controller 136, in other embodiments, one or more separate controllers 136 may be used to control operation of the image source 132, the image processing circuitry 27, the electronic display 12, the one or more eye tracking sensors 134, or any combination thereof. To facilitate controlling operation, as in the depicted example, the controller 136 may include one or more controller processors (e.g., processing circuitry) 138 and controller memory 140.

In some embodiments, a controller processor 138 may be included in the processor core complex 18 and/or separate processing circuitry and the controller memory 140 may be included in main memory 20, a storage device 22, and/or a separate, tangible, non-transitory computer-readable medium. Additionally, in some embodiments, a controller processor 138 may execute instructions and/or process data stored in the controller memory 140 to control operation of the image source 132, the image processing circuitry 27, the electronic display 12, and/or the one or more eye tracking sensors 134. In other embodiments, the controller processor 138 may be hardwired with instructions that, when executed, control operation of the image processing circuitry 27, the electronic display 12, the one or more eye tracking sensors 134, and/or the image source 132.

Generally, the image source 132 may be implemented and/or operated to generate source (e.g., input or original) image data 142 corresponding with image content to be displayed on the display panel 38 of the electronic display 12. Thus, in some embodiments, the image source 132 may be included in the processor core complex 18, a graphics processing unit (GPU), an image sensor (e.g., camera), and/or the like. Additionally, in some embodiments, the source image data 142 may be stored in the electronic device 10 before supply to the image processing circuitry 27, for example, in main memory 20, a storage device 22, and/or a separate, tangible, non-transitory computer-readable medium. In fact, as well be described in more detail below, to facilitate conserving (e.g., optimizing) storage capacity of the electronic device 10, in some embodiments, the source image data 142 may be stored and/or supplied to the image processing circuitry 27 in a foveated (e.g., compressed or grouped) domain, which utilizes a pixel resolution different from (e.g., lower than) a panel (e.g., native or non-foveated) domain of the display panel 38.

As described above, a display panel 38 of an electronic display 12 may include one or more display pixels 56, which each include one or more color component sub-pixels. For example, each display pixel 56 implemented on the display panel 38 may include a red sub-pixel 74, a blue sub-pixel 78, and a green sub-pixel 76. As another example, the display panel 38 may include a first set (e.g., half) of display pixels 56, which each include a red sub-pixel 74 and a green sub-pixel 76, and a second set (e.g., half) of display pixels 56, which each includes a blue sub-pixel 78 and a green sub-pixel 76. In some embodiments, one or more display pixel 56 on the display panel 38 may additionally or alternatively include a white sub-pixel.

As described above, an electronic display 12 may display image content on its display panel 38 by appropriately controlling light emission from display pixels (e.g., color component sub-pixels) 56 implemented thereon. Generally, light emission from a display pixel (e.g., color component sub-pixel) 56 may vary with the magnitude of electrical energy stored therein. For example, in some instances, a display pixel 56 may include a light-emissive element, such as an organic light-emitting diode (OLED), that varies its light emission with current flow therethrough, a current control switching device (e.g., transistor) coupled between the light-emissive element and a pixel power (e.g., $V_{DD}$) supply rail, and a storage capacitor coupled to a control (e.g., gate) terminal of the current control switching device. As such, varying the amount of energy stored in the storage capacitor may vary voltage applied to the control terminal of the current control switching device and, thus, magnitude of electrical current supplied from the pixel power supply rail to the light-emissive element of the display pixel 56.

However, it should be appreciated that discussion with regard to OLED examples are merely intended to be illustrative and not limiting. In other words, the techniques described in the present disclosure may be applied to and/or adapted for other types of electronic displays 12, such as a liquid crystal display (LCD) 12 and/or a micro light-emitting diode (LED) electronic displays 12. In any case, since light emission from a display pixel 56 generally varies with electrical energy storage therein, to display an image, an electronic display 12 may write a display pixel 56 at least in part by supplying an analog electrical (e.g., voltage and/or current) signal to the display pixel 56, for example, to charge and/or discharge a storage capacitor in the display pixel 56.

To facilitate selectively writing its display pixels 56, as in the depicted example, the electronic display 12 may include driver circuitry 141, which includes a scan driver 144 and a data driver 146. In particular, the electronic display 12 may be implemented such that each of its display pixels 56 is coupled to the scan driver 144 via a corresponding scan line and to the data driver 146 via a corresponding data line. Thus, to write a row of display pixels 56, the scan driver 144 may output an activation (e.g., logic high) control signal to a corresponding scan line that causes each display pixel 56 coupled to the scan line to electrically couple its storage capacitor to a corresponding data line. Additionally, the data driver 146 may output an analog electrical signal to each data line coupled to an activated display pixel 56 to control the amount of electrical energy stored in the display pixel 56 and, thus, resulting light emission (e.g., perceived luminance and/or perceived brightness).

As described above, image data corresponding with image content be indicative of target visual characteristics (e.g., luminance and/or color) at one or more specific points (e.g., image pixels) in the image content, for example, by indicating color component brightness (e.g., grayscale) levels that are scaled by a panel brightness setting. In other words, the image data may correspond with a pixel position on a display panel and, thus, indicate target luminance of at least a display pixel 56 implemented at the pixel position. For example, the image data may include red component image data indicative of target luminance of a red sub-pixel 74 in the display pixel 56, blue component image data indicative of target luminance of a blue sub-pixel 78 in the display pixel 56, green component image data indicative of target luminance of a green sub-pixel 76 in the display pixel 56, white component image data indicative of target luminance of a white sub-pixel in the display pixel 56, or any combination thereof. As such, to display image content, the electronic display 12 may control supply (e.g., magnitude and/or duration) of analog electrical signals from its data driver 146 to its display pixels 56 based at least in part on corresponding image data.

However, to facilitate improving perceived image quality, image processing circuitry 27 may be implemented and/or operated to process (e.g., adjust) image data before the image data is used to display a corresponding image on the electronic display 12. Thus, in some embodiments, the image processing circuitry 27 may be included in the processor core complex 18, a display pipeline (e.g., chip or integrated circuit device), a timing controller (TCON) in the electronic display 12, or any combination thereof. Additionally or alternatively, the image processing circuitry 27 may be implemented as a system-on-chip (SoC).

As in the depicted example, the image processing circuitry 27 may be implemented and/or operated to process the source image data 142 output from the image source 132. In some embodiments, the image processing circuitry 27 may directly receive the source image data 142 from the image source 132. Additionally or alternatively, the source image data 142 output from the image source 132 may be stored in a tangible, non-transitory, computer-readable medium, such as main memory 20, and, thus, the image processing circuitry 27 may receive (e.g., retrieve) the source image data 142 from the tangible, non-transitory, computer-readable medium, for example, via a direct memory access (DMA) technique.

The image processing circuitry 27 may then process the source image data 142 to generate display (e.g., processed or output) image data 147, for example, which adjusts target luminances to compensate for expected optical cross-talk and, thus, resulting color shift. As described above, to facilitate conserving (e.g., optimizing) storage capacity of the electronic device 10, in some embodiments, the source image data 142 received by the image processing circuitry 27 may be indicated in a foveated (e.g., compressed or grouped) domain, which utilizes a pixel resolution different from (e.g., lower than) a panel (e.g., native or non-foveated) domain of the display panel 38. In particular, in the foveated domain, an image frame may be divided in multiple foveation regions (e.g., tiles) in which different pixel resolutions are utilized.

Figure 25:
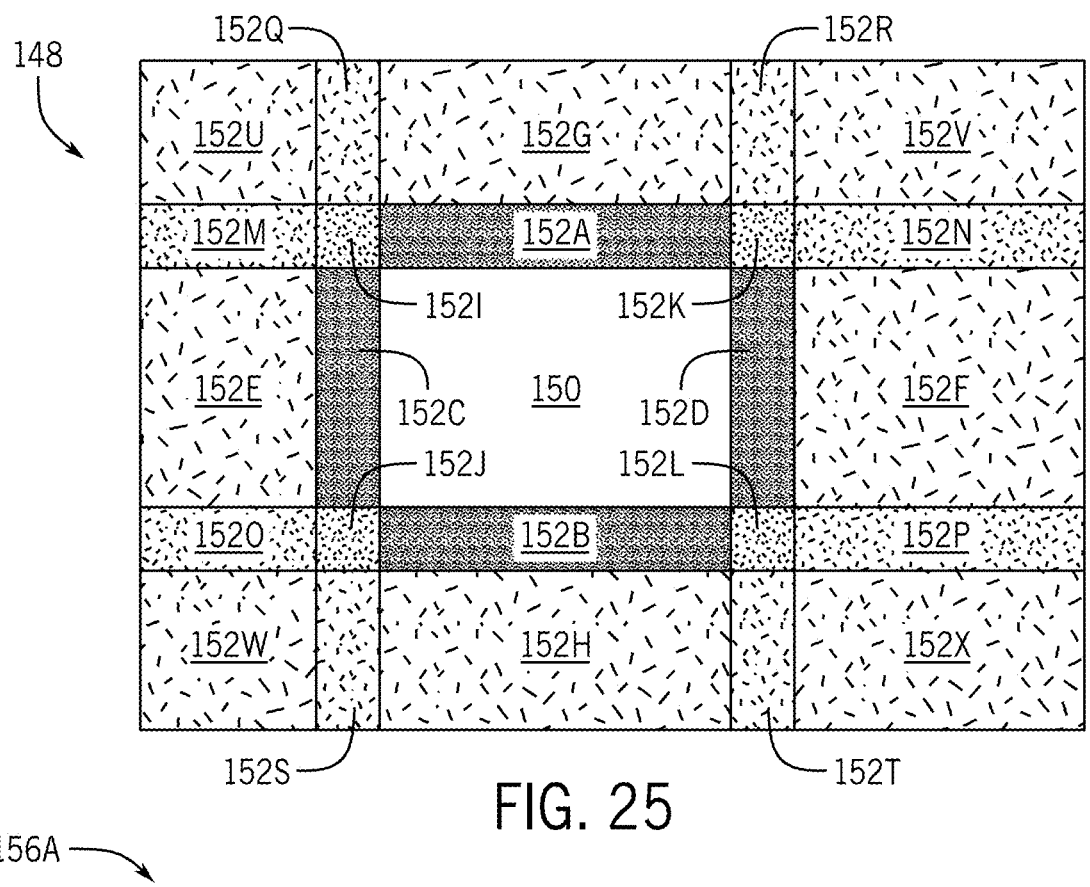
FIG. 25 is a diagrammatic representation of example image frame divided into multiple foveation regions, in accordance with an embodiment of the present disclosure.

To help illustrate, an example of an image frame 148 divided into multiple foveation regions is shown in FIG. 25. As depicted, a central foveation region 150 is identified in the image frame 148. Additionally, as depicted, multiple outer foveation regions 152 outside of the central foveation region 150 are identified in the image frame 148.

In some embodiments, the central foveation region 150 and one or more outer foveation regions 152 may be identified based at least in part on a field of view (FOV) 62 with which a display panel 38 to be used to display the image frame 148 is expected to be viewed and, thus, based at least in part on viewing characteristics (e.g., viewing angle and/or viewing location) with which the display panel 38 is expected to be viewed, for example, indicated by one or more viewing characteristic parameters received from an eye tracking sensor 134. In particular, in such embodiments, the central foveation region 150 may be identified in the image frame 148 such that the central foveation region 150 is co-located with a focus region 70 of the field of view 62 while an outer foveation region 152 is identified in the image frame 148 such that the outer foveation region 152 is co-located with a periphery region of the field of view 62. In other words, the depicted example may be identified when the focus region 70 of the field of view 62 is expected to be centered on a central portion 48C of the display panel 38.

However, at least in such embodiments, a change in viewing characteristics may change the field of view 62 and, thus, characteristics (e.g., size, location, and/or pixel resolution) of foveation regions identified in an image frame 148. In other words, it should be appreciated that the depicted example is merely intended to be illustrative and not limiting. For example, a change in viewing angle that moves the focus region 70 toward a first side portion 48A of the display panel 38 may result in the central foveation region 150 being shifted toward the right and/or top of the image frame 148 while a change in viewing angle that moves the focus region 70 toward a second side portion 48B of the display panel 38 may result in the central foveation region 150 being shifted toward the left and/or bottom of the image frame 148. Additionally or alternatively, a change in viewing location that increases size of the focus region 70 may result in size of central foveation region 150 being expanded (e.g., increased), while a change in viewing location that decreases size of the focus region 70 may result in size of central foveation region 150 being contracted (e.g., decreased or reduced).

As described above, a user's eye 42 is generally more sensitive to visible light in the focus region 70 of its field of view 62. As such, to facilitate improving perceived image quality, in some embodiments, the pixel resolution used in the central foveation region 150 may maximize pixel resolution implemented on the display panel 38. In other words, in some embodiments, the central foveation region 150 may utilize a pixel resolution that matches the (e.g., full) pixel resolution of the display panel 38. That is, in such embodiments, each image pixel (e.g., image data corresponding with point in image) in the central foveation region 150 of the image frame 148 may correspond with single display pixel (e.g., set of one or more color component sub-pixels) 56 implemented on the display panel 38. For example, red component image data of the image pixel in the central foveation region 150 may corresponding with one or more red sub-pixels 74 in the display pixel 56, green component image data of the image pixel in the central foveation region 150 may correspond with one or more green sub-pixels 76 in the display pixel 56, and blue component image data of the image pixel in the central foveation region 150 may correspond with one or more blue sub-pixels 78 in the display pixel 56. Additionally or alternatively, white component image data of the image pixel in the central foveation region 150 may corresponding with one or more white sub-pixels in the display pixel 56.

On the other hand, as described above, a user's eye 42 is generally less sensitive to visible light in a periphery region 72 outside the focus region 70 of its field of view 62. Leveraging the reduced sensitivity, in some embodiments, each outer foveation region 152 in the image frame 148 may utilize a pixel resolution lower than the pixel resolution of the central foveation region 150 and, thus, the (e.g., full) pixel resolution of the display panel 38. In other words, in such embodiments, each image pixel (e.g., image data corresponding with point in image) in an outer foveation region 152 of the image frame 148 may correspond with multiple display pixels (e.g., sets of one or more color component sub-pixels) 56 implemented on the display panel 38.

In fact, sensitivity to visible light of a user's eye 42 may vary outside the focus region 70 of its field of view 62. For example, the user's eye 42 may be more sensitive to visible light in a first periphery region 72 closer to the focus region 70 of its field of view 62. On the other hand, the user's eye 42 may be less sensitive to visible light in a second periphery region 72 farther from the focus region 70 of its field of view 62.

To facilitate accounting for variation in sensitivity to visible light outside the focus region 70, in some embodiments, different outer foveation regions 152 identified in the image frame 148 may utilize different pixel resolutions. In particular, in such embodiments, an outer foveation region 152 closer to the central foveation region 150 may utilize a higher pixel resolution. On the other hand, in such embodiments, an outer foveation region 152 farther from the central foveation region 150 may utilize a lower pixel resolution.

Merely as an illustrative example, a first set of outer foveation regions 152 may include each outer foveation region 152 directly adjacent and outside the central foveation region 150. In other words, with regard to the depicted example, the first set of outer foveation regions 152 may include a first outer foveation region 152A, a second outer foveation region 152B, a third outer foveation region 152C, and a fourth outer foveation region 152D. Due to proximity to the central foveation region 150, in some embodiments, each outer foveation region 152 in the first set of outer foveation regions 152 may utilize a pixel resolution that is half the pixel resolution of the central foveation region 150 and, thus, the (e.g., full) pixel resolution of the display panel 38. In other words, in such embodiments, each image pixel (e.g., image data corresponding with point in image) in the first set of outer foveation regions 152 may correspond with two display pixels (e.g., sets of one or more color component sub-pixels) 56 implemented on the display panel 38.

Additionally, merely as an illustrative example, a second set of outer foveation regions 152 may include each outer foveation region 152 directly adjacent and outside the first set of outer foveation regions 152. In other words, with regard to the depicted example, the second set of outer foveation regions 152 may include a fifth outer foveation region 152E, a sixth outer foveation region 152F, a seventh outer foveation region 152G, an eighth outer foveation region 152H, a ninth outer foveation region 152I, a tenth outer foveation region 152J, an eleventh outer foveation region 152K, and a twelfth outer foveation region 152L. Due to being located outside of the first set of outer foveation regions 152, in some embodiments, each outer foveation region 152 in the second set of outer foveation regions 152 may utilize a pixel resolution that is half the pixel resolution of the first set of outer foveation regions 152 and, thus, a quarter of the pixel resolution of the central foveation region 150 and the display panel 38. In other words, in such embodiments, each image pixel (e.g., image data corresponding with point in image) in the second set of outer foveation regions 152 may correspond with four display pixels (e.g., sets of one or more color component sub-pixels) 56 implemented on the display panel 38.

Furthermore, merely as an illustrative example, a third set of outer foveation regions 152 may include each outer foveation region 152 directly adjacent and outside the second set of outer foveation regions 152. In other words, with regard to the depicted example, the third set of outer foveation regions 152 may include a thirteenth outer foveation region 152M, a fourteenth outer foveation region 152N, a fifteenth outer foveation region 152O, a sixteenth outer foveation region 152P, a seventeenth outer foveation region 152Q, an eighteenth outer foveation region 152R, a nineteenth outer foveation region 152S, and a twentieth outer foveation region 152T. Due to being located outside of the second set of outer foveation regions 152, in some embodiments, each outer foveation region 152 in the third set of outer foveation regions 152 may utilize a pixel resolution that is half the second set of outer foveation regions 152 and, thus, an eighth of the pixel resolution of the central foveation region 150 and the display panel 38. In other words, in such embodiments, each image pixel (e.g., image data corresponding with point in image) in the third set of outer foveation regions 152 may correspond with eight display pixels (e.g., sets of one or more color component sub-pixels) 56 implemented on the display panel 38.

Moreover, merely as an illustrative example, a fourth set of outer foveation regions 152 may include each outer foveation region 152 directly adjacent and outside the third set of outer foveation regions 152. In other words, with regard to the depicted example, the second set of outer foveation regions 152 may include a twenty-first outer foveation region 152U, a twenty-second outer foveation region 152V, a twenty-third outer foveation region 152W, and a twenty-fourth outer foveation region 152X. Due to being located outside of the third set of outer foveation regions 152, in some embodiments, each outer foveation region 152 in the fourth set of outer foveation regions 152 may utilize a pixel resolution that is half the pixel resolution of the third set of outer foveation regions 152 and, thus, a sixteenth of the pixel resolution of the central foveation region 150 and the display panel 38. In other words, in such embodiments, each image pixel (e.g., image data corresponding with point in image) in the fourth set of outer foveation regions 152 may correspond with sixteen display pixels (e.g., sets of one or more color component sub-pixels) 56 implemented on the display panel 38.

Returning to the image processing circuitry 27 of FIG. 24, as described above, the image processing circuitry 27 may process source image data 142 to determine display image data 147, which may then be supplied to the electronic display 12 to display corresponding image content. As in the depicted example, in some embodiments, the image processing circuitry 27 may be organized into one or more image processing blocks (e.g., circuitry groups). For example, the image processing circuitry 27 may include an optical cross-talk compensation (OXTC) block 154, which is implemented and/or operated to process image data to facilitate compensating for perceivable color shift resulting from optical cross-talk between different colored sub-pixels on the display panel 38. As in the depicted example, to facilitate compensating for resulting color shift, the optical cross-talk compensation block 154 may include and/or utilize one or more optical cross-talk compensation (OXTC) factor maps 156.

Figure 26:
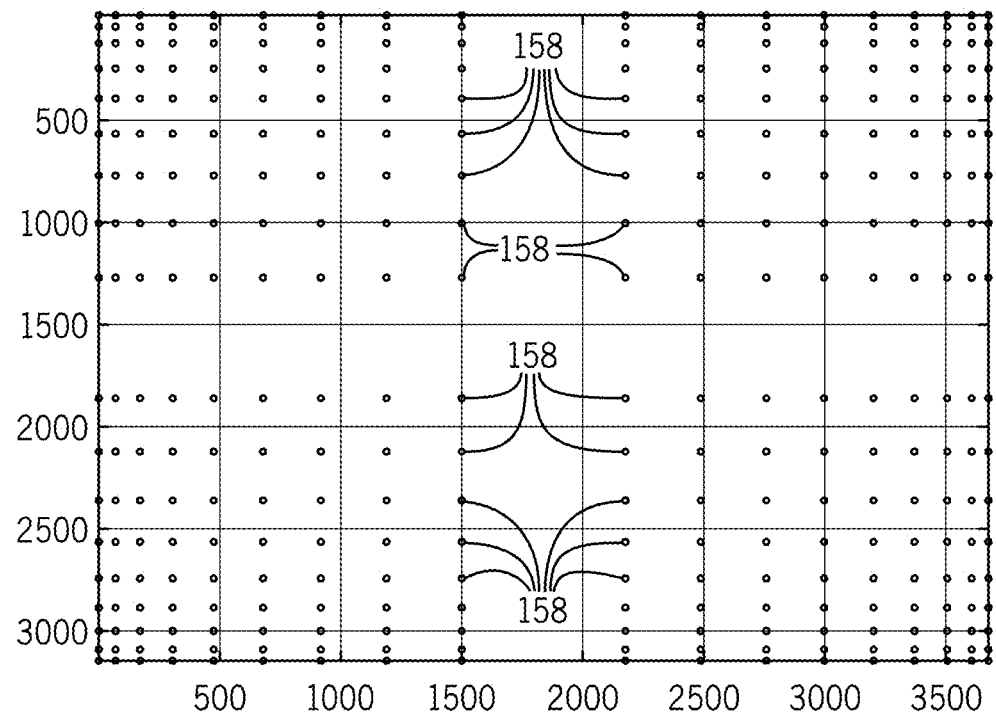
FIG. 26 is a diagrammatic representation of an example optical cross talk compensation factor map used by the image processing circuitry of FIG. 24, in accordance with an embodiment of the present disclosure.

An example of optical cross-talk compensation factor map 156A, which may be used by image processing circuitry 27 in an electronic device 10, is shown in FIG. 26. As depicted, the optical cross-talk compensation factor map 156A may explicitly identify one or more pixel positions 158 on a display panel 38. In particular, the optical cross-talk compensation factor map 156A may explicitly associate each identified pixel position 158 with one or more optical cross-talk compensation (OXTC) factors to be applied to image data corresponding with a display pixel 56 at the pixel position 158.

In fact, to facilitate compensating for optical cross-talk between neighboring color component sub-pixels on the display panel 38, in some embodiments, an optical cross-talk compensation factor map 156 may explicitly associate a pixel position 158 with a set of multiple optical cross-talk compensation factors. For example, the optical cross-talk compensation factors associated with a pixel position 158 may be indicated by a three-by-three matrix as follows:

$$\begin{bmatrix} F_R & F_{R2G} & F_{R2B} \\ F_{G2R} & F_G & F_{G2B} \\ F_{B2R} & F_{B2G} & F_B \end{bmatrix}$$

in which FR is a red optical cross-talk compensation factor, $F_{R2G}$ is a red-to-green optical cross-talk compensation factor, $F_{R2B}$ is a red-to-blue optical cross-talk compensation factor, $F_{G2R}$ is a green-to-red optical cross-talk compensation factor, $F_G$ a green optical cross-talk compensation factor, $F_{G2B}$ a green-to-blue optical cross-talk compensation factor, $F_{B2R}$ is a blue-to-red optical cross-talk compensation factor, $F_{B2G}$ is a blue-to-green optical cross-talk compensation factor, and FB a blue optical cross-talk compensation factor. In such embodiments, when input image data associated with the pixel position is received, the optical cross-talk compensation block 154 may apply each of the multiple optical cross-talk compensation factors to the input image data, for example, by multiplying the three-by-three matrix with a three-by-one matrix (e.g., vector) including red component input image data, green component input image data, and blue component input image data.

Thus, in some embodiments, an optical cross-talk compensation factor may include a gain value, which when applied to image data, scales a target color component grayscale level indicated in the image data. Additionally or alternatively, an optical cross-talk compensation factor may include an offset value, which when applied to image data, biases a target color component grayscale level indicated in the image data. Furthermore, in some embodiments, an optical cross-talk compensation factor map 156 to be used by image processing circuitry 27 in an electronic device 10 may be stored in the electronic device 10, for example, in main memory 20, a storage device 22, internal memory of the image processing circuitry 27, and/or another tangible, non-transitory, computer-readable medium.

Thus, to facilitate conserving (e.g., optimizing) storage capacity of the electronic device 10, as in the depicted example, the optical cross-talk compensation factor map 156A may explicitly identify a subset of pixel positions 158 on the display panel 38. In other words, in such embodiments, one or more pixel positions 158 and, thus, corresponding optical cross-talk compensation factors may not be explicitly identified in the optical cross-talk compensation factor map 156A. In such embodiments, when input image data associated a pixel position 158 that is not explicitly identified in the optical cross-talk compensation factor map 156A is received, the optical cross-talk compensation block 154 may determine one or more optical cross-talk compensation factors to be applied to the image data by interpolating factors associated with other pixel positions 158 explicitly identified in the optical cross-talk compensation factor map 156, for example, using linear interpolation, bi-linear interpolation, spline interpolation, and/or the like. Merely as an illustrative example, the optical cross-talk compensation block 154 may determine a red optical cross-talk compensation factor by interpolating red optical cross-talk compensation factors explicitly indicated in the optical cross-talk compensation factor map 156, a red-to-green optical cross-talk compensation factor by interpolating red-to-green optical cross-talk compensation factors explicitly indicated in the optical cross-talk compensation factor map 156, and so on.

In other words, returning to the image processing circuitry 27 of FIG. 24, the optical cross-talk compensation block 154 may be a panel domain block 160 that operates using a panel (e.g., native) domain of the display panel 38. That is, a panel domain block 160 in the image processing circuitry 27 may process image data using the pixel resolution of the display panel 38. As in the depicted example, the panel domain blocks 160 may additionally include a dither block 162, for example, which is implemented and/or operated to process image data to introduce structured noise in corresponding image content.

However, to facilitate improving processing efficiency, in some embodiments, the image processing circuitry 27 may additionally process image data at least in part in a foveated (e.g., grouped or compressed) domain, for example, used by the source image data 142. In other words, as in the depicted example, the image processing circuitry 27 may include one or more foveated domain blocks 164 that operate using the foveated domain. For example, the foveated domain blocks 164 may include a white point compensation (WPC) block 166 and/or a chromatic aberration compensation (CAC) block 168 that processes image data using a pixel resolution lower than the (e.g., full) pixel resolution of the display panel 38, which, at least in some instances, may facilitate reducing the amount of image data processed by the foveated domain blocks 164 and, thus, improving processing efficiency of the image processing circuitry 27.

To facilitate interoperation between the foveated domain blocks 164 and the panel domain blocks 160, as in the depicted example, the image processing circuitry 27 may include a domain conversion block (e.g., circuitry group) 170 coupled therebetween. In particular, the domain conversion block 170 may be implemented and/or operated to convert between the foveated (e.g., grouped and/or compressed) domain and the panel (e.g., native) domain of the display panel 38. In other words, the domain conversion block 170 may convert image data between a pixel resolution used in a corresponding foveation region and the (e.g., full) pixel resolution of the display panel 38. For example, when the pixel resolution used in a central foveation region 150 matches the pixel resolution of the display panel 38, image data (e.g., image pixels) corresponding with the central foveation region 150 may pass through the domain conversion block 170 unchanged.

On the other hand, when the pixel resolution of an outer foveation region 152 is lower than the pixel resolution of the display panel 38, the domain conversion block 170 may convert image data (e.g., image pixels) corresponding with the outer foveation region 152 from the lower pixel resolution to the pixel resolution of the display panel 38 at least in part by outputting multiple instances of the image data. For example, the domain conversion block 170 may convert image data corresponding with a first set of outer foveation regions 152, which utilize a pixel resolution that is half the pixel resolution of the display panel 38, to the panel domain by outputting two instances of the image data such that a first instance is associated with a first display pixel 56 and a second instance is associated with a second display pixel 56. Additionally, the domain conversion block 170 may convert image data corresponding with a second set of outer foveation regions 152, which utilize a pixel resolution that is a quarter of the pixel resolution of the display panel 38, to the panel domain by outputting four instances of the image data. Furthermore, the domain conversion block 170 may convert image data corresponding with a third set of outer foveation regions 152, which utilize a pixel resolution that is an eighth of the pixel resolution of the display panel 38, to the panel domain by outputting eight instances of the image data. Moreover, the domain conversion block 170 may convert image data corresponding with a fourth set of outer foveation regions 152, which utilize a pixel resolution that is a sixteenth of the pixel resolution of the display panel 38, to the panel domain by outputting sixteen instances of the image data. Since the source image data 142 may be received in the foveated domain, as in the depicted example, the foveated domain blocks 164 may be implemented upstream relative to the domain conversion block 170 and the domain conversion block 170 may be implemented upstream relative to the panel domain blocks 160.

Figure 27:
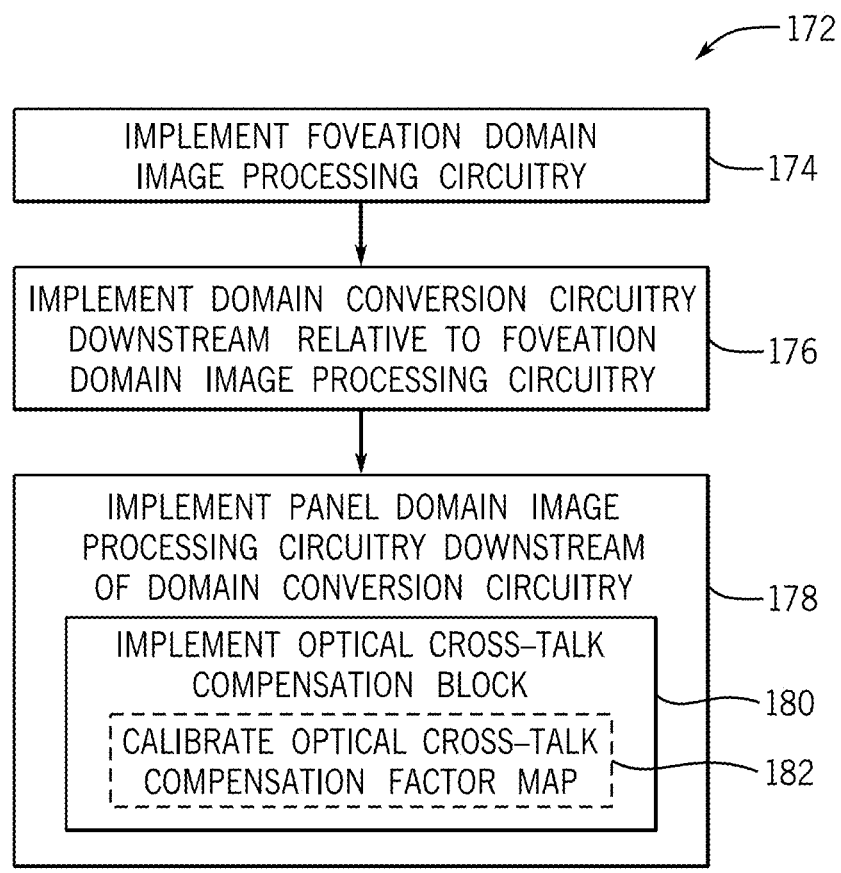
FIG. 27 is a flow diagram of an example process for implementing the image processing circuitry of FIG. 24, in accordance with an embodiment of the present disclosure.

To help further illustrate, an example of a process 172 for implementing (e.g., manufacturing) image processing circuitry 27, which may be deployed in an electronic device 10, is described in FIG. 27. Generally, the process 172 includes implementing foveated domain image processing circuitry (process block 174) and implementing domain conversion circuitry downstream relative to the foveation domain image processing circuitry (process block 176). Additionally, the process 172 includes implementing panel domain image processing circuitry downstream relative to the domain conversion circuitry (process block 178).

Although described in a particular order, which represents a particular embodiment, it should be noted that the manufacturing process 172 may be performed in any suitable order. Additionally, embodiments of the manufacturing process 172 may omit process blocks and/or include additional process blocks. Moreover, in some embodiments, the manufacturing process 172 may be performed at least in part by a manufacturing system (e.g., one or more devices).

As described above, image processing circuitry 27 implemented in an electronic device 10 may include one or more foveated domain blocks (e.g., circuitry groups) 164, which each operate using a pixel resolution of a foveated domain that is less than the pixel resolution of a display panel 38 used by the electronic device 10. Thus, in some embodiments, implementing foveated domain image processing circuitry may include implementing one or more foveated domain blocks 164 in the image processing circuitry 27 (process block 174). For example, implementing the foveation domain image processing circuitry may include implementing a white point compensation (WPC) block 166 and/or a chromatic aberration compensation (CAC) block 168 in the image processing circuitry 27.

Additionally, as described above, image processing circuitry 27 implemented in an electronic device 10 may include one or more panel domain blocks (e.g., circuitry groups) 160, which each operate using a pixel resolution that matches the pixel resolution of a display panel 38 used by the electronic device 10. Thus, in some embodiments, implementing panel domain image processing circuitry may include implementing one or more panel domain blocks 160 in the image processing circuitry 27 (process block 178). For example, implementing the panel domain image processing circuitry may include implementing an optical cross-talk compensation (OXTC) block 154 in the image process circuitry 27 (process block 180).

As described above, an optical cross-talk compensation block 154 may process image data using an optical cross-talk compensation (OXTC) factor map 156 to facilitate compensating for optical cross-talk between neighboring (e.g., differently colored) color component sub-pixels on a display panel 38 and, thus, resulting color shift. However, as described above, perceivability of color shift resulting from optical cross talk may vary with viewing characteristics, such as viewing (e.g., pupil or gaze) angle and/or viewing location (e.g., pupil offset from center and/or pupil relief). Accordingly, in some embodiments, implementing the optical cross-talk compensation block 154 may include calibrating an optical cross-talk compensation factor map 156 to be used by the optical cross-talk compensation block 154 (process block 182).

For example, in some embodiments, a single (e.g., static) optical cross-talk compensation factor map 156 may be calibrated to a display panel 38 to account for multiple different sets of viewing characteristics. To facilitate improving efficacy of optical cross-talk compensation, in other embodiments, the optical cross-talk compensation block 154 may include and/or have access to multiple candidate optical cross-talk compensation factor maps 156, which are each calibrated for a different set of viewing characteristics. In other words, in such embodiments, the optical cross-talk compensation block 154 may select a different candidate optical cross-talk compensation factor maps as a target candidate optical cross-talk compensation factor map under different sets of viewing characteristics and, thus, adaptively adjust processing of input image data.

Figure 28:
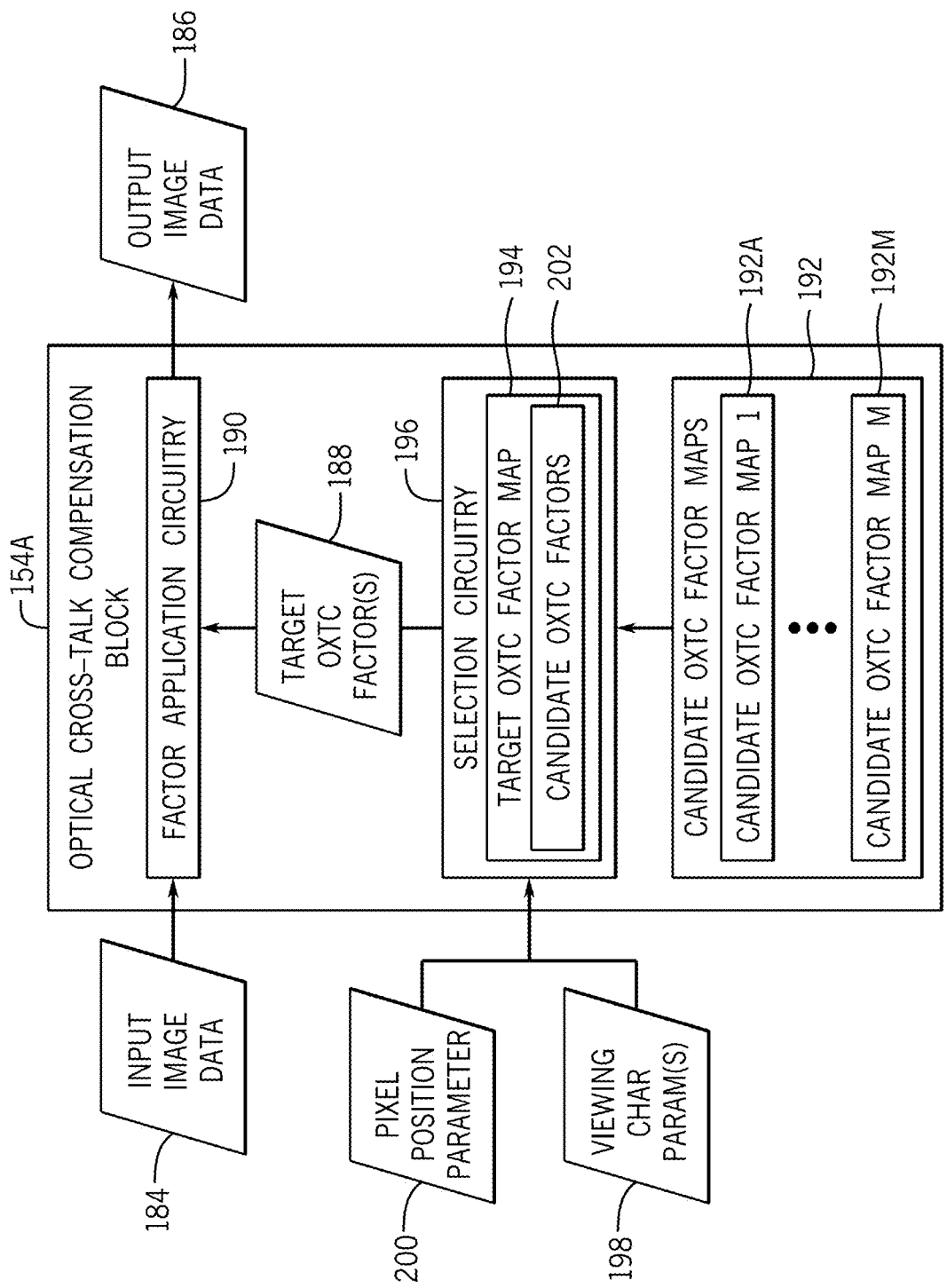
FIG. 28 is a block diagram of an example optical cross-talk compensation (OXTC) block that may be implemented in the image processing circuitry of FIG. 24, in accordance with an embodiment of the present disclosure.

To help illustrate, an example of an optical cross-talk compensation block 154A, which may be implemented (e.g., deployed) in image processing circuitry 27 of an electronic device 10, is shown in FIG. 28. As depicted, the optical cross-talk compensation block 154A receives input image data 184. In some embodiments, the input image data 184 may be source image data 142 output from an image source 132. In other embodiments, upstream image processing circuitry may process the source image data 142 and supply the input image data 184 to the optical cross-talk compensation block 154.

Additionally, as in the depicted example, the optical cross-talk compensation block 154A may process the input image data 184 to determine (e.g., generate) output image data 186. In some embodiments, the output image data 186 may be display image data 147, which will be supplied to an electronic display 12 to enable the electronic display 12 to display corresponding image content. In other embodiments, the output image data 186 may be supplied to downstream image processing circuitry 27, such as a dither block 162, for further processing to determine the display image data 147.

As described above, image data may include color component image data indicative of target light emission magnitude of one or more specific color components. For example, the input image data 184 may include red component input image data 184, blue component input image data 184, green component input image data 184, and/or white component input image data 184. Accordingly, the output image data 186 determined by processing the input image data 184 may include red component output image data 186, blue component output image data 186, green component output image data 186, and/or white component output image data 186.

To determine the output image data 186, the optical cross-talk compensation block 154A may apply one or more target optical cross-talk compensation (OXTC) factors 188 to the input image data 184. In particular, as in the depicted example, the optical cross-talk compensation block 154A may include factor application circuitry 190 that receives the input image data 184 and applies the one or more target pixel uniformity compensation factors 188 to the input image data 184 to determine the output image data 186. In some embodiments, different target pixel uniformity compensation factors 188 may be applied to different color components in the input image data 184.

Merely as an illustrative example, the factor application circuitry 190 may apply a target red optical cross-talk compensation factor 188, a target green-to-red optical cross-talk compensation factor 188, and target blue-to-red optical cross-talk compensation factor 188 to red component input image data 184. Additionally, the factor application circuitry 190 may apply a target red-to-green optical cross-talk compensation factor 188, a target green optical cross-talk compensation factor 188, and a target blue-to-green optical cross-talk compensation factor 188 to the green component input image data 184. Furthermore, factor application circuitry 190 may apply a target red-to-blue optical cross-talk compensation factor 188, a target green-to-blue optical cross-talk compensation factor 188, and a target blue optical cross-talk compensation factor 188 to blue component input image data 184.

Moreover, merely as an illustrative example, the factor application circuitry 190 may determine red component output image data 186 as a sum of a result of application of the target red optical cross-talk compensation factor 188 to the red component input image data 184, a result of application of the target red-to-green optical cross-talk compensation factor 188 to the green component input image data 184, and a result of application of the target red-to-blue optical cross-talk compensation factor 188 to blue component input image data 184. Additionally, the factor application circuitry 190 may determine green component output image data 186 as a sum of a result of application of the target green-to-red optical cross-talk compensation factor 188 to the red component input image data 184, a result of application of the target green optical cross-talk compensation factor 188 to the green component input image data 184, and a result of application of the target green-to-blue optical cross-talk compensation factor 188 to blue component input image data 184. Furthermore, the factor application circuitry 190 may determine blue component output image data 186 as a sum of a result of application of the target blue-to-red optical cross-talk compensation factor 188 to the red component input image data 184, a result of application of the target blue-to-green optical cross-talk compensation factor 188 to the green component input image data 184, and a result of application of the target blue optical cross-talk compensation factor 188 to blue component input image data 184

As described above, optical cross-talk compensation factors to be applied to image data may be indicated via an optical cross-talk compensation factor map 156, which explicitly associates each of one or more pixel positions on a display panel 38 to one or more optical cross-talk compensation factors to be applied to image data corresponding with a display pixel 56 at the pixel position. Additionally, as described above, perceivability of color shift resulting from optical cross-talk may vary with viewing characteristics with which the display panel 38 is viewed. To facilitate adaptively adjusting optical cross-talk compensation applied to input image data 184, as in the depicted example, the optical cross-talk compensation block 154A may include and/or have access to multiple candidate optical cross-talk compensation (OXTC) factor maps 192 from which a target optical cross-talk compensation (OXTC) factor map 194 may be determined (e.g., selected and/or identified).

In some embodiments, each of the candidate optical cross-talk compensation factor maps 192 may be associated with a different set of viewing characteristics, which each include a viewing angle and/or a viewing location. For example, a first candidate optical cross-talk compensation factor map 192A may be associated with a first set of viewing characteristics, an Mth candidate optical cross-talk compensation factor map 192M may be associated with an Mth set of viewing characteristics, and so on. To facilitate selecting the target optical cross-talk compensation factor map 194 from the candidate optical cross-talk compensation factor maps 192, as in the depicted example, the optical cross-talk compensation block 154A may include selection circuitry 196, which receives one or more viewing characteristic parameters indicative of viewing characteristics with which a display panel 38 is expected to be viewed, for example, from an eye tracking sensor 134. In this manner, the selection circuitry 196 may identify (e.g., select) a candidate optical cross-talk compensation factor map 192 associated with a set of viewing characteristics indicated by the viewing characteristic parameters 198 as the target optical cross-talk compensation factor map 194.

Additionally, in some embodiments, an optical cross-talk compensation factor map 156, such as a candidate optical cross-talk compensation factor map 192 and a target optical cross-talk compensation factor map 194, used by the optical cross-talk compensation block 154A may explicitly associate each pixel position 158 on a display panel 38 with corresponding candidate optical cross-talk compensation factor 202. In other words, in such embodiments, the selection circuitry 196 may select a candidate optical cross-talk compensation factor 202, which is explicitly associated with a pixel position 158 corresponding to the input image data 184 in the target optical cross-talk compensation factor map 194, as a target optical cross-talk compensation factor 188 to be applied to the input image data 184.

As such, to facilitate determining a target optical cross-talk compensation factor 188 to be applied to the input image data 184, as in the depicted example, the selection circuitry 196 may determine (e.g., receive) a pixel position parameter 200 indicative of a pixel position of a display pixel 56 corresponding with the input image data 184. In some embodiments, a frame of image content may be written to display pixels 56 and, thus, processed in raster order. Accordingly, in such embodiments, image processing circuitry 27 (e.g., optical cross-talk compensation block 154) may additionally or alternatively determine the pixel position corresponding with the input image data 184 based at least in part on its processing order relative to other image data in the same frame, for example, in view of pixel dimensions of the display panel 38 that will be used to display the image content.

However, as described above, in some embodiments, optical cross-talk compensation factor maps 156 may be stored in the electronic device 10, for example, in main memory 20, a storage device 22, and/or internal memory of the image processing circuitry 27. As such, to facilitate conserving (e.g., optimizing) storage capacity of the electronic device 10, in some embodiments, the optical cross-talk compensation factor maps 156 may each be implemented to explicitly associate a subset of pixel positions 158 on a display panel 38 to corresponding optical cross-talk compensation factors. In other words, in such embodiments, target optical cross-talk compensation factors 188 may not be explicitly defined for one or more pixel positions 158 on the display panel 38. Thus, in such embodiments, when a pixel position 158 corresponding with the input image data 184 is not explicitly identified in the target optical cross-talk compensation factor map 194, the selection circuitry 196 may determine a target optical cross-talk compensation factor 188 to be applied to the input image data 184 by interpolating candidate optical cross-talk compensation factors 202 associated with pixel positions 158 explicitly identified in the target optical cross-talk compensation factor map 194, for example, using a linear interpolation, a bilinear interpolation, a spline interpolation, and/or the like.

Merely as an illustrative example, the selection circuitry 196 may determine a target red optical cross-talk compensation factor 188 by interpolating candidate red optical cross-talk compensation factors 202 explicitly indicated in the target optical cross-talk compensation factor map 194, a target red-to-blue cross-talk compensation factor 188 by interpolating candidate red-to-blue optical cross-talk compensation factors 202 explicitly indicated in the target optical cross-talk compensation factor map 194, and/or a target red-to-green optical cross-talk compensation factor 188 by interpolating candidate red-to-green optical cross-talk compensation factors 202 explicitly indicated in the target optical cross-talk compensation factor map 194. Additionally, the selection circuitry 196 may determine a target green-to-red optical cross-talk compensation factor 188 by interpolating candidate green-to-red optical cross-talk compensation factors 202 explicitly indicated in the target optical cross-talk compensation factor map 194, a target green optical cross-talk compensation factor 188 by interpolating candidate green optical cross-talk compensation factors 202 explicitly indicated in the target optical cross-talk compensation factor map 194, and/or a target green-to-blue optical cross-talk compensation factor 188 by interpolating candidate green-to-blue optical cross-talk compensation factors 202 explicitly indicated in the target optical cross-talk compensation factor map 194. Furthermore, the selection circuitry 196 may determine a target blue-to-red optical cross-talk compensation factor 188 by interpolating candidate blue-to-red optical cross-talk compensation factors 202 explicitly indicated in the target optical cross-talk compensation factor map 194, a target blue-to-green optical cross-talk compensation factor 188 by interpolating candidate blue-to-green optical cross-talk compensation factors 202 explicitly indicated in the target optical cross-talk compensation factor map 194, and/or a target blue optical cross-talk compensation factor 188 by interpolating candidate blue optical cross-talk compensation factors 202 explicitly indicated in the target optical cross-talk compensation factor map 194.

As described above, the factor application circuitry 190 may then apply one or more target optical cross-talk compensation factors 188 to the input image data 184, thereby processing the input image data 184 to determine (e.g., generate) output image data 186. Additionally, as described above, processing the input image data 184 in this manner may enable different optical cross-talk compensation factors to be applied at different pixel positions 158 and/or to different color components, which, at least in some instances may facilitate compensating (e.g., correcting and/or offsetting) for variations in perceivability of color shift user different sets of viewing characteristics. In other words, implementing an optical cross-talk compensation block 154 in this manner may enable the optical cross-talk compensation block 154 to adaptively adjust processing to account for different sets of viewing characteristics, which, at least in some instances, may facilitate reducing perceivability of color shift resulting from optical cross-talk between neighboring color component sub-pixels on a display panel 38 and, thus, improving perceived image quality provided by the display panel 38.

Figure 29:
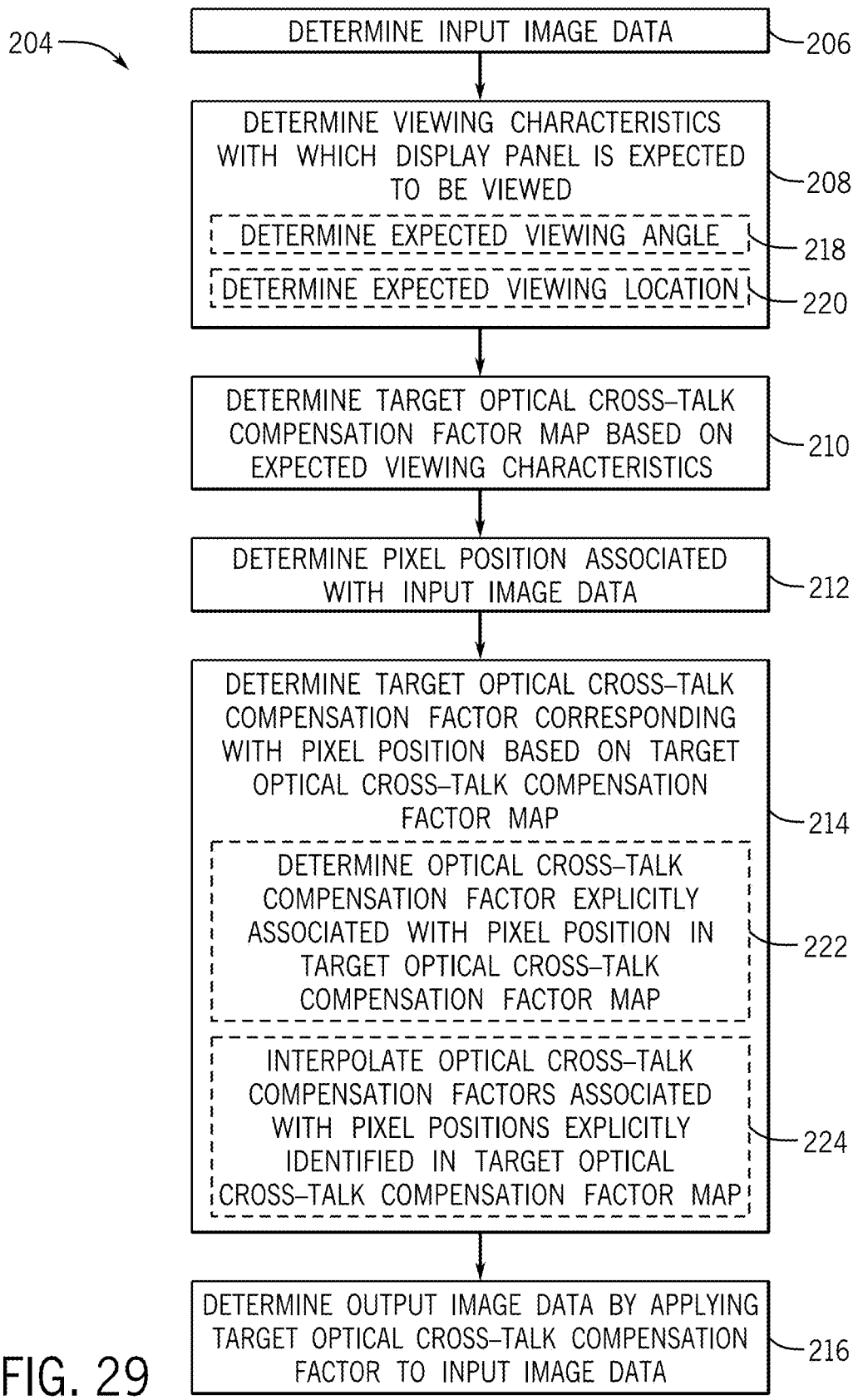
FIG. 29 is a block diagram of an example process for operating the optical cross-talk compensation (OXTC) block of FIG. 28, in accordance with an embodiment of the present disclosure.

To help further illustrate, an example of a process 204 for operating an optical cross-talk compensation block (e.g., circuitry group) 154, which may be implemented in image processing circuitry 27 of an electronic device 10, is described in FIG. 29. Generally, the process 204 includes determining input image data (process block 206), determining viewing characteristics with which a display panel is expected to be viewed (process block 208), and determining a target optical cross-talk compensation factor map based on the expected viewing characteristics (process block 210). Additionally, the process 204 includes determining a pixel position associated with the input image data (process block 212), determining a target optical cross-talk compensation factor corresponding with the pixel position based on the target optical cross-talk compensation factor map (process block 214), and determining output image data by applying the target optical cross-talk compensation factor to the input image data (process block 216).

Although described in a particular order, which represents a particular embodiment, it should be noted that the process 204 may be performed in any suitable order. Additionally, embodiments of the process 204 may omit process blocks and/or include additional process blocks. Moreover, in some embodiments, the process 204 may be implemented at least in part by circuit connections formed (e.g., programmed) in image processing circuitry 27. Additionally or alternatively, the process 204 may be implemented at least in part by executing instructions stored in a tangible, non-transitory, computer-readable medium, such as controller memory 140, using processing circuitry, such as a controller processor 138.

Accordingly, in some embodiments, a controller 136 may instruct image processing circuitry 27 implemented in an electronic device 10 to determine input image data 184, which is to be supplied to an optical cross-talk compensation block 154 implemented therein (process block 206). As described above, in some embodiments, the input image data 184 may be source image data 142 and, thus, output and/or received from an image source 132. In other embodiments, upstream image processing circuitry 27 may process the source image data 142 to determine the input image data 184 supplied to the optical cross-talk compensation block 154.

Additionally, the optical cross-talk compensation block 154 may determine a set of viewing characteristics with which a display panel 38 used by the electronic device 10 is expected to be viewed (process block 208). As described above, in some embodiments, a set of viewing characteristics may include a viewing (e.g., pupil or gaze) angle and/or a viewing location (e.g., pupil offset from center and/or pupil relief). Thus, in some embodiments, determining the set of viewing characteristics may include determining a viewing angle with which the display panel 38 is expected to be viewed (process block 218). Additionally or alternatively, determining the set of viewing characteristics may include determining a viewing location with which the display panel 38 is expected to be viewed (process block 220).

As described above, in some embodiments, the optical cross-talk compensation block 154 may receive one or more viewing characteristic parameters 198 indicative of a set of viewing characteristics with which display panel 38 is expected to be viewed, for example, from an eye tracking sensor 134. For example, the viewing characteristic parameters 198 may indicate a horizontal (e.g., x-direction) offset of pupil position from a default (e.g., forward facing) pupil position and a vertical (e.g., y-direction) offset of pupil position from the default pupil position and, thus, may be indicative of expected viewing angle. Additionally or alternatively, the viewing characteristic parameters 198 may include a pupil relief (e.g., distance from pupil to display panel) and, thus, may be indicative of expected viewing location.

Furthermore, in some embodiments, one or more viewing characteristic parameters 198 may be updated for each image frame 148. In other words, in such embodiments, the viewing characteristic parameters 198 may be indicative of a set of viewing characteristics with which image content corresponding with the input image data 184 is expected to be viewed. In other embodiments, the viewing characteristic parameters 198 may be updated at a rate slower than a refresh (e.g., frame) rate of the display panel 38. For example, an eye tracking camera may determine viewing characteristic parameters 198 when a (e.g., virtual-reality and/or mixed-reality) headset 10E is initially put on by a user 34 and periodically update the viewing characteristic parameters 198 every one hundred image frames 148. In other words, in such embodiments, the viewing characteristic parameters 198 may be indicative of a set of viewing characteristics with which a pervious image frame 148 is expected to be viewed.

Based on the set of expected viewing characteristics, the optical cross-talk compensation block 154 may determine a target optical cross-talk compensation factor map 194 (process block 210). As described above, in some embodiments, the optical cross-talk compensation block 154 may include and/or have access to multiple candidate optical cross-talk compensation factor maps 192, which are each calibrated for a different set of viewing characteristics. Thus, in such embodiments, the optical cross-talk compensation block 154 may select (e.g., identify) a candidate optical cross-talk compensation factor map 192 associated with the set of expected viewing characteristics as the target optical cross-talk compensation factor map 194.

Additionally, the optical cross-talk compensation block 154 may determine (e.g., identify) a pixel position of a display pixel 56 on the display panel 38 that will be used to display image content corresponding with the input image data 184 (process block 212). As described above, in some embodiments, a frame of image content may be written to display pixels 56 and, thus, processed in raster order. Accordingly, in some such embodiments, the optical cross-talk compensation block 154 may determine the pixel position corresponding with the input image data 184 based at least in part on its processing order relative to other image data in the same frame, for example, in view of pixel dimensions of the display panel 38 that will be used to display the image content. Additionally or alternatively, as described above, the optical cross-talk compensation block 154 may receive a pixel position parameter 200, which identifies a pixel position associated with the input image data 184.

Based at least in part on the pixel position 158 and the target optical cross-talk compensation factor map 194, the optical cross-talk compensation block 154 may determine one or more target optical cross-talk compensation factors 188 to be applied to the input image data 184 (process block 214). As described above, in some embodiments, the target optical cross-talk compensation factors 188 corresponding with a pixel position 158 may include a target red optical cross-talk compensation factor 188, a target red-to-blue cross-talk compensation factor 188, a target red-to-green optical cross-talk compensation factor 188, a target green-to-red optical cross-talk compensation factor 188, a target green optical cross-talk compensation factor 188 a target green-to-blue optical cross-talk compensation factor 188, a target blue-to-red optical cross-talk compensation factor 188, a target blue-to-green optical cross-talk compensation factor 188, a target blue optical cross-talk compensation factor 188, or any combination thereof. When the pixel position corresponding with the input image data 184 is included in the target optical cross-talk compensation factor map 194, the optical cross-talk compensation block 154 may identify each candidate optical cross-talk compensation factor 202 explicitly associated with the pixel position as a target optical cross-talk compensation factor 188 (process block 222).

However, as described above, in some embodiments, an optical cross-talk compensation factor map 156, such as the target optical cross-talk compensation factor map 194, used by the optical cross-talk compensation block 154A may explicitly associate a subset of pixel positions 158 on the display panel 38 to corresponding optical cross-talk compensation factors. In other words, in such embodiments, target optical cross-talk compensation factors 188 may not be explicitly defined for one or more pixel position 158 on the display panel 38. Thus, in such embodiments, when the pixel position 158 corresponding with the input image data 184 is not explicitly identified in the target optical cross-talk compensation factor map 194, the optical cross-talk compensation factor may determine a target optical cross-talk compensation factor 188 to be applied to the input image data 184 by interpolating candidate optical cross-talk compensation factors 202 associated with other pixel positions 158 explicitly identified in the target optical cross-talk compensation factor map 194, for example, using linear interpolation, bi-linear interpolation, spline interpolation, and/or the like (process block 224). For example, the optical cross-talk compensation block 154 may determine a target red optical cross-talk compensation factor 188 by interpolating candidate red optical cross-talk compensation factors 202 explicitly indicated in the target optical cross-talk compensation factor map 194, a target red-to-green optical cross-talk compensation factor 188 by interpolating candidate red-to-green optical cross-talk compensation factors 202 explicitly indicated in the target optical cross-talk compensation factor map 194, and so on.

The optical cross-talk compensation block 154 may then apply one or more target optical cross-talk compensation factors 188 to the input image data 184 to determine output image data 186 (process block 216). For example, in some embodiments, the optical cross-talk compensation block 154 may determine the output image data 186 by applying a three-by-three matrix of target optical cross-talk compensation factors 188 to a three-by-one matrix (e.g., vector) of red component input image data 184, green component input image data 184, and blue component input image data 184. In other words, in such embodiments, the optical cross-talk compensation block 154 may determine red component output image data 186 as a sum of a result of application of the target red optical cross-talk compensation factor 188 to the red component input image data 184, a result of application of the target red-to-green optical cross-talk compensation factor 188 to the green component input image data 184, and a result of application of the target red-to-blue optical cross-talk compensation factor 188 to blue component input image data 184. Additionally, the optical cross-talk compensation block 154 may determine green component output image data 186 as a sum of a result of application of the target green-to-red optical cross-talk compensation factor 188 to the red component input image data 184, a result of application of the target green optical cross-talk compensation factor 188 to the green component input image data 184, and a result of application of the target green-to-blue optical cross-talk compensation factor 188 to blue component input image data 184. Furthermore, the optical cross-talk compensation block 154 may determine blue component output image data 186 as a sum of a result of application of the target blue-to-red optical cross-talk compensation factor 188 to the red component input image data 184, a result of application of the target blue-to-green optical cross-talk compensation factor 188 to the green component input image data 184, and a result of application of the target blue optical cross-talk compensation factor 188 to blue component input image data 184.

As described above, in some embodiments, the output image data 186 may be display image data 147, which is supplied to an electronic display 12 to enable the electronic display 12 to display corresponding image content on its display panel 38. In other embodiments, the output image data 186 may be further processed by downstream image processing circuitry 27 to determine the display image data 147, for example, by at least in part by burn-in compensation (BIC) block and/or a dither block 162. In this manner, the techniques described in the present disclosure may enable an electronic device to adaptively adjust optical cross-talk compensation applied to image data, which, at least in some instances, may facilitate reducing perceivability and/or likelihood of color shift resulting from optical cross-talk occurring in display image content and, thus, improving perceived image quality of the displayed image content.

The specific embodiments described above have been shown by way of example, and it should be understood that these embodiments may be susceptible to various modifications and alternative forms. It should be further understood that the claims are not intended to be limited to the particular forms disclosed, but rather to cover all modifications, equivalents, and alternatives falling within the spirit and scope of this disclosure.

It is well understood that the use of personally identifiable information should follow privacy policies and practices that are generally recognized as meeting or exceeding industry or governmental requirements for maintaining the privacy of users. In particular, personally identifiable information data should be managed and handled so as to minimize risks of unintentional or unauthorized access or use, and the nature of authorized use should be clearly indicated to users.

What is claimed is:

1. An electronic device comprising:
an electronic display, wherein the electronic display comprises a display pixel implemented at a pixel position on a display panel and the display pixel comprises a first color component self-emissive sub-pixel and a second color component self-emissive sub-pixel; and
image processing circuitry configured to process image data corresponding with image content to be displayed on the display panel of the electronic display at least in part by:
receiving input image data corresponding with the pixel position of the display pixel in the image content to be displayed on the display panel, wherein the input image data comprises first color component input image data corresponding with the first color component self-emissive sub-pixel and second color component input image data corresponding with the second color component self-emissive sub-pixel;
determining a target first color optical cross-talk compensation factor and a target first color-to-second color optical cross-talk compensation factor to be applied to the input image data based at least in part on the pixel position of the display pixel and a target optical cross-talk compensation factor map, wherein the target optical cross-talk compensation factor map is determined based at least in part on one or more viewing characteristic parameters indicative of one or more viewing characteristics with which the display panel is expected to be viewed, and wherein the one or more viewing characteristics comprises a viewing angle or a viewing location; and
determining output image data corresponding with the display pixel at least in part by applying the target first color optical cross-talk compensation factor to the first color component input image data and the target first color-to-second color optical cross-talk compensation factor to the second color component input image data to facilitate offsetting color shift resulting from optical cross-talk between the first color component self-emissive sub-pixel and the second color component self-emissive sub-pixel.

2. The electronic device of claim 1, wherein:
the first color component self-emissive sub-pixel is a first color;
the second color component self-emissive sub-pixel is a second color different from the first color; and
the image processing circuitry is configured to:
  determine a target second color optical cross-talk compensation factor and a target second color-to-first color optical cross-talk compensation factor based at least in part on the pixel position of the display pixel and the target optical cross-talk compensation factor map; and
  determine the output image data corresponding with the display pixel at least in part by applying the target second color-to-first color optical cross-talk compensation factor to the first color component input image data and the target second color optical cross-talk compensation factor to the second color component input image data to facilitate offsetting color shift resulting from optical cross-talk between the first color component self-emissive sub-pixel and the second color component self-emissive sub-pixel.

3. The electronic device of claim 1, wherein:
the first color component self-emissive sub-pixel is a first color;
the second color component self-emissive sub-pixel is a second color different from the first color;
the display pixel comprises a third color component self-emissive sub-pixel, wherein the third color component self-emissive sub-pixel is a third color different from the first color and the second color, and the input image data comprises third color component input image data corresponding with the third color component self-emissive sub-pixel; and
the image processing circuitry is configured to:
  determine a target first color-to-third color optical cross-talk compensation factor based at least in part on the pixel position of the display pixel and the target optical cross-talk compensation factor map; and
  determine the output image data corresponding with the display pixel at least in part by applying the target first color-to-third color optical cross-talk compensation factor to the third color component input image data to facilitate offsetting color shift resulting from optical cross-talk between the first color component self-emissive sub-pixel and the third color component self-emissive sub-pixel.

4. The electronic device of claim 3, wherein:
the output image data comprises first color component output image data corresponding with the first color component self-emissive sub-pixel of the display pixel and second color component output image data corresponding with the second color component self-emissive sub-pixel of the display pixel; and
the image processing circuitry is configured to determine the output image data corresponding with the display pixel at least in part by:
  determining a first result of application of the target first color optical cross-talk compensation factor to the first color component input image data;
  determining a second result of application of the target first color-to-second color optical cross-talk compensation factor to the second color component input image data;
  determining a third result of application of the target first color-to-third color optical cross-talk compensation factor to the third color component input image data; and
  determining the first color component output image data as a sum of the first result, the second result, and the third result.

5. The electronic device of claim 1, wherein the target optical cross-talk compensation factor map explicitly associates a subset of pixel positions non-uniformly spaced across the display panel each with a corresponding matrix of multiple optical cross-talk compensation factors.

6. The electronic device of claim 1, wherein the image processing circuitry is configured to:
receive source image data corresponding with the image content to be displayed on the display panel in a foveated domain that utilizes a lower pixel resolution than the display panel; and
determine the input image data at least in part by converting image data corresponding with the source image data from the lower pixel resolution of the foveated domain to a higher pixel resolution of the display panel.

7. The electronic device of claim 6, wherein the image processing circuitry is configured to covert from the lower pixel resolution of the foveated domain to the higher pixel resolution of the display panel at least in part by generating multiple instances of the input image data.

8. The electronic device of claim 6, comprising:
an eye tracking sensor configured to determine a viewing characteristic parameter indicative of viewing angle with which the display panel is expected to be viewed, viewing location from which the display panel is expected to be viewed, or both; and
an image source configured to generate the source image data in the foveated domain based at least in part on the viewing characteristic parameter output from the eye tracking sensor.

9. The electronic device of claim 1, wherein the display panel of the electronic display comprises:
an organic light-emitting diode layer comprising a first organic light-emitting diode of the first color component self-emissive sub-pixel and a second organic light-emitting diode of the second color component self-emissive sub-pixel; and
a color filter layer comprising a first color filter of the first color component self-emissive sub-pixel and a second color filter of the second color component self-emissive sub-pixel, wherein the color filter layer overhangs one or more edges of the organic light-emitting diode layer.

10. The electronic device of claim 9, wherein:
the display panel comprises an encapsulation layer implemented between the organic light-emitting diode layer and the color filter layer; and
the color filter layer overhangs one or more edges of the encapsulation layer.

11. The electronic device of claim 9, wherein a first size of the first color filter differs from a second size of the second color filter.

12. The electronic device of claim 9, wherein the first color filter of the first color component self-emissive sub-pixel at least partially overlaps the second organic light-emitting diode of the second color component self-emissive sub-pixel.

13. A method of operating an electronic device comprising:
receiving, using image processing circuitry in the electronic device, input image data corresponding with a display pixel on a display panel, wherein the input image data is determined at least in part by converting image data associated with source image data corresponding with an image frame to be displayed on the display panel of an electronic display in a foveated domain that utilizes a foveated pixel resolution different from a panel pixel resolution of the display panel, wherein the input image data comprises converted image data comprising first color component converted image data corresponding with a first color component self-emissive sub-pixel of the display pixel on the display panel and second color component converted image data corresponding with a second color component self-emissive sub-pixel of the display pixel on the display panel;
determining, using the image processing circuitry, a target set of multiple optical cross-talk compensation factors comprising a target first color optical cross-talk compensation factor and a target first color-to-second color optical cross-talk compensation factor to be applied to the converted image data based at least in part on a pixel position of the display pixel on the display panel and a target optical cross-talk compensation factor map, wherein the target optical cross-talk compensation factor map is determined based at least in part on one or more viewing characteristic parameters indicative of one or more viewing characteristics with which the display panel is expected to be viewed, and wherein the one or more viewing characteristics comprises a viewing angle or a viewing location; and
determining, using the image processing circuitry, display image data to be used by the electronic display to display the image frame on the display panel at least in part by applying the target first color optical cross-talk compensation factor to the first color component converted image data and the target first color-to-second color optical cross-talk compensation factor to the second color component converted image data to facilitate reducing perceivability of color shift resulting from optical cross-talk between the first color component self-emissive sub-pixel and the second color component self-emissive sub-pixel on the display panel.

14. The method of claim 13, wherein:
in the foveated domain, a central foveation region corresponding with a focus region of a field of view with which the display panel is expected to be viewed and an outer foveation region outside of the central foveation region are identified in the image frame, wherein a first foveated pixel resolution of the central foveation region matches the panel pixel resolution of the display panel and a second foveated pixel resolution of the outer foveation region is lower than the first foveated pixel resolution of the central foveation region; and
determining the converted image data comprises:
determining whether an image pixel in the source image data is located in the central foveation region;
outputting a single instance of the converted image data in response to determining that the image pixel is located in the central foveation region; and
outputting multiple instances of the converted image data in response to determining that the image pixel is not located in central foveation region.

15. The method of claim 13, wherein determining the target set of multiple optical cross-talk compensation factors comprises determining a three-by-three matrix comprising a red optical cross-talk compensation factor, a red-to-green optical cross-talk compensation factor, a red-to-blue optical cross-talk compensation factor, a green-to-red optical cross-talk compensation factor, a green optical cross-talk compensation factor, a green-to-blue optical cross-talk compensation factor, a blue-to-red optical cross-talk compensation factor, a blue-to-green optical cross-talk compensation factor, and a blue optical cross-talk compensation factor.

16. The method of claim 13, wherein determining the target set of multiple optical cross-talk compensation factors comprises determining the target set of multiple optical cross-talk compensation factors based at least in part on an optical cross-talk compensation table that explicitly associates a subset of non-uniformly distributed pixel positions on the display panel each with a corresponding set of multiple optical cross-talk compensation factors.

17. The method of claim 16, wherein determining the target set of multiple optical cross-talk compensation factors comprises:
determining whether the pixel position of the display pixel is explicitly identified in the optical cross-talk compensation table;
identifying the corresponding set of multiple optical cross-talk compensation factors explicitly associated with the pixel position in the optical cross-talk compensation table as the target set of multiple optical cross-talk compensation factors to be applied to the converted image data in response to determining that the pixel position is explicitly identified in the optical cross-talk compensation table; and
determining the target set of multiple optical cross-talk compensation factors to be applied to the converted image data at least in part by interpolating other sets of multiple optical cross-talk compensation factors explicitly associated with other pixel positions in the optical cross-talk compensation table.

18. Image processing circuitry configured to process image data before supply to an electronic display, wherein the image processing circuitry comprises:
optical cross-talk compensation circuitry configured to receive input image data corresponding with a display pixel on a display panel in a panel domain, wherein the input image data is determined at least in part by converting image data processed by foveation domain image processing circuitry configured to process source image data received in a foveated domain that utilizes a foveated pixel resolution different from a panel pixel resolution of the display panel, wherein the image data is converted by domain conversion circuitry configured to convert the processed image data from the foveated domain to the panel domain of the display panel at least in part by changing the processed image data from the pixel resolution of the foveated domain to a native resolution of the panel domain, and wherein the optical cross-talk compensation circuitry is configured to facilitate determining display image data to be supplied to the electronic display to display corresponding image content at least in part by:
determining target optical cross-talk compensation factors corresponding to different colored self-emissive sub-pixels to be applied to the input image data based at least in part on a pixel position of the display pixel on the display panel and an optical cross-talk compensation table that explicitly associates a subset of non-uniformly spaced pixel positions on the display panel each with a corresponding set of optical cross-talk compensation factors, wherein the optical cross-talk compensation table is determined based at least in part on one or more viewing characteristic parameters indicative of one or more viewing characteristics with which the display panel is expected to be viewed, and wherein the one or more viewing characteristics comprises a viewing angle or a viewing location; and applying the target optical cross-talk compensation factors to the input image data to facilitate reducing perceivability of color shift resulting from optical cross-talk between different colored self-emissive sub-pixels on the display panel.

19. The image processing circuitry of claim 18, wherein:
the input image data comprises red component input image data indicative of target magnitude of red light emission from the display pixel, blue component input image data indicative of target magnitude of blue light emission from the display pixel, and green component input image data indicative of target magnitude of green light emission from the display pixel;
the target optical cross-talk compensation factors comprise a red optical cross-talk compensation factor, a red-to-green optical cross-talk compensation factor, a red-to-blue optical cross-talk compensation factor, a green-to-red optical cross-talk compensation factor, a green optical cross-talk compensation factor, a green-to-blue optical cross-talk compensation factor, a blue-to-red optical cross-talk compensation factor, a blue-to-green optical cross-talk compensation factor, and a blue optical cross-talk compensation factor; and applying the target optical cross-talk compensation factors to the input image data comprises:
applying the red optical cross-talk compensation factor, the green-to-red optical cross-talk compensation factor, and the blue-to-red optical cross-talk compensation factor to the red component input image data;
applying the red-to-green optical cross-talk compensation factor, the green optical cross-talk compensation factor, and the blue-to-green optical cross-talk compensation factor to the green component input image data; and
applying the red-to-blue optical cross-talk compensation factor, the green-to-blue optical cross-talk compensation factor, and the blue optical cross-talk compensation factor to the blue component input image data.

20. The image processing circuitry of claim 18, wherein:
the foveation domain image processing circuitry comprises white point compensation circuitry, chromatic aberration compensation circuitry, or both; and
the image processing circuitry comprises a dither block implemented downstream relative to the optical cross-talk compensation circuitry.

* * * * *

UNITED STATES PATENT AND TRADEMARK OFFICE
CERTIFICATE OF CORRECTION

PATENT NO.        : 11,824,072 B2                                Page 1 of 1
APPLICATION NO.   : 17/003638
DATED             : November 21, 2023
INVENTOR(S)       : Shengchang Cai et al.

It is certified that error appears in the above-identified patent and that said Letters Patent is hereby corrected as shown below:

On the Title Page

In Item (72) titled "Inventors:" please add --Mehmet N Agaoglu, Dublin, CA (US)--.

Signed and Sealed this
Eleventh Day of March, 2025

Coke Morgan Stewart
*Acting Director of the United States Patent and Trademark Office*